United States Patent
Magnussen et al.

(10) Patent No.: US 7,173,362 B2
(45) Date of Patent: *Feb. 6, 2007

(54) VIBRATORY MOTORS AND METHODS OF MAKING AND USING SAME

(76) Inventors: Bjoern Magnussen, Margeritenstrasse 6a, Iserlohn (DE) 58640; Peter Varadi, 822 Masonic Ave., Albany, CA (US) 94706; Benjamin Hagemann, Galoppstrasse 93, Dortmund (DE) 44229; Steven Schofield, 2724 Alcatraz Ave., Berkeley, CA (US) 94705; Erick M. Davidson, 5215 Fresno Ave., Apartment A., Richmond, CA (US) 94804

(*) Notice: Subject to any disclaimer, the term of this patent is extended or adjusted under 35 U.S.C. 154(b) by 0 days.

This patent is subject to a terminal disclaimer.

(21) Appl. No.: 10/936,052

(22) Filed: Sep. 8, 2004

(65) Prior Publication Data

US 2005/0023933 A1  Feb. 3, 2005

Related U.S. Application Data

(63) Continuation of application No. 10/691,362, filed on Oct. 22, 2003, now Pat. No. 6,825,592, which is a continuation of application No. 09/801,194, filed on Mar. 8, 2001, now Pat. No. 6,870,304.

(60) Provisional application No. 60/236,005, filed on Sep. 27, 2000, provisional application No. 60/231,001, filed on Sep. 8, 2000, provisional application No. 60/215,686, filed on Jun. 30, 2000, provisional application No. 60/215,438, filed on Jun. 30, 2000, provisional application No. 60/191,876, filed on Mar. 23, 2000.

(51) Int. Cl.
*H01L 41/08* (2006.01)

(52) U.S. Cl. .................................. 310/323.02

(58) Field of Classification Search ................ 310/328, 310/328.02, 323.12, 323.16, 345, 321, 330–332, 310/323.01, 323.02, 316.01, 316.02
See application file for complete search history.

(56) References Cited

U.S. PATENT DOCUMENTS 3,469,119 A   9/1969  Parkinson (Continued)

FOREIGN PATENT DOCUMENTS

DE   2530045 C2   7/1975

(Continued)

OTHER PUBLICATIONS

Krause, W. et al., *Direct-Drive Linear Motors Imprecision Engineering*, p. 303-306, Issue 98, No. 7-8, published by Carl Hanser Publishing Company, Munich, 1990.

(Continued)

*Primary Examiner*—Mark Budd
(74) *Attorney, Agent, or Firm*—Stetina Brunda Garred & Brucker

(57) ABSTRACT

A single piezoelectric is excited at a first frequency to cause two vibration modes in a resonator producing a first elliptical motion in a first direction at a selected contacting portion of the resonator that is placed in frictional engagement with a driven element to move the driven element in a first direction. A second frequency excites the same piezoelectric to cause two vibration modes of the resonator producing a second elliptical motion in a second direction at the selected contacting portion to move the driven element in a second direction. The piezoelectric is preloaded in compression by the resonator. Walls of the resonator are stressed past their yield point to maintain the preload. Specially shaped ends on the piezoelectric help preloading. The piezoelectric can send or receive vibratory signals through the driven element to or from sensors to determine the position of the driven element relative to the piezoelectric element or resonator. Conversely, the piezoelectric element can receive vibration or electrical signals passed through the driven element to determine the position of the driven element. The resonator is resiliently urged against the driven element, or vice versa. Plural resonators can drive common driven elements.

31 Claims, 34 Drawing Sheets

U.S. PATENT DOCUMENTS

| | | | | |
|---|---|---|---|---|
| 3,668,442 A | * | 6/1972 | Vosseler | 310/323.16 |
| 4,019,073 A | * | 4/1977 | Vishnevsky et al. | 310/322 |
| 4,400,641 A | | 8/1983 | Vishnevsky et al. | |
| 4,420,826 A | | 12/1983 | Marshall et al. | |
| 4,453,103 A | | 6/1984 | Vishnevsky et al. | |
| 4,535,346 A | | 8/1985 | Lichti | |
| 4,613,782 A | | 9/1986 | Mori et al. | |
| 4,620,121 A | * | 10/1986 | Mishiro | 310/323.18 |
| 4,622,483 A | | 11/1986 | Staufenberg, Jr. et al. | |
| 4,663,556 A | | 5/1987 | Kumada | |
| 4,728,843 A | | 3/1988 | Mishiro | |
| 4,742,260 A | * | 5/1988 | Shimizu et al. | 310/323.16 |
| 4,812,697 A | | 3/1989 | Mishiro | |
| 4,857,791 A | | 8/1989 | Uchino et al. | |
| 4,941,202 A | | 7/1990 | Upton | |
| 4,959,580 A | | 9/1990 | Vishnevsky et al. | |
| 4,997,177 A | | 3/1991 | Mori et al. | |
| 5,030,873 A | | 7/1991 | Owen | |
| 5,073,740 A | | 12/1991 | Jomura et al. | |
| 5,109,698 A | | 5/1992 | Owen | |
| 5,134,334 A | * | 7/1992 | Onishi et al. | 310/323.16 |
| 5,155,709 A | | 10/1992 | Flanagan et al. | |
| 5,162,692 A | | 11/1992 | Fujimura | |
| 5,216,313 A | * | 6/1993 | Ohinishi et al. | 310/323.16 |
| 5,416,375 A | * | 5/1995 | Funakubo et al. | 310/323.16 |
| 5,448,128 A | | 9/1995 | Endo et al. | |
| 5,453,653 A | | 9/1995 | Zumeris | |
| 5,469,011 A | * | 11/1995 | Safabakhsh | 310/325 |
| 5,566,132 A | | 10/1996 | Janus et al. | |
| 5,616,980 A | | 4/1997 | Zumeris | |
| 5,640,063 A | | 6/1997 | Zumeris et al. | |
| 5,682,076 A | * | 10/1997 | Zumeris | 360/78.05 |
| 5,696,421 A | | 12/1997 | Zumeris et al. | |
| 5,714,833 A | | 2/1998 | Zumeris | |
| 5,777,423 A | | 7/1998 | Zumeris | |
| 5,877,879 A | | 3/1999 | Zumeris | |
| 5,900,691 A | | 5/1999 | Reuter et al. | |
| 5,907,211 A | | 5/1999 | Hall et al. | |
| 6,066,911 A | | 5/2000 | Lindemann et al. | |
| 6,068,256 A | | 5/2000 | Slutskiy et al. | |
| 6,072,267 A | | 6/2000 | Atsuta | |
| 6,211,603 B1 | * | 4/2001 | Iino et al. | 310/323.02 |
| 6,242,850 B1 | * | 6/2001 | Slutskiy et al. | 310/328 |
| 6,262,514 B1 | | 7/2001 | Bansevicius et al. | |
| 6,262,515 B1 | | 7/2001 | Yerganian | |
| 6,294,859 B1 | | 9/2001 | Jaenker | |
| 6,384,514 B1 | | 5/2002 | Slutskiy et al. | |
| 6,512,321 B2 | | 1/2003 | Yoshida et al. | |
| 6,528,926 B2 | * | 3/2003 | Okamoto et al. | 310/323.17 |
| 6,885,615 B1 | * | 4/2005 | Miyazawa et al. | 368/255 |

FOREIGN PATENT DOCUMENTS

| | | |
|---|---|---|
| DE | 3309239 C2 | 9/1984 |
| DE | 3833342 A1 | 9/1988 |
| DE | 3920726 C2 | 6/1989 |
| DE | 4127163 A1 | 2/1993 |
| DE | 19507996 A1 | 9/1996 |
| DE | 19538978 C1 | 11/1996 |
| DE | 19920436 A1 | 11/2000 |
| DE | 19928780 | 1/2001 |
| DE | 10010707 C2 | 1/2002 |
| EP | 0231940 A2 | 2/1987 |
| EP | 0313072 A1 | 4/1989 |
| EP | 0518262 A2 | 12/1992 |
| EP | 0313072 B1 | 5/1993 |
| EP | 0569673 A1 | 11/1993 |
| EP | 0712170 A1 | 5/1996 |
| EP | 0725450 A1 | 8/1996 |
| EP | 0643427 B1 | 11/1997 |
| EP | 0924778 A2 | 6/1999 |
| EP | 0951078 A1 | 10/1999 |
| EP | 0924778 A3 | 1/2001 |
| GB | 1510091 | 5/1978 |
| JP | 62-217880 | 9/1987 |
| JP | 2-260476 | 10/1990 |
| JP | 02260582 | 10/1990 |
| JP | 04351200 | 12/1992 |
| JP | 06286401 | 10/1994 |
| JP | 06019275 | 1/1996 |
| SU | 1278994 A1 | 7/1994 |
| WO | WO9750134 | 12/1997 |
| WO | WO141228 A1 | 7/2001 |

OTHER PUBLICATIONS

*Piezoelectric Ultrasonic Motors*, Jorg Wilaschek, Heinz Nixdorf Institut, Universitat-GP Paderborn, 33095 Paderborn, Germany Jan. 1995.

*PWM Driving Characteristics of Robot Hand with Fingers Using Vibration-type Ultrasonic Motors*, K. Nishibori, H. Obata, S. Okuma; Proceedings of the EICON '97 23rd International Conference on Industrial Electronics, Control, and Insturmentation; New Orleans, LA, USA; Nov. 9, 1997; pp. 1355-1360.

*New Type of Piezoelectric Ultrasonic Motor*, Maximiian Fleischer, Dieter Stein and Hans Meixner, Siemens AG, Research Laboratories, Otto-Hahn-Ring 6, D-8000-Munchen 83, West Germany May 1998.

\* cited by examiner

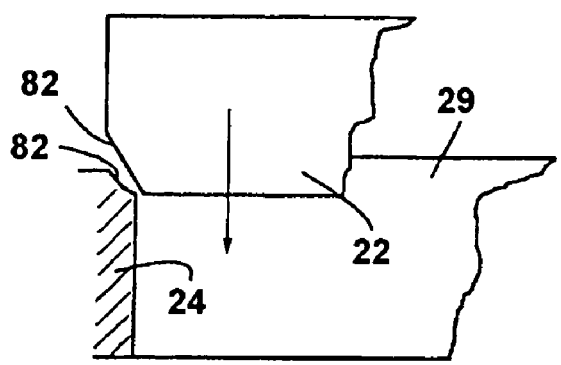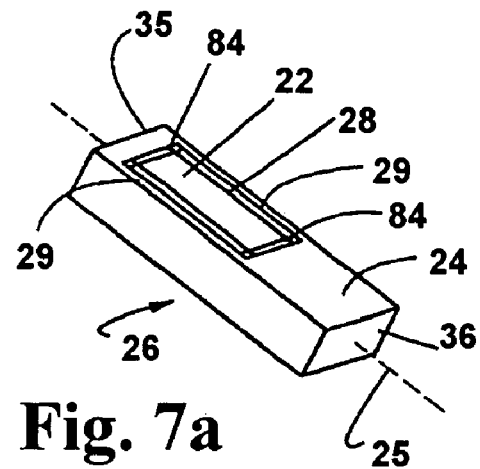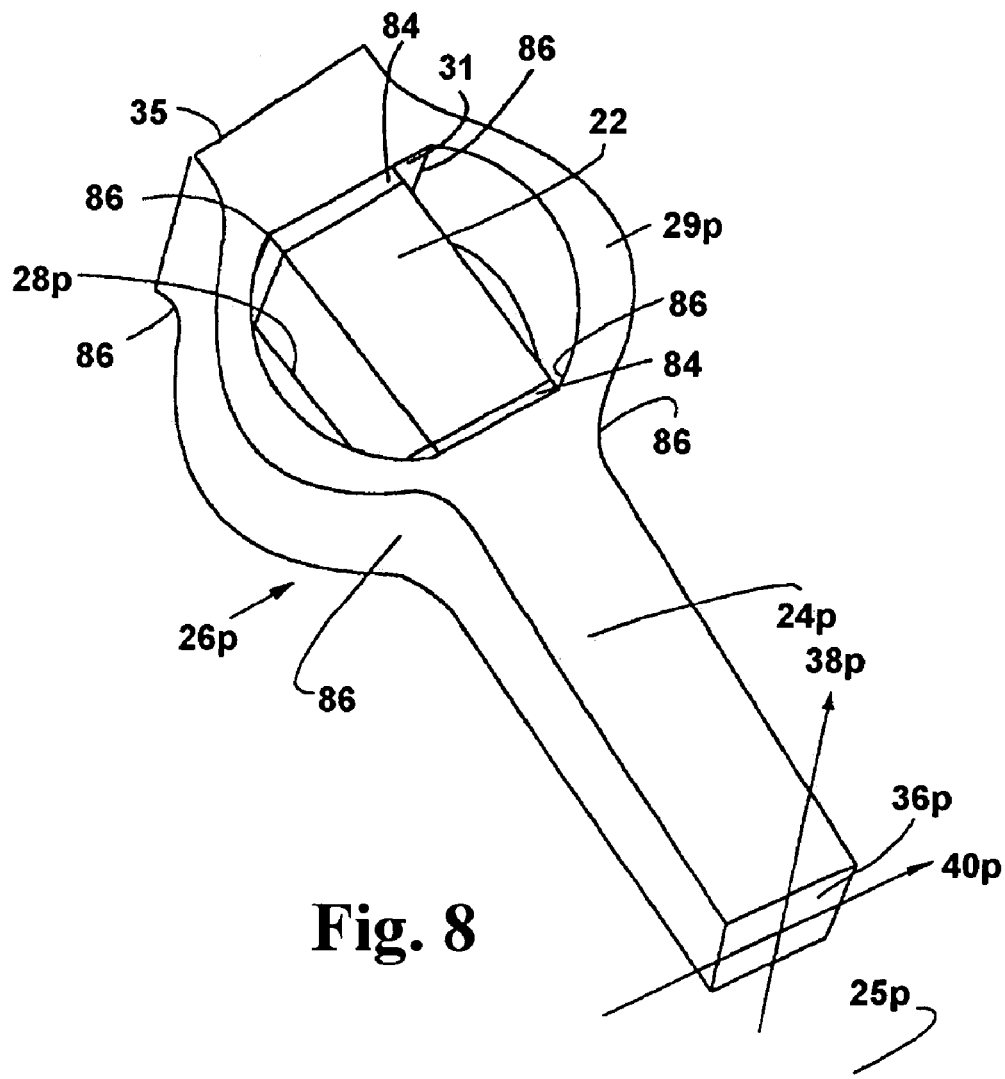

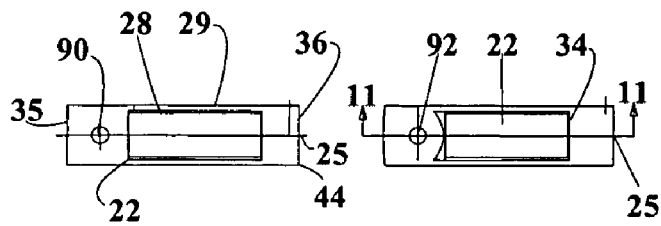
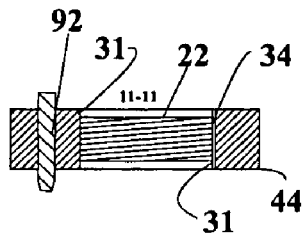
Fig. 9 Fig. 10 Fig. 11
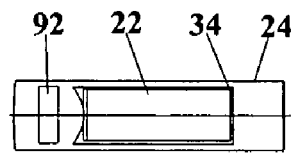
Fig. 12
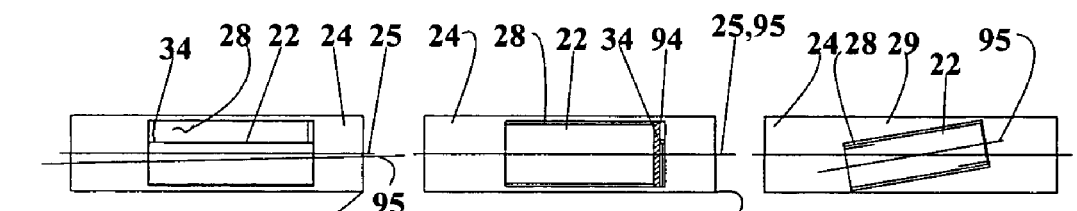
Fig. 13 Fig. 14 Fig. 15
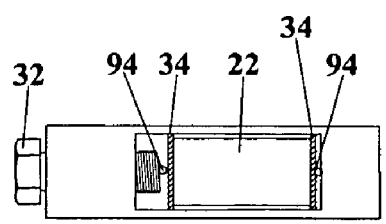
Fig. 16

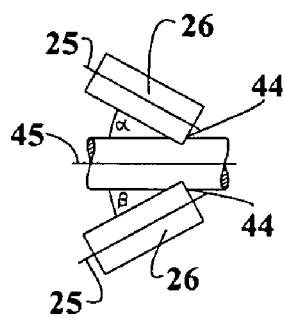
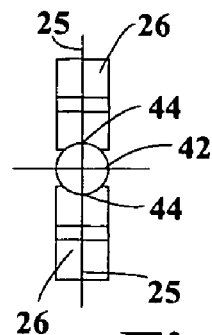
Fig. 35  Fig. 36
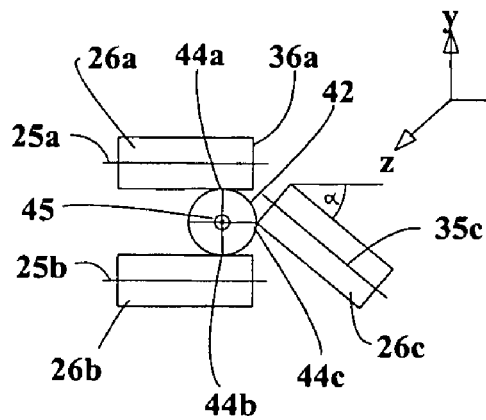
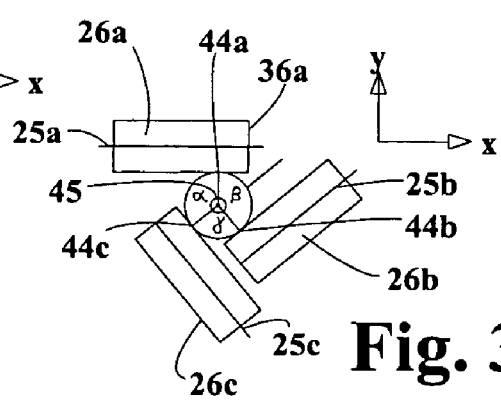
Fig. 37  Fig. 38
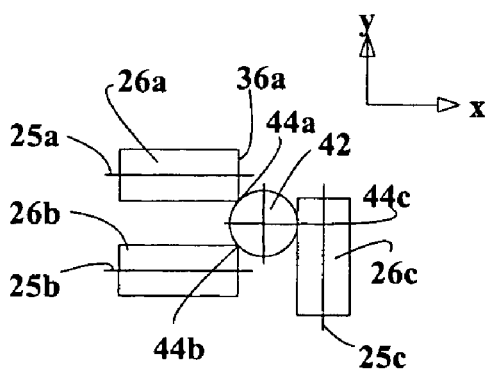
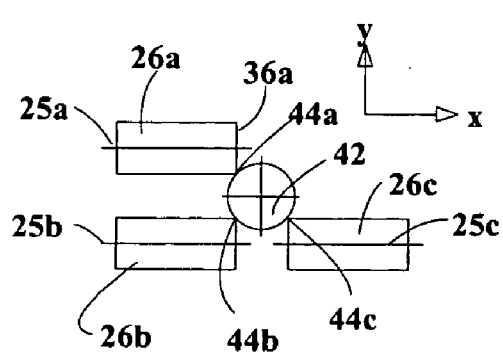
Fig. 39  Fig. 40

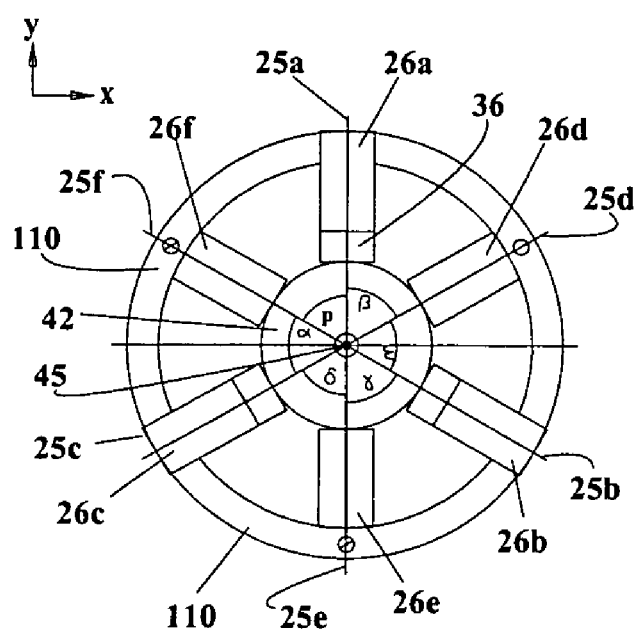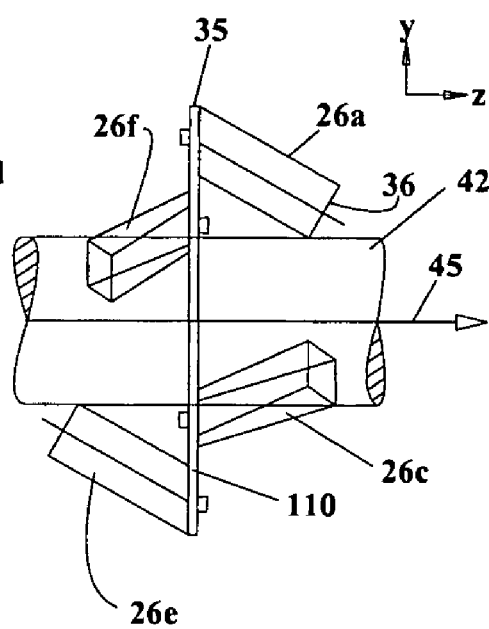
Fig. 41  Fig. 42

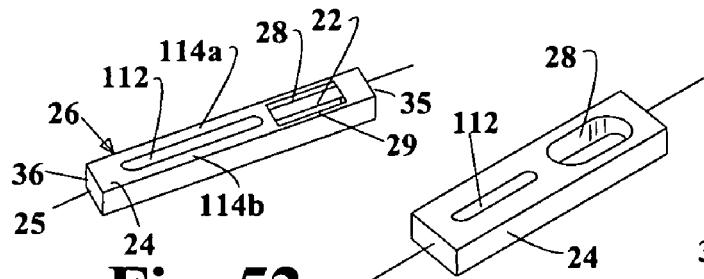
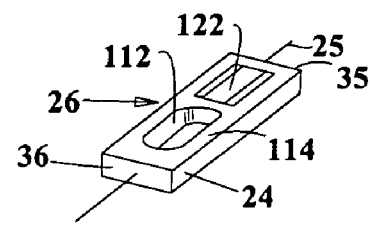
Fig. 52  Fig. 53  Fig. 54
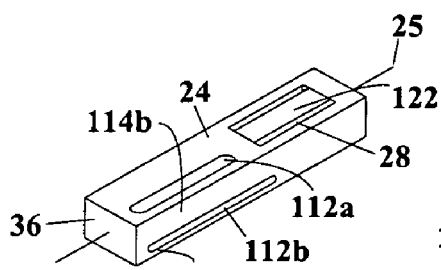
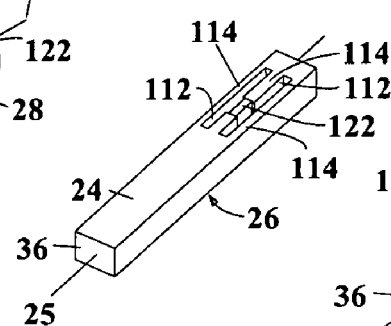
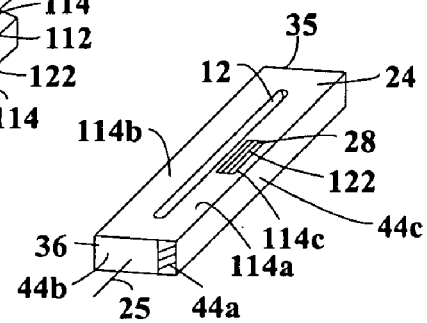
Fig. 55  Fig. 56  Fig. 57
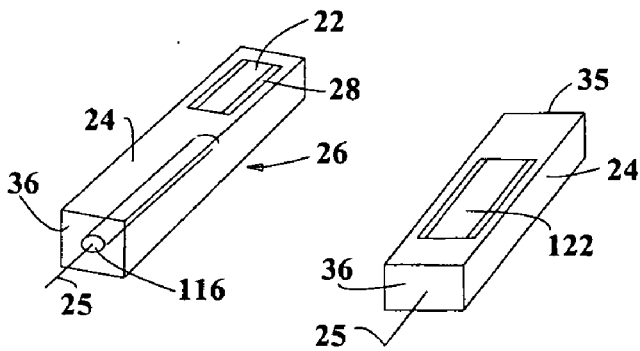
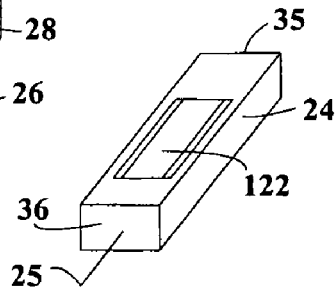
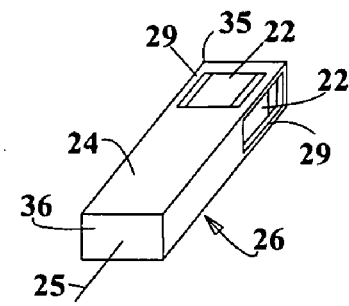
Fig. 58  Fig. 59  Fig. 60

VIBRATORY MOTORS AND METHODS OF MAKING AND USING SAME

CROSS-REFERENCE TO RELATED APPLICATIONS

This application is a continuation of U.S. patent application Ser. No. 10/691,362 filed Oct. 22, 2003 now U.S. Pat. No. 6,825,592, which is a continuation application to U.S. patent application Ser. No. 09/801,194 filed Mar. 8, 2001 now U.S. Pat. No. 6,870,304, which claims priority under 35 U.S.C. § 119(e) from U.S. Provisional Patent Application No. 60/191,876 filed Mar. 23, 2000 entitled "Electric Motor Using Vibration to Convert Electrical Energy Into Mechanical Motion" and listing inventors Bjoern Magnussen, Steve Schofield and Ben Hagemann; and from application No. 60/215,438 filed Jun. 30, 2000, Application No. 60/215,686 filed Jun. 30, 2000, Application No. 60/231,001 filed Sep. 8, 2000, and Application No. 60/236,005 filed Sep. 27, 2000; each entitled "Electrical Motor Using Vibration to Convert Electrical Energy Into Mechanical Motion" and listing inventors Bjoern Magnussen, Ben Hagemann and Peter Varadi. The entire disclosures of these preceding applications are incorporated by this reference as though set forth fully herein.

BACKGROUND OF THE INVENTION

To move small components, electromagnetic motors are often used because they are relatively inexpensive. The electromagnetic motors rotate very quickly and can only apply a low force, so they are always used with a gearbox that provides the slower motion and increased power necessary for practical applications. It should be noted that the movement of driven elements referred to in this disclosure refers to a translation or rotary motion in a common direction, and does not included motion that merely moves a part alternatively back and forth to shake the part without any net movement. While the conventional electromagnetic motors are relatively inexpensive, there are a large number of moving parts which complicates assembly and reliability, and the low power and need for a gearbox not only limits their application but also makes the cost excessive for many applications. Moreover, these motors are too big, not very precise in their motion, and are noisy. There is thus a need for a simpler, quieter and less expensive motor.

An alternative type of small motor is a piezoelectric motor, which uses a material that can change dimension when a voltage is applied to the material. Piezoelectric ceramics are used in electromechanical micromotors to provide linear or circular motion by making frictional contact between the vibratory motor and a driven object. These piezoelectric motors are composed of at least one mechanical resonator and at least one piezoelectric actuator. When electrically excited by oscillating electrical signals, the actuator generates mechanical vibrations that are amplified by the resonator. When the resonator is brought into contact with a body, these vibrations generate frictional forces in the contact area with the body and cause the body to move. The speed, direction and mechanical power of the resulting mechanical output depend on the form and frequency of the vibrations in the contact area. These piezoelectric motors work with small changes in dimension for a given voltage, and they can vibrate at many tens of thousands of cycles per second. Various cumbersome and expensive designs have been used to obtain useful forces and motions from these small vibratory motions.

One type of piezoelectric motor is a traveling wave motor, which uses a wave that travels through the piezoelectric material. These motors typically are based on a disc shaped design and are expensive to produce. The shape and the cost of these motors limit their application.

Other types of piezoelectric motors require a specially shaped waveform in the input signal in order to cause the piezoelectric material to move in a desired direction. One such type of motor is referred to as a stick-slip drive. These motors have a piezoelectric element that moves an object in a desired direction on a support at a relatively slow rate sufficient to allow friction to move the object. The waveform applied to the piezoelectric element causes the piezoelectric to then quickly retract and effectively pull the support out from under the object causing the object to slip relative to the support. The process is repeated, resulting in motion. Since these motors require a sawtooth or similar shaped waveform to operate, they require complex electronics that increase the cost of such motors.

A yet further type of piezoelectric motor is the impact drive, which repeatedly hits an object in order to make it move.

In piezoelectric micromotors, the piezoelectric element can be used to excite two independent modes of vibration in the resonator. Each mode causes the contact area on the resonator to oscillate along a certain direction. The modes are often selected so that the respective directions of oscillation are perpendicular to each other. The superposition of the two perpendicular vibrations cause the contact area to move along curves known as Lissajous figures. For example, if both vibrations have the same frequency and no relative phase shift between the vibrations, the motion resulting from the superposition is linear. If the frequencies are the same and the relative phase shift is 90 degrees, then the resulting motion is circular if the amplitudes of each vibration are identical; otherwise the resulting motion is elliptical. If the frequencies are different, then other motions such as figure-eights can be achieved.

The Lissajous figures have been used to produce figure-eight motion drives. These drives require an electrical signal that has to contain two frequencies to cause a tip of the vibration element to move in a figure-eight shaped motion. The resulting electronics are complex and expensive, and it is difficult to use the figure-eight motion to create useful motion of an object.

In order to move another body and to create a mechanical output, circular or large-angle elliptical motions (semi-axes nearly equal) have been preferred over linear motions, Piezoelectric micromotors in the prior art thus commonly employ two perpendicular modes of vibration that have a relative phase shift of approximately ninety degrees. The modes are excited close to their respective resonance frequencies so that the resulting mechanical output is maximized. If the relative phase shift between the two modes is changed to −90 degrees, the direction in which the ellipse is traversed is reversed. The motion of the body in contact with the resonator is thus reversed as well. But these conventional motors require two piezoelectric drivers located and selected to excite the two separate resonant modes. This requires two sets of drivers, two sets of electronic driving systems, an electronic system that will reverse the phase of each driver, and the basic design places limitations on the locations of components.

The prior art thus includes electromechanical micromotors where a rod-like resonator has a small piezoelectric plate that is attached to the resonator. The resonator contacts the moving body at the tip of the rod. The actuator excites a longitudinal mode and a bending mode of the rod. The excitation frequency is chosen in-between the two resonance frequencies of the respective modes so that the relative phase shift is 90 degrees. The phase shift is generated by the mechanical properties of the resonator, in particular its mechanical damping properties. The resulting elliptical motion of the resonator's tip is such that one of the semi-axes of the ellipse is aligned with the rod-axis and the other semi-axis of the ellipse is perpendicular thereto. A second piezoelectric actuator is used to reverse the direction in which the ellipse is traversed, and is placed at a different location on the resonator. The second piezoelectric actuator is located in such a way that it excites the same two modes but with a relative phase shift of −90 degrees.

Unfortunately, this actuator requires two sets of electronics to drive the motor in opposing directions, and has two sets of driving piezoelectric plates, resulting not only in a large number of parts but also greatly increasing the complexity of the system and resulting in significant costs for these type of motors. The motor also has limited power because the driving frequency is selected to be between two resonant frequencies. There is thus a need for a vibratory motor with simpler electronics, fewer parts, and greater efficiency.

In other vibratory motors, a piezoelectric element has a number of electrodes placed on different portions of the element in order to distort the element in various ways. Thus, for example, two modes of vibration can be excited by at least two separate, independently excited electrodes in each of four quadrants of a rectangular piezoelectric ceramic element. A second set of electrodes is used to reverse the direction in which the ellipse is traversed. The resulting elliptical motion is such that one of the semi-axes of the ellipse is aligned with the longitudinal axis of the motor and the other semi-axes of the ellipse is perpendicular thereto. As mentioned elsewhere, the ratio of the semi-axes can be advantageously used to increase motion or reduce travel time, by making advantageous use of ratios of 5:1, 10:1, or from 20–50:1. Again though, there are a number of electronic connections and many parts to achieve this motion, resulting in a high cost for this type of motor. It is an object of some aspects of the present invention to provide a micromotor, which is cheaper and easier to manufacture than previous art.

SUMMARY OF THE INVENTION

This invention uses a single piezoelectric element and a mechanical resonator to achieve its desired motion. The piezoelectric element has one pair of electrical contacts. The piezoelectric element is excited using sinusoidal electrical signals with the element, resonator, and sometimes the mounting system being configured so that at least two modes of vibration are excited by the single signal to generate an elliptic motion in the area where the resonator comes into contact with the body to be moved.

Unlike the prior art, the semi-axes of the ellipse advantageously are neither aligned with the longitudinal axis of the resonator nor in a direction perpendicular to it. Also, the relative phase shift between the two modes need not be close to 90 degrees so as to produce a circular or nearly circular-elliptical path. The amplitudes of the respective vibrations can be different in magnitude. At a given frequency, the motor 26 (see FIG. 1) moves the body 42 in one direction. When operated at a different frequency, the motor 26 moves the body 42 in a different direction or different rotation. Preferably, it moves the body 42 in the opposite direction, but this will depend on the needs of the user and the design of the motor 26, its support, and the driven body 42. It is possible to operate the motor 26 at even more frequencies to generate additional motions of the body such as rotation and/or translation of an axle. The movement of driven body 42 in this disclosure refers to a translation or rotary motion of the body 42 in a common direction, rather than motion that merely moves the body 42 alternatively back and forth in a cyclic path to shake the body without any net translation or net rotation.

According to the invention, a piezoelectric element is mounted inside a mechanical resonator in part to preload the element in compression. The combined piezoelectric element and mechanical resonator are referred to as a motor or as a vibration element. The combined piezoelectric element and resonator are configured so that a single driving frequency excites at least two vibration modes sufficiently to cause an elliptical motion in a first direction at a predetermined point on the motor that is going to be used to drive a driven object. In particular, a vibration mode is typically along the longitudinal axis of the motor, and a second vibration mode is transverse thereto so as to result in bending or torsion. The motion can be achieved by appropriately configuring the resonator and piezoelectric element, or in some cases by locating the driving piezoelectric element offset from a longitudinal axis of the resonator to cause combined axial and bending motion.

The motion at a distal edge 44 at a distal end 36 of the resonator is typically greatest and is preferably used, although other locations on the motor can be used in some specific embodiments. The opposing end of the motor is the proximal end 35. The result is the distal edge moves in an elliptical path resulting from a combination of at least two vibration modes when the motor is excited by a single signal at a first frequency. The motor is further configured such that a second driving frequency excites two resonant vibration modes in the motor so that the predetermined point on the motor rotates in an elliptical path in an opposite direction as the first elliptical path. A single piezoelectric element and resonator are thus driven by a single frequency to generate a first elliptical motion at a predetermined location on the vibratory motor. The piezoelectric element is driven at a second frequency to excite two resonant vibration modes of the vibratory motor that cause the predetermined location to move in a second elliptical motion in a different, and preferably opposite direction to the first elliptical motion, sufficient to move the driven element a desired distance. The two elliptical motions are typically not overlapping. The motion can be achieved at various locations on the motor, in varying amplitudes and directions, and that allows a variety of arrangements in which the motor can drive other elements.

In accordance with the invention, the motor thus requires a single piezoelectric driver, a single resonator, and two separate frequencies to move objects in two opposing directions. The selection and configuration of the piezoelectric driver and the resonator achieve resonance or near resonant vibrations of sufficient magnitude to move objects with predetermined force. The effort expended in the design results in a motor of simple design, few parts, low cost and high efficiency.

In a further embodiment, the motor is resiliently urged toward the driven object. Depending on the mounting arrangement, the mounting may become part of the vibrating mass and affect the resonant vibration modes of the motor in order to achieve the desired motion at the desired location on the motor that is to be in contact with the driven object.

A simplified vibratory system is provided that has a source of vibration in driving communication with a resonator that has a selected contacting portion located to engage the driven element during use of the system. The source of vibration is preferably a piezoelectric element, but could comprise other elements that convert electrical energy into physical motion, such as magnetostrictive or electrostrictive devices in some specific embodiments. For convenience, a piezoelectric vibration source will usually be used in this description.

The vibrating element and resonator are configured to move the selected contacting portion in a first elliptical motion when the resonator is excited to simultaneously resonate in at least two vibration modes by a first signal at a first frequency provided to the vibrating element, according to a specific embodiment. The resulting elliptical motion is of sufficient amplitude to move the driven element when the driven element and selected contacting portion are maintained in sufficient contact to achieve movement of the driven element. The at least two vibration modes are selected so that at least one does not include a pure longitudinal or bending mode of the resonator in order to produce the first elliptical motion. The movement of driven elements referred to in this disclosure refers to a translation or rotary motion in a common direction, rather than motion that merely moves a part alternatively back and forth to shake the part without any net translation or net rotation.

The piezoelectric element and resonator are preferably configured to cause the selected contacting portion to move in a second elliptical motion a desired amount when excited to simultaneously resonate in at least two vibration modes by a second signal at a second frequency provided to the piezoelectric element, according to the specific embodiment. This allows multi-degree motion of the driven element by a single vibrating element. Additional vibration modes excited by different discrete frequencies can be used to provide different motions to the same selected contacting portion, or to different selected contacting portions engaging different driven elements. In one version of a preferred embodiment, the resonator comprises an elongated member with the selected contacting portion being located on an edge of a distal end of the member.

A number of variations on this basic combination are described, after which some further features and advantages are discussed. One variation includes having a resilient element interposed between a base and the vibratory element and located to resiliently urge the vibratory element against the driven element during operation of the system. There are advantages to having the vibration mode produce a node on the resonator element at the first frequency, with a resilient mounting connected to the vibratory element at the node and located to resiliently urge the vibratory element against the driven element during operation of the system. The resilient mounting could also be connected to the vibratory element at a location other than the node yet still located to resiliently urge the vibratory element against the driven element during operation of the system. The resilient mounting can help determine the various vibration modes.

Advantageously, the piezoelectric element is held in compression in the resonator during operation of the system. Preferably, the piezoelectric element is press-fit into an opening in the resonator to place the piezoelectric element in compression during operation of the system. Further advantages of this press-fit can be achieved if the piezoelectric element is held in compression by walls of the resonator that are stressed past their yield point, during operation of the system. Further advantages are derived by having the walls curved. Advantages are also provided if the piezoelectric element has an inclined surface adjacent an edge of the piezoelectric element to make it easier to press-fit the piezoelectric element into an opening in the resonator.

The first and second elliptical motions each have a major and minor axis, and there are advantages to having the ratio of the major to minor axes of each elliptical motion being in the range of about 3:1 to 150:1, and preferably from about 4:1 to 30:1, and ideally from about 5:1 to 15:1. Among other advantages, faster motion can be achieved, and the system design is easier to achieve. Advantageously, one of the major or minor axes is aligned with an axis of motion of the driven element in order to maximize the motion, and preferably the major axis is aligned.

There are advantages to having the major axes of these ellipses inclined at an angle with respect to a predominant axis of the vibratory element, and to maintain that inclination angle over a range of driving frequencies. There are thus advantages to having the system configuration and angle of inclination selected so that an angle β between the major axis and a tangent to the driven element at the selected contacting portion and along the direction of motion, varies by about 25 degrees or less over a frequency range of about 200 Hz or greater, on either side of the first frequency. Advantageously the angle β varies by about 10 degrees or less.

There are also advantages to having the angle vary in order to allow greater ease in system design and to improve performance, among other factors. Thus, there are advantages to having a major axis of the elliptical motion inclined at an angle β, with the angle β being between about 5–85 degrees when the selected contacting portion is drivingly engaging the driven element. Most of these ranges omit the range when the angle β is between about 0–5 degrees, and that occurs when the same selected contacting portion is used for multiple motions. But when the selected contacting portion achieves only one direction of motion of the driven element, it is possible to more closely align the axes and achieve alignments within about 0–5 degrees of the driven motion.

Another feature of this invention is the ability to achieve the desired motion over a range of driving frequencies in a manner that allows the use of components with lower tolerances and thus lower costs. Thus there is provided a vibratory element having a source of vibration vibrating a resonator to amplify the vibration. The resonator has a selected contacting portion located to engage a driven element to move the driven element along a driven path during use of the vibratory element. The selected contacting portion moves in a first elliptical path when the source of vibration is excited by a first electrical signal at a first frequency. The elliptical path has a major and minor axis which are not aligned with a predominant axis of the vibrating element by a defined angle that varies by less than about 10 degrees when the first frequency varies by about 200 Hz or more on either side of the first frequency. Preferably the defined angles vary by less than 5 degrees when the first frequency varies by 200 Hz, and desirably when the first frequency varies by 2.5 kHz, or more.

The other features of this invention can also be used with this range of driving frequencies. Thus, as before, the source of vibration is preferably a piezoelectric element, but other elements could be used. The motion can be caused by pure vibration modes or by at least two vibration modes that are superimposed, but preferably at least one of the vibration modes is not a pure longitudinal mode or pure bending mode. Advantageously the vibratory element is connected to a resilient support located to resiliently urge the selected contacting portion against a driven element during use of the vibratory element. As desired, the resilient support can be used to help define the vibration modes generating the elliptical motion.

Another aspect of this invention comprises a vibratory component for moving a driven element using off-resonance vibration modes. The vibratory component includes a vibratory element, such as a piezoelectric vibration source, mounted to a resonator to form a vibrating element. The vibrating element has a selected contacting portion located to engage the driven element during use. A variety of piezoelectric vibration sources can be used, including plural piezoelectric elements to achieve the desired elliptical motion of the selected contacting portion. But preferably the selected contacting portion moving in a first elliptical path has a major axis and minor axis when the vibration source is excited by a first electrical signal that causes at least two vibration modes superimposed to create the first elliptical path. Advantageously at least one of the vibration modes is other than a pure longitudinal mode and other than a pure bending mode. Further, for this particular aspect, at least one of the at least two vibration modes is off-resonance, with the first electrical signal being amplified sufficiently to cause the at least one off-resonance vibration mode to produce a motion of the selected contacting portion having sufficient amplitude that the resulting elliptical path can move the driven element during use. This off-resonance feature can be used with other features described herein, including the resilient support, press-fit piezoelectric elements, and other features to name a few.

One feature not mentioned earlier but applicable to the various embodiments and features of this invention is the use of a large aspect ratio on the elliptical motion of the selected contacting portion. The ratio of the major axis to the minor axis is preferably about 5:1 or greater, with ratios of 15:1 and 30:1 believed to provide usable but progressively less desirable motion. As the aspect ratio increases, the driving motion becomes more akin to an impact drive. Nevertheless, it is believed possible to have aspect ratios of 3:1–150:1, or even more, provide usable motion using the various features and embodiments of this disclosure.

One further aspect of this invention is the use of vibration modes other than pure longitudinal or pure bending. Thus, the invention includes a vibration source mounted to a resonator to form a vibrating element. The vibrating element has a selected contacting portion located to engage the driven element during use. The selected contacting portion moves in a first elliptical path having a major axis and minor axis when the vibration source is excited by a first electrical signal that causes at least two vibration modes that are superimposed to create the first elliptical path. In this particular aspect, at least one of the vibration modes is other than a pure longitudinal mode and other than a pure bending mode. The elliptical motion has a major axis and minor axis, one of which is aligned with the first direction an amount sufficient to cause motion of the driven element. Stated differently, the vibratory element moves the selected contacting portion in first and second elliptical paths each having a major and minor axis. At least one of the major and minor axes does not coincide with the direction of motion resulting from the elliptical path with which the axis is associated. This use of vibration modes other than bending or pure longitudinal can be used with other features described herein, including the resilient support, press-fit piezoelectric elements, and other features to name a few.

Another aspect of this invention is the use of elliptical motion that does not align with the vibration element, but rather uses an inclined driving element and driven element. There is thus provided a vibratory system for moving a driven element that includes a driven element movable in at least a first direction. The vibration source is mounted to a resonator to form a vibrating element; the vibrating element having a selected contacting portion located to engage and move the driven element. For this particular aspect, the selected contacting portion moves in a first elliptical path having a major axis and minor axis at least one of which is not aligned with a longitudinal axis of the vibrating element. Advantageously, the longitudinal axis is inclined at an angle $\alpha$ to a tangent to the driven element in the first direction at the selected contacting portion. The angle $\alpha$ is between about 10 and 80 degrees when the selected contacting portion is drivingly engaging the driven element. That angle is further refined as discussed later. This use of the inclined axis can also be used with other features described herein, including the resilient support, press-fit piezoelectric elements, and other features to name a few.

This invention also comprises methods for implementing the above apparatus and advantages. In particular, it includes a method of configuring a vibratory system having a vibrating element with a selected contacting portion drivingly engaging a driven element to move the driven element by moving the selected contacting portion in a first elliptical motion. The method comprises analyzing that elliptical motion in a localized coordinate system in which at least one of the major and minor axes of the elliptical motion are not aligned with a predominant axis of motion of the vibrating element. The method then varies the system design to incline at least one of the elliptical axes relative to a tangent to the driven element in the direction of motion at the selected contacting portion to more closely align at least one axis with the tangent by an amount sufficient to achieve acceptable motion of the driven element. The inclination is achieved by altering the elliptical motion or altering the relative orientation of the vibrating element and the driven element, or both. That inclination is maintained during operation of the vibrating system.

There are advantages to orienting the localized coordinate system relative to the tangent. There are further advantages in setting the angle of inclination of the major axis of the first elliptical motion, designated by an angle $\beta_1$, to an angle that is greater than 5 degrees, and with the vibrating element and the driven element being inclined relative to each other by an angle $\alpha$ that is greater than about 5 degrees.

The method also can include the provision of a vibrating element having the selected contacting portion moving in a second elliptical motion to move the driven element in a second direction a desired amount. A further variation of this method is to analyze that second elliptical motion in a similar method to the first elliptical motion. Thus, the second elliptical motion is analyzed in a localized coordinate system in which at least one of the major and minor axes of the second elliptical motion are not aligned with a predominant axis of motion of the vibrating element. The system design is altered to incline at least one of the second elliptical axes relative to a tangent to the driven element in the second direction at the selected contacting portion to more closely align the at least one axis of the second elliptical motion with the tangent in the second direction by an amount sufficient to achieve acceptable motion of the driven element in the second direction. It is advantageous to maintain that inclination of the second elliptical axis during use of the system. The orientation of at least one of the first and second elliptical axes is typically a compromise that is selected to achieve less than optimum motion of the driven element in one direction in order to improve the motion of the driven element in the other direction.

The method of analysis can also orient the localized coordinate system relative to the tangent, with the angle of inclination of the major axis of the first elliptical motion being designated by an angle $\beta_1$, and with the vibrating element and the driven element being inclined relative to each other by an angle $\alpha$ that is greater than about 5 degrees. The angle of inclination of the major axis of the second elliptical motion can be designated by an angle $\beta_2$, with at least one of $\beta_1$ and $\beta_2$ being greater than 5 degrees. Preferably, at least one of the angles $\beta_1$ and $\beta_2$ is between about 5–85 degrees. Moreover, in this method the vibratory element can be resiliently mounted to a base. The other features discussed herein could be used as well.

This invention allows the use of simplified driving systems. One driving system uses an inductive coil mounted on the piezoelectric element and acting in cooperation with the inherent capacitance of the piezoelectric element to form an L-C driving circuit. The wire coil can be integrated into the vibratory element with the coil wire being also used as an electrical connection to the vibratory element, either in series or parallel.

This invention also allows the use of a simple driver apparatus to control the operation of the vibrating element and its mechanical resonator when the vibrating element has an inherent capacitance. As mentioned, the piezoelectric element has an inherent capacitance. The control apparatus has at least one switching element allowing the application of a predetermined signal, such as the sinusoidal signal discussed herein. Further, there is at least one electrical resonator driver circuit driving the vibrating element, where the driver circuit is electrically coupled to and activated by the switching element. Finally, there is at least one inductive coil electrically coupled to the vibrating element to form an electric resonator together with the capacitance of the vibrating element so the signal excites the driver circuit at a predetermined frequency. The circuit resonances are selected to produce with the first and second signals at the first and second frequencies used to generate the first and second (and other) elliptical motions.

There are advantages if the coil is either mounted to the vibratory element or mounted to a common support with the vibratory element. Preferably the coil encircles a portion of the piezoelectric element or the mechanical resonator. Further, it is useful to locate the driver circuit and switching element more than four times further away from the piezoelectric element than the coil. To make the construction even simpler, the same electrical conductor that is used to form the coil can also connect the piezoelectric element to the driver circuit—either in parallel or series.

Moreover, in a further embodiment there is provided a piezoelectric resonator driver circuit having a plurality of unidirectional electrical gates to drive the piezoelectric element. The driver circuit is electrically coupled to and controlled by the control element; the piezoelectric element being electrically coupled to and paired with one of the unidirectional gates. At least one electromagnetic storage element, such as an inductive coil, is electrically coupled to the piezoelectric element so that the electromagnetic storage element forms an electric resonator together with the capacitance of the vibrating element. The unidirectional electrical gates can take the form of one or more diodes arranged to prevent a negative electrical voltage to the piezoelectric element. The driver circuit preferably resonates at a modulated predetermined first resonant frequency selected to cause the vibrating element to cause the selected contacting portion to move in the first elliptical motion with sufficient amplitude to move the driven element in the first direction when the selected contacting portion engages the driven element. The driver circuit also preferably resonates at a modulated predetermined second resonant frequency selected to cause the vibrating element to cause the selected contacting portion to move in a second elliptical motion with sufficient amplitude to move a driven element in the second direction when the selected contacting portion engages the driven element. Moreover, a resistor can be electrically coupled with the inductor and piezoelectric element and/or the gate element to maintain an input voltage to the piezoelectric element within predetermined operating parameters. Advantageously the diode(s) are coupled to the resistor in an orientation to prevent a negative voltage in the piezoelectric element.

The control methods achieved by the control circuits broadly include placing a control element in electrical communication with the piezoelectric element and an inductor to alternate the electric signal between the inductor and piezoelectric element, with the piezoelectric element providing a capacitance to function as a switched resonance L-C circuit so the electrical signal can resonantly drive the vibrating element at a first frequency. Advantageously a portion of the inductor is formed on the resonator.

Further, the method for controlling the operation of the vibrating element includes placing the control element in electrical communication with the piezoelectric element and the inductor to alternate the electric signal between the inductor and piezoelectric element, with the piezoelectric element providing a capacitance to function as a switched resonance L-C circuit so the electrical signal can resonantly drive the vibrating element at a first frequency. Preferably, the method further includes selecting the first frequency and configuring the vibrating element to cause a selected contacting portion of the vibrating element to move in a first elliptical path with sufficient amplitude to move a driven element in a first direction when the selected contacting portion engages the driven element.

Advantageously, the voltage to drive the piezoelectric element at the first frequency is greater than the supply voltage to the circuit. Moreover, the method includes placing a resistor in electrical communication with the piezoelectric element to shape the electrical signal provided to the piezoelectric element. Further, the method preferably forms, at least a portion of the inductor around a portion of the vibratory element. Finally, the inductor and piezoelectric element preferably provide a capacitance to function as a switched resonance L-C circuit so that a second electrical signal can resonantly drive the vibrating element at a second frequency, with the second frequency being selected in conjunction with the configuration of the vibratory element and its mounting to cause the selected contacting portion of the vibrating element to move in a second elliptical path with sufficient amplitude to move the driven element in a second direction when the selected contacting portion engages the driven element.

This invention also includes a method of configuring a vibratory system for moving a driven element that is supported to allow the driven element to move in a predetermined manner at a predetermined rate of travel with a predetermined force. The system has a selected contacting portion of a vibratory element periodically engaging the driven element to move the driven element, with one of the selected contacting portion and the driven element being resiliently urged against the other of the placed in resilient contact with the selected contacting portion and the driven element. The resilient contact is provided by a resilient support, with the vibratory element being caused to vibrate by a vibration source that converts electrical energy directly into physical motion. The vibratory element includes the vibration source mounted in a resonator with the selected contacting portion being on the resonator.

The method of configuring this system comprises defining a desired elliptical motion of the selected contacting portion to produce a desired movement of the driven element. At least one of the vibratory element and the resilient support is configured to cause the resonator to vibrate in two modes of sufficient amplitude and phase that the selected contacting portion moves in an elliptical path when the vibratory source is excited by a first signal at a first frequency provided to the vibration source. The elliptical path is sufficiently close to the desired elliptical motion to achieve an acceptable motion of the driven element.

The method can further comprise defining a second desired elliptical motion of the selected contacting portion to produce a second desired movement of the driven element. At least one of the vibratory element and the resilient support is configured to cause the resonator to vibrate in two modes of sufficient amplitude and phase that the selected contacting portion moves in a second elliptical path when the vibratory source is excited by a second signal at a second frequency provided to the vibration source. The second elliptical path is selected to be sufficiently close to the second desired elliptical motion to achieve an acceptable second movement of the driven element. The vibration source is preferably selected to comprise a piezoelectric element. Further, the resonator can be configured to cause the desired motion of the selected contacting portion, or the resonator in combination with a resilient support can be configured to cause the desired motion.

In addition to the selected contacting portion moving the driven element in a first direction when the source of vibration is driven by the first signal and moving the driven element in a second direction when the source of vibration is driven by the second signal, advantages arise if the selected contacting portion further moves in the first direction when a single sinusoidal signal of a first frequency is applied, and can also move in the first direction when the first frequency is dominant and superimposed with plural sinusoidal signals of different frequencies. In these latter instances, the second signal does not occur simultaneously with the first signal or else the first and second signals are of substantially different amplitude if they do occur simultaneously.

The method further includes placing the piezoelectric element in compression in the resonator during operation of the system by press-fitting the piezoelectric element into an opening in the resonator. This is preferably achieved by stressing walls of the resonator past their yield point but not past their ultimate strength point. The method further includes interposing a resilient element between the base and the vibratory element to resiliently urge the vibratory element against the driven element during excitation at the first frequency. Further methods to implement the above features and advantages are disclosed in more detail below.

A further method of this invention includes a method for moving objects using vibratory motors having a vibration source placed in a resonator. The method comprises moving a selected contacting portion of a resonator in a first elliptical motion in a first direction by configuring the resonator to simultaneously vibrate in two modes of sufficient amplitude and phase to cause the first elliptical motion of the selected contacting portion when a single electrical signal is applied to the vibration source. The method can further comprise placing the selected contacting portion in resilient contact with a driven element to move the driven element. Additionally, the method can further comprise connecting a resilient element to the resonator to resiliently urge the resonator against a driven element.

Other aspects of this method include selecting a piezoelectric element for the vibration source and placing that piezoelectric element in compression by press fitting it into an opening in the resonator. The opening is preferably defined by at least two opposing walls that are stressed beyond their elastic limit when the piezoelectric element is press-fit into the opening. There are advantages if the walls are selected to be curved.

When a piezoelectric element is used for the vibration source, the inherent capacitance of the piezoelectric lends itself to the use of simplified control systems while still maintaining system performance. A control switch can activate a resonator driver circuit driving the vibrating element, with at least one electromagnetic storage element, such as an inductive coil, electrically coupled to the vibrating element to drive the vibrating element when the driver circuit is activated. The vibrating element increases charge when the electromagnetic storage element discharges and the coil increases its charge when the vibrating element discharges and the driver circuit is not activating the vibrating element. This construction basically places a control element in electrical communication with the piezoelectric element and an inductor to alternate the electric signal between the inductor and piezoelectric element, with the piezoelectric element providing a capacitance to function as a switched resonance L-C circuit so the electrical signal can resonantly drive the vibrating element at a first frequency selected to achieve the desired elliptical motion at the selected contacting portion. This allows the voltage to drive the piezoelectric element at the first frequency to be greater than the voltage of the electrical signal provided to the control element. The same circuit can be used to provide the electrical signal for other vibration modes of the piezoelectric element.

Further, the coil can be mounted to the vibratory element or mounted to the same support as the vibratory element. Advantageously, the coil can encircle a portion of the vibratory element. Moreover, the coil can be connected to the piezoelectric element in series, or in parallel. Additionally, the piezoelectric driver circuit can have a plurality of unidirectional electrical gates, such as a diode, can be paired with the piezoelectric element to prevent or at least limit any negative voltage to the piezoelectric element. In these driver circuits, the frequency is selected to achieve the desired motion of the selected contacting portion.

This invention further includes improved manufacturing and assembly aspects for vibratory apparatus used to move a driven element. In these aspects a vibration source is used that converts electrical energy directly into physical motion. A resonator is provided having an opening defined by at least two opposing sidewalls that are stressed beyond their elastic limit to hold the vibration element in compression. The vibration source is within that opening so that the vibration element is held in compression by the resonator under a defined preload during operation. Advantageously, the vibration source is press-fit into the opening, and comprises a piezoelectric element. Further advantages are achieved if the sidewalls are curved.

Moreover, it is useful to provide the piezoelectric element with at least two opposing edges that are inclined and located to engage edges of the opening to make it easier to press-fit the piezoelectric element into the opening while reducing damage to the piezoelectric element. The reduction of damage is especially desirable in view of the damage that can occur to the piezoelectric element and to the resonator if the inclined edges are absent. Preferably, there are at least two opposing edges that have surfaces substantially parallel to the abutting walls defining the opening, and an inclined surface extending therefrom to a contacting surface abutting one of the walls, with the contacting surface exerting the preload.

In one embodiment, a resonator has a longitudinal axis with an opening partially defined by two sidewalls on opposing sides of the longitudinal axis and two opposing end walls on the longitudinal axis. A piezoelectric element is held in compression by the opposing end walls, with each of the sidewalls being stressed beyond its elastic limit to hold the piezoelectric element in compression. The resonator has a selected contacting portion, which moves in a first elliptical motion when the piezoelectric element is excited by the various electrical signals described herein. There are advantages if the sidewalls are curved, and if at least one of the end walls or two opposing sides of the piezoelectric element that engage the end walls have edges that are inclined to facilitate press-fitting the piezoelectric element into the opening and wherein the piezoelectric element is press-fit between the end walls. The sidewalls can be curved to bow away from the piezoelectric element, or toward the piezoelectric element. Further, a portion of an elastic element for supporting the resonator can be interposed between one of the end walls and the piezoelectric element.

The invention also includes a method of placing a piezoelectric element in compression in a resonator, where the resonator has end walls and sidewalls defining an opening sized to receive and place the piezoelectric element in compression. The method includes increasing the distance between opposing end walls enough to allow the piezoelectric element to be forced between the end walls with a force that by itself could not force the piezoelectric element between the end walls in the original state of the opening, and thereby placing the piezoelectric element in compression while also stressing the sidewalls beyond their elastic limit. The method can further include providing an inclined surface on at least one of either the end walls or the corresponding edges of the piezoelectric element, and forcing the piezoelectric element into the opening by engaging said at least one inclined surface.

Moreover, the method can include pulling the opposing end walls apart while forcing the piezoelectric element into the opening. In one further embodiment, the method includes curving the sidewalls away from each other, and urging the opposing, curved sidewalls toward each other in order to move the end walls away from each other and then placing the piezoelectric element between the end walls. In another embodiment, the method includes curving the sidewalls toward each other, and urging the opposing, curved sidewalls away from each other in order to move the end walls away from each other and then forcing the piezoelectric element between the end walls. The various methods can also include interposing a resilient mount for the piezoelectric element between the piezoelectric element and one of the end walls.

There is also advantageously provided a piezoelectric element configured to be press-fit into an opening in a resonator. The opening is defined by sidewalls located on opposing sides of a longitudinal axis through the opening and separated by a first dimension, with opposing end walls located on the longitudinal axis and separated by a second dimension. The piezoelectric element has a first dimension that is smaller than the first dimension of the opening and has a second dimension larger than the second dimension of the opening and selected to stress the sidewalls beyond their elastic limit when the piezoelectric element is inserted into the opening. The piezoelectric element has inclined edges corresponding in location to edges of the end walls when the piezoelectric element is aligned to be inserted into the opening. The above variations can also be used with this embodiment, including curved sidewalls, a resilient support for the resonator interposed between one end wall and the piezoelectric element during use, and at least one inclined edge corresponding in location to an edge of the end wall when the piezoelectric element is aligned to be inserted into the opening.

There is also advantageously provided a resonator 24 for use with a piezoelectric actuator. The resonator has a continuous walled, externally accessible opening sized to receive a piezoelectric element or other source of vibration, and to hold that element in compression. The opening is optionally, but preferably defined in part by opposing sidewalls that are curved. The walls can be curved toward, or away from the opening and the piezoelectric element therein. Preferably the sidewalls are curved, and have a uniform cross section for a substantial portion of the length of the sidewall. A substantial length includes over half the length, preferably more, and ideally the entire length until the junction with the end walls is reached. Rectangular cross sections are preferred.

Given the present disclosure, further methods will be apparent to one skilled in the art to implement the above features and advantages, and the features and advantages discussed below. Further, other objects and features of the invention will become apparent from consideration of the following description taken in connection with the accompanying drawings, in which like numbers refer to like parts throughout.

BRIEF DESCRIPTION OF THE DRAWINGS

FIG. 7a shows a perspective view of a vibratory element of this invention containing a press-fit piezoelectric element;

FIG. 7b shows an enlarged portion of the vibratory element of FIG. 7a during assembly;

FIG. 8 shows a fifth embodiment of this invention having a press-fit piezoelectric element;

FIG. 9 shows a top view of a press-fit embodiment before deformation;

FIG. 10 shows a top view of the embodiment of FIG. 9 after deformation by a cylindrical wedge;

FIG. 11 shows a sectional view along line 11—11 of FIG. 10;

FIG. 12 shows a top view of an alternative embodiment of FIG. 9 using a rectangular wedge;

FIG. 13 shows an embodiment with the piezoelectric element offset from the axis of a resonator;

FIG. 14 shows an embodiment with an insert offsetting the force from the piezoelectric element from the centerline of a resonator;

FIG. 15 shows an embodiment with the piezoelectric element skewed relative to the axis of the resonator;

FIG. 16 shows an embodiment with the piezoelectric element positioned between selectably positioned inert elements and compressed by a threaded fastener;

FIG. 35 shows a configuration of two vibratory elements and one driven element with the driven elements located on opposing sides of the driven element and at inclined angles relative to the driven element and facing the same direction;

FIG. 36 is an end view of the configuration of FIG. 35;

FIGS. 37–40 show configurations of three vibratory elements and one driven element;

FIG. 41 shows a front view of a configuration of six vibratory elements and one driven element;

FIG. 42 shows a left side view of the configuration of FIG. 41;

FIG. 52 shows a perspective view of a vibratory element having a slot in the resonator in the same face of the resonator in which the opening is formed to receive the piezoelectric element;

FIG. 53 shows a perspective view of a vibratory element having a slot in the resonator and an opening with curved ends to receive the piezoelectric element;

FIG. 54 shows a perspective view of a vibratory element having a wider slot in the resonator;

FIG. 55 shows a perspective view of a vibratory element having a slot in the resonator in a face of the resonator that is different from the opening formed to receive the piezoelectric element;

FIG. 56 shows a perspective view of a vibratory element having an "H" shaped opening to receive the piezoelectric element;

FIG. 57 shows a perspective view of a vibratory element having a slot defining two beams in the resonator with the piezoelectric element being located in one beam;

FIG. 58 shows a perspective view of a vibratory element having a hole in the resonator to alter the performance of the vibratory element;

FIG. 59 shows a perspective view of a vibratory element having an enlarged mass at a proximal end of the resonator;

FIG. 60 shows a perspective view of a vibratory element having four sidewalls defining the opening in which the piezoelectric element is placed;

DETAILED DESCRIPTION OF SPECIFIC EMBODIMENTS

Figure 1:
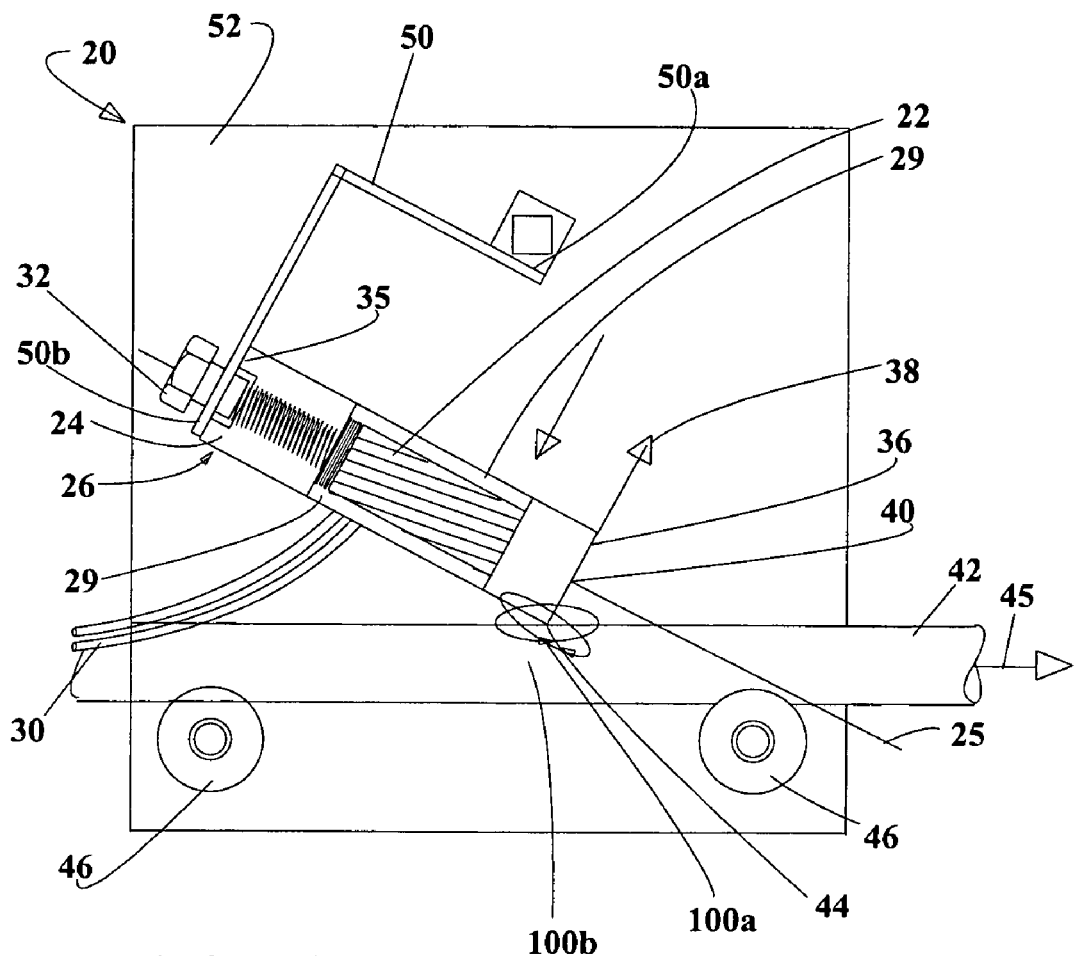
FIG. 1 shows a plan side view of a first embodiment of this invention.
Figure 2:
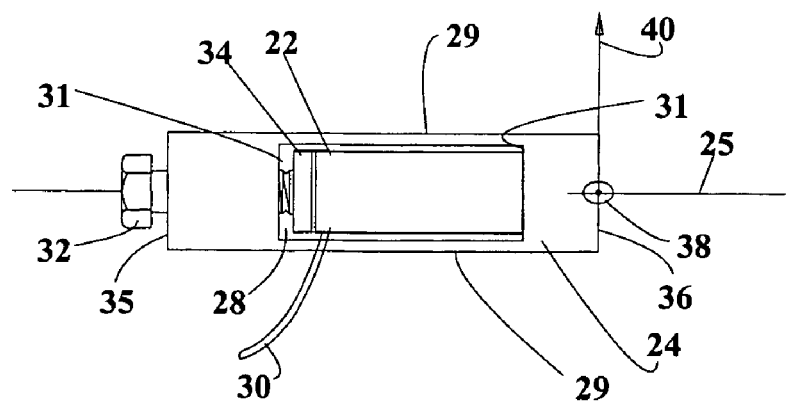
FIG. 2 shows a top view of the vibratory element of FIG. 1.
Figure 3:
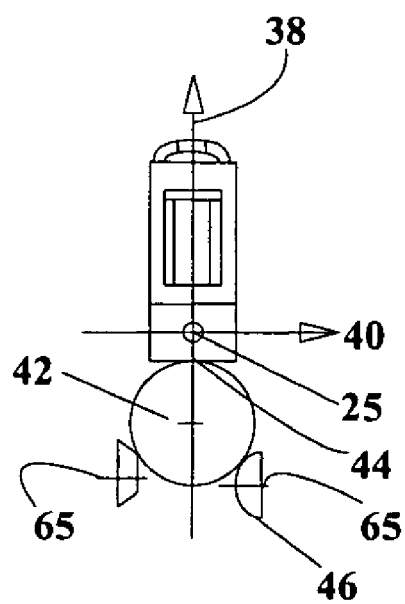
FIG. 3 shows an end view of FIG. 2.

Several embodiments of the motor of this invention will be described, following which a number of theoretical and practical operational and design aspects of the motors are described. Referring to FIGS. 1–3, and as described in detail at various locations, the piezoelectric motor assembly 20 has an element that converts electrical energy into macroscopic mechanical motion. This is achieved by using a single electrical signal to generate at least two vibration motions at a predetermined location of a vibration element. The at least two vibration motions result in an elliptical motion at the predetermined location. The elliptical motion is selected to cause the vibrating element to engage a driven element during a time corresponding to at least a portion of travel in direction of a long axis of the ellipse, and to disengage or slide over the driven element during a time corresponding to travel in the opposite direction. A second, single frequency results in a second elliptical motion in an opposing direction to move the driven element in an opposing direction. The desired motion is used to determine the elliptical motion needed, and the various components of the system are designed to achieve that motion. The use of a single frequency to generate elliptical motion and the simplicity of the resulting design allow a low cost, high reliability motor.

The motor assembly 20 has a vibration source 22 that converts electrical energy directly into physical motion. The vibration source 22 is preferably a piezoelectric element and comprises a block of piezoelectric material, or a multi-layer piezoelectric so that the motion of the various elements combine to increase the movement in desired directions. The shape of the piezoelectric 22 can vary, but it advantageously has a longitudinal axis 25 along its direction of greatest motion. The piezoelectric 22 is mounted to, and preferably inside, a resonator 24. The piezoelectric 22 and resonator 24 comprise a vibration element 26 or motor 26.

The piezoelectric material is preferred because it reacts quickly to applied voltages. While the resulting deflection for a given voltage is small, about 0.1% or less of the length of the piezoelectric, and smaller in other directions, the resulting force is large so that vibration resonance can be achieved.

The source 22 can also comprise electrostrictive materials, magneto-restrictve materials (e.g., Terfenol), or other materials that can be used to excite vibrations, according to other embodiments. Preferably, the vibration source 22 comprises materials or devices that convert electrical energy directly into physical motion. For ease of reference, the vibration source 22 will be referred to and described herein as piezoelectric 22.

To avoid confusion between motor 26 and motor assembly 20, the terminology "vibration element" 26 will be used in most cases to refer to the combination of the piezoelectric element 22 and the resonator 24.

The resonator 24 can have various shapes, but is illustrated as having a rectangular shape with a rectangular cross-section. In order to mount the piezoelectric 22 inside the resonator 24, it is useful to form a cavity or an opening 28 in the resonator 24 to hold the piezoelectric element 22. The opening 28 is shown as extending entirely through a portion of the resonator 24 to form a rectangular opening, with sidewalls 29 which define the sides of opening 28, the sidewalls being located on opposing sides of the longitudinal axis extending through the opening 28, and with end walls 31 being located on the longitudinal axis extending through the opening 28. The opening 28 is thus advantageously defined by continuous walls that enclose the opening. Appropriate electrical connections are provided to the piezoelectric 22 and may comprise electrical connections of various types, but which are illustrated as wires 30.

Application of large voltages to an unrestrained piezoelectric 22 can damage the piezoelectric. Thus, the piezoelectric 22 is advantageously placed in compression along at least its longitudinal axis, by end walls 31. This also causes a preload, which optimizes the piezoelectric lifetime and performance. But a compressive force is not necessarily used if other vibration sources are used that do not require compression, or that do not benefit from compression. Several ways to preload the piezoelectric element 22 are discussed later.

In order to make it easier to place the piezoelectric element 22 in compression, the opening 28 is advantageously enclosed on opposing sides, and preferably enclosed on opposing ends of the longitudinal axis of piezoelectric 22. This arrangement provides opposing surfaces that can be used to provide compression to the piezoelectric 22. One way to preload the piezoelectric 22 is by movably extending a screw 32 through a threaded opening in the proximal end 35 of resonator 24 so that a distal end of the screw can be moved to compress the piezoelectric 22 against one end of the opening 28 in the resonator 24. Since the piezoelectric material is brittle, a protective cap 34 is interposed between the distal end of the screw 32 and the adjacent end of the piezoelectric 22. The cap 34 is made of a protective material that allows the rotation of the screw 32 to compress the piezoelectric while not breaking or cracking the piezoelectric 22. Metal caps 34 are preferred, but some lubricant or rotational accommodating design is advantageously provided in order to avoid at least some damage to the piezoelectric 22 from rotation of the screw 32. Other clamping methods of the piezoelectric 22 without a screw and/or a protecting plate can be used, such as expansion or shrinkage of the opening 28. Additional ways are described below, and other ways will become known to those skilled in the art given the present disclosure.

When a voltage is applied to the piezoelectric element 22, the piezoelectric element extends along longitudinal axis 25, and that causes the vibration element 26 to also extend in length, in part by elongating the smaller cross-section sidewalls 29. The vibration of the piezoelectric 22 excites a longitudinal mode in the vibration element 26 which causes the distal end 36 opposite the screw 32 to move back and forth along the longitudinal axis 25. In addition to that longitudinal motion, bending modes of the vibration element 26 will be excited which are transverse to the longitudinal axis 25. For the illustrated embodiment, a first preferred bending mode occurs in the direction indicated by arrow 38, which is perpendicular to the longitudinal axis 25 in the plane of the paper on which the illustration is placed in FIG. 1. A second, preferred lateral bending mode occurs along an axis orthogonal to the paper on which the illustration is placed in FIG. 1, and is denoted by axis 40. In practice, the vibration modes are often combinations of various modes involving motion along and rotation about multiple axes.

Advantageously, the components of the invention are configured so that the various modes are excited at or very close to their respective resonance frequencies in order to increase the amplitude of motion along the longitudinal axis 25 and preferably only one of the lateral axes 38, 40. As discussed later, the lateral bending can be excited either by asymmetrical placement of the piezoelectric 22 relative to the resonator 24, or by an asymmetrically placed mass on the vibration element 26, or by a mounting of the piezoelectric element 22, or by shaping the resonator 24 to resonate with a desired lateral motion, or by other mechanisms, some of which are discussed later.

In the embodiment depicted in FIGS. 1–2, the motion along lateral axis 38 is preferably substantially greater than the motion along lateral axis 40. Substantially greater refers to a difference by a factor of at least 3, and preferably a factor of 10.

A driven element 42 is placed in contact with a selected contact portion 44 of the vibration element 26. As illustrated in FIGS. 1–2, the selected contact portion 44 comprises an edge of the vibrating element, although other locations could be used. As used herein, unless otherwise indicated, the term "edge" should be construed to include a corner where multiple surfaces converge, as for example, in the corner of a rectangular cross-sectional rod where three planar surfaces converge (and where three edges converge). Moreover, other shapes of contacting surfaces could be used other than an edge. For example, a beveled surface inclined at an angle selected to place contacting surface 44 into flat engagement with the engaging surface of driven element 42 could be used. Given the present disclosure, many configurations can be derived to ensure that the engaging surface 44 provides the needed engagement to move the driven element 42.

As illustrated, the driven element 42 comprises a rod with a cylindrical cross-section, although other shapes of driven elements can be used. The center line 25 of the vibration element 26 and a centerline 45 of rod 42 are in the same plane, and separated by an angle α of about 30 degrees as measured in that plane. The orientations of the centerlines 25, 45 and the angle α will vary with the particular application. The angle α is difficult to analytically determine, and is preferably adjusted according to the motor design. Typically it is between 10 and 80 degrees, and preferably between 20 and 60 degrees. The driven element 42 is supported so it can move along the longitudinal axis 45 of the driven element 42. The driven member is supported so that it can move relative to the vibration element 26, which is effectively held stationary in the illustrated embodiment. The driven element 42 translates along the axis 45, as explained in greater detail below.

Figure 74:
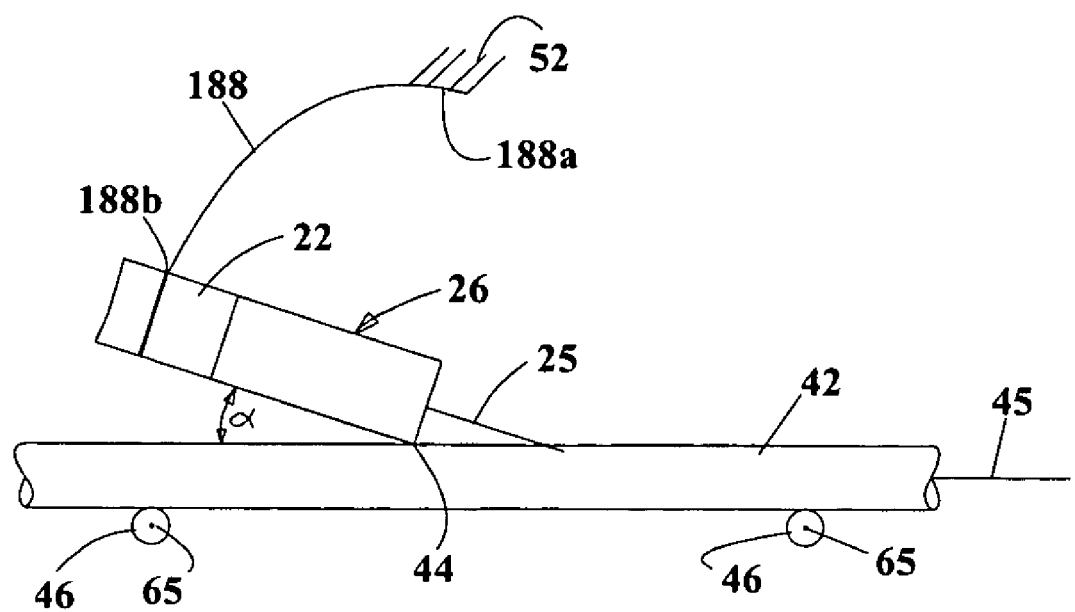
FIG. 74 shows a schematic view of a vibrating element with a curved spring suspension system.

As illustrated, the support of the driven element 42 can be achieved by wheels 46, which provide a low resistance to motion along the axis 45. This support is achieved here by placing an inclined surface on the wheels 46, which abut the curved sides of rod-like driven element 42 and rotate as the rod translates along axis 45. The wheels are located on the side of the driven element 42 opposite the selected contact portion 44, with the contact portion 44 also being further located between two wheels 46 in a direction along the axis 45, so that the wheels 46 and selected contact portion 44 restrain motion of the driven element 42 in all directions except along axis 45. The wheel 46 could also contact the driven element 42 using a flat edge of the wheel concentric with the rotational axis 65, as illustrated in FIG. 74. The wheels 46 could also have contoured peripheries configured to engage mating shapes on adjacent portions of the driven element 42 in order to appropriately support and guide the driven element 42. Given the present disclosure, a variety of movable support configurations will be apparent to those skilled in the art.

The vibration element 26 is advantageously resiliently urged against the driven element 42, and FIGS. 1–2 show one of many ways to achieve this. The elliptical motion 100 of the selected contacting portion 44 is preferably an unrestrained motion, one that occurs whether or not the contacting portion 44 engages a driven element, and one that is achieved without relying on any resistance from being urged against the driven element 42. Nevertheless, the selected contacting portion 44 is advantageously resiliently urged against the driven element 42 in order to enhance the driving engagement of the driving and driven parts.

A spring 50 made of flat, elongated spring material is bent into an "L" shape with opposing ends 50a, 50b. A first end 50a of the spring is fastened to a base 52. A second end 50b of the spring is fastened to the end of the vibration element 26 through which the screw 32 extends, with a hole in the end 50b of spring 50 allowing passage of the screw. A first leg of the spring 50 which contains end 50a is generally parallel to the longitudinal axis of vibration element 26, and the second leg of the spring 50 that contains the end 50b is generally parallel to the axis 38, with the two legs being generally perpendicular to each other. The spring 50 resiliently urges the vibration element 26 against the driven element 42 at the selected contact portion 44. Variations in the location of the mounting at end 50a, 50b can be used to vary the pre-load with which the vibration element 26 is urged against the driven element 42. As discussed later, variations in the shape, cross-section, location, and form of the resilient element 50 are possible and can be used to achieve a desired vibration mode.

The spring 50 is designed to optimize the vibration characteristics of vibration element 26 as well as provide a sufficient range of flexibility to insure contact between the driven element 42 and vibration element 26. This contact and a defined range of contact pressure should be maintained throughout the life of the motor assembly 20. The spring 50 advantageously compensates for manufacturing tolerances and uncertainties and also can compensate for wear that might reduce the size of the vibration element 26 at the selected contact portion 44.

As discussed further below, during operation the vibration element 26 might touch the driven element 42 only part of the time due to the vibration and in such a case the spring 50 preferably is designed to ensure suitable engagement. The spring constant and the location of the spring can be used to adjust the percentage of contact and non-contact time. This allows a designer the ability to configure the motor assembly 20 to ensure the resulting engagement between engaging portion 44 and driven element 42 is with sufficient force to move the driven element 42 with sufficient force to achieve the desired objectives of motor assembly 20. Moreover, variations in the dimensions affecting the engagement of the selected engaging portion 44 and the driven element 42 will be accommodated by the mounting system, such as spring 50, that resiliently urges the contacting parts into engagement. This flexibility in manufacturing tolerances allows a reduction in manufacturing costs and in alignment tolerances and costs.

In the depicted embodiment the wheels 46 are both rotatably mounted to axles connected to the base 52. Other schemes of mounting the driven element 42 are possible given the present disclosure. For example, the base 52 could support one or more projections having aligned holes into which linear bearings are preferably placed, with the elongated driven member 42 extending through the holes. This configuration would allow an elongated driven member 42 to translate along an axis, but would restrain other motions. The motor can be as small as $25 \times 25 \times 5$ mm$^3$ or even smaller.

Operation:

Referring primarily to FIGS. 1–2, when an electrical signal of suitable frequency, waveform and voltage is applied to the piezoelectric element 22 the vibration element 26 starts to move the rod 42. For the embodiment shown, preferred waveforms are sine waves or rectangularly shaped waves. The direction of the linear motion generated is determined by the frequency. A motor assembly 20 operating, for example, at about 35 kHz in one direction and at about 60 kHz in the other direction is believed to be suitable for a variety of potential uses. Other frequency pairings are possible and will vary with a variety of factors concerning the design of motor assembly 20. The operating frequencies can be changed by changing the design of the various components, with the operating frequencies being selected to be inaudible by humans and by most pets in some preferred embodiments. The operating voltage will vary with the type of piezoelectric 22 or other vibration source used. A multi-layered piezoelectric 22 operating at 6 volts peak-to-peak amplitude is believed useful for a variety of applications.

The vibration of the piezoelectric element 22 makes the vibration element 26 vibrate in a way so that the selected contact portion 44 performs an elliptic motion relative to the driven element 42. As discussed below, the vibration of the piezoelectric 22 excited at a first frequency makes the vibration element 26 vibrate in a way so that the selected contact portion 44 performs a first elliptic motion 100a relative to the driven element 42. The elliptical motion is achieved by having the first signal excite two resonant modes of the resonator 24, resulting in the desired elliptical motion 100a—preferably without requiring engagement with the driven element 42 to achieve this elliptical motion. That first elliptical motion 100a moves the driven element 42 to the right as depicted in FIG. 1.

Moreover, vibration of the piezoelectric 22 excited at a second frequency makes the vibration element 26 vibrate in a way so that the selected contact portion 44 performs a second elliptic motion 100b relative to the driven element 42 in a different direction and orientation than that of elliptical motion 100a, and preferably, but optionally, in a direction opposite that of elliptical motion 100a. As depicted, the second elliptical motion is clockwise and that will move the driven element 42 in an opposite direction, to the left as depicted in FIG. 1. Typically, the elliptical motions 100a, 100b do not overlap, but have different major and minor axes, amplitudes and orientations. Ideally, the elliptical motions 100a, 100b overlap. The elliptical motions 100a, 100b are preferably achieved without requiring that the selected contact portion 44 engage the driven element 42.

This results in the selected contacting portion 44 moving the driven element 42 in a first direction when the source of vibration is driven by the first signal, and moving the driven element in a second direction when the source of vibration is driven by the second signal. But advantageously the selected contacting portion further moves in the first direction when a single sinusoidal signal of a first frequency is applied. Moreover, the selected contacting portion 44 can also move in the first direction when the first frequency is dominant and superimposed with plural sinusoidal signals of different frequencies. In this later instance, the second signal either does not occur simultaneously with the first signal or it is of substantially different amplitude if it occurs simultaneously with the first signal. By different in signal amplitudes a factor of about 10 is considered substantially different, and preferably the amplitudes differ by a factor of 100 or more. The result is that the elliptical motion 100 can be achieved by a simple sinusoidal signal. Alternatively, it can be achieved by complex signals of different frequencies—for example, the complex frequencies that are superimposed to generate sawtooth waves.

During driving engagement of the selected contacting portion 44 with the driven element 42, it is believed that the elliptical motion 100 consists of a phase where the vibration element 26 is pressed against the driven element 42 and a phase where this is not the case. The motion component of the vibration element that has the direction along the longitudinal axis 45 of the driven element is partly transferred to the driven element by the friction between the vibration element 26 and the driven element 42. In the second phase the vibration element 26 moves in the opposite direction. In this second phase the vibration element does not transfer any motion component parallel to the axis 45 because the vibration element 26 is not pressed against the driven element.

In contrast to other vibrating motor designs, the required manufacturing tolerances are believed to be significantly looser so that no precise manufacturing is needed to alternate between the contact and no contact situations. The necessary equilibrium is created by the design, specifically including spring and the mass of the vibration element 26.

Because the high frequencies (over 30 kHz) and small motions make it difficult to actually determine the contact, it is also believed possible that there is always contact between the vibration element 26 and the driven element 42. In that situation, the motion of the driven element 42 is believed to be caused by the difference in force at the selected contact portion 44 caused by the elliptical motion of the contact portion 44 which provides a resultant force in only one direction, or primarily in only one direction, thus driving the driven element 42 in that direction. Further discussions of this elliptical motion and a number of design aspects are discussed below.

Whatever the actual mechanism, the driven element performs a linear motion with the direction of the motion being determined by the motion of the selected contact portion 44 of the vibration element 26. If the contact portion does a counterclockwise elliptical motion, the driven element 42 will move to the right as depicted in FIG. 1. If the motion is clockwise, it will move in opposite direction.

It is possible that the vibration element 26 will also be excited to move along axis 40, which could result in rotation of the cylindrical rod-like driven element 42. Depending on the relative magnitudes of the motion of the selected contact portion 44 and depending on its orientation and contact with the driven element 42, and if the bearing supports are properly configured, both translation and rotation could simultaneously occur.

Further, referring to FIG. 2, it is believed possible to select the axis with the largest motion to be longitudinal axis 25, but to select the lateral axis 40 as having the next largest and only other significant motion. In that instance the motor assembly 20 would cause a rotation of the rod-like driven element 42 about longitudinal axis 45. To provide this rotational motion, the selected contact portion 44 would have to provide an elliptic motion having a substantial portion of its motion in a plane generally orthogonal to the axis 45 of the driven element 42 in order to impart rotational motion to the driven element. The direction of rotation would again depend on the direction in which the selected contact portion 44 performs the shape of the ellipse.

Moreover, it is believed possible to select the axes with the largest two motions, and only significant motions, to be the lateral axes 38, 40, which could again result in an elliptical motion of the selected contact portion 44 in a manner that engages the driven element 42 to rotate it about longitudinal axis 45 during one portion of movement and to disengage sufficiently to prevent motion or noticeable detrimental motion in the other portion of movement of the selected contact portion 44.

Figure 4:
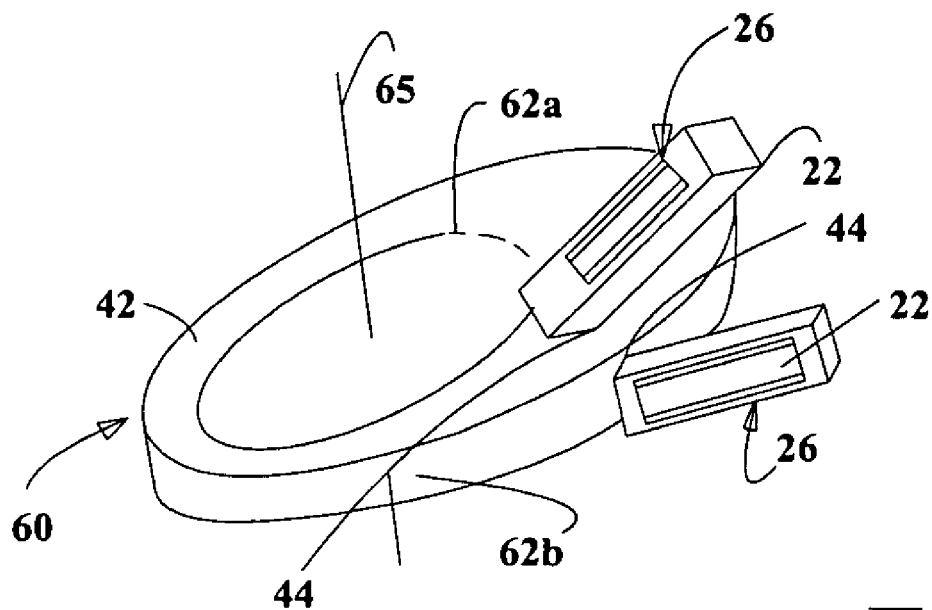
FIG. 4 shows a perspective view of a second embodiment of this invention.

An alternative embodiment is shown in FIG. 4, where instead of an elongated driven element 42 a rotatable wheel 60 is mounted to be driven by the vibratory element 26 having a portion placed in contact with an appropriately located driven surface 62 on the wheel 60. In this embodiment the wheel 60 is mounted to rotate about rotational axis 65 on a bearing. The driven surface 62 is preferably placed on a side 64 of the wheel located in a plane orthogonal to the rotational axis 65 as with driven surface 62a, or placed along a surface concentric 62b with the axis 65. The wheel 60 could comprise a variety of elements, including a gear. The selected contact portion 44 of the vibratory element 26 engages the driven surface 62 to cause movement of the wheel 60 about the rotational axis. The wheel 60 will rotate in the opposite direction of the motion of the contact point around the elliptical path traveled by the contact portion 44. Thus, if the contacting portion 44 of the vibration element 26 moves clockwise the wheel 60 will move counterclockwise, so that the contact portion on the wheel and on the vibration element share the same motion while they are in contact.

Figure 5:
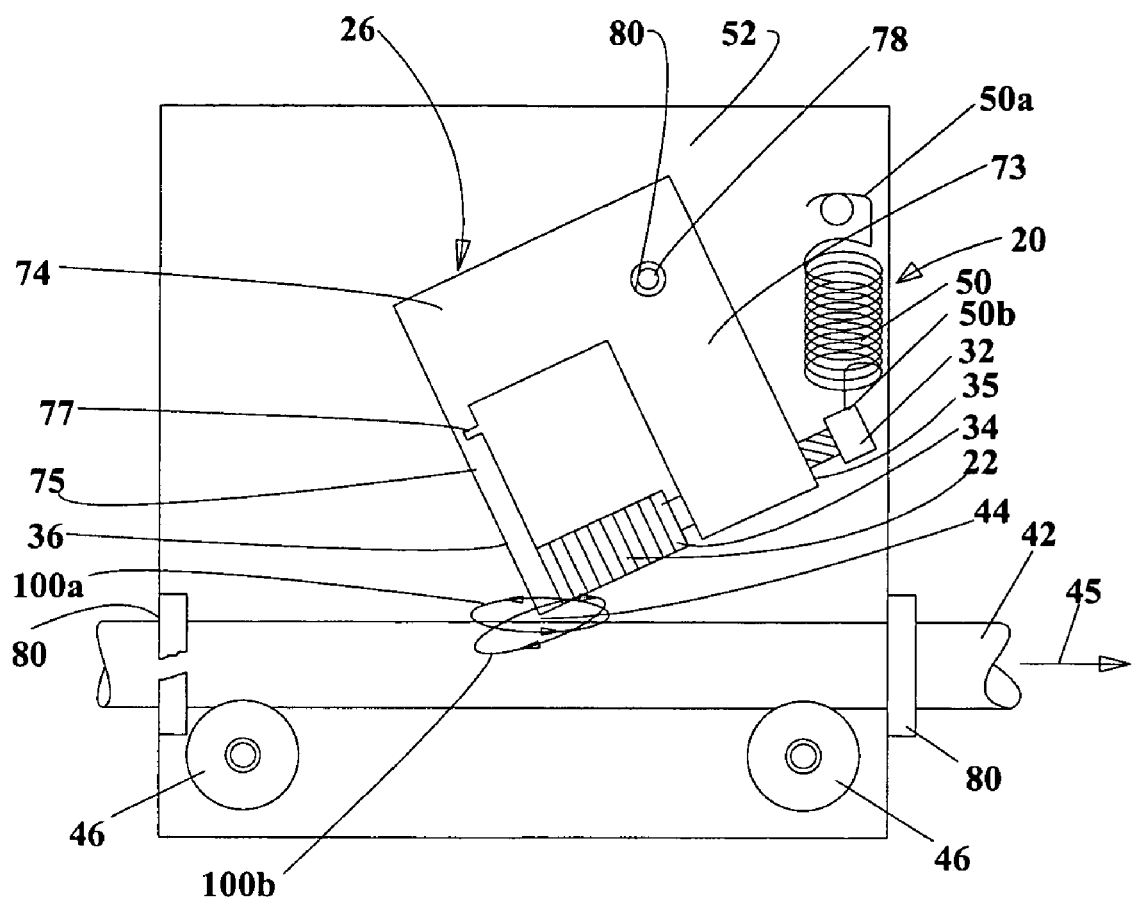
FIG. 5 shows a side view of a third embodiment of this invention using a C-clamp configuration.

FIG. 5 shows a further embodiment. The motor assembly 20 has a vibration element 26 that contains a resonator 24 in the shape of a C-clamp 74. The piezoelectric element 22 is held in the clamp. To transmit the motions, a first electrical signal causes the piezoelectric element 22 to move in the vibration element 26 which causes the contacting portion 44 to move in a first an elliptical motion 100a.

The piezoelectric element 22 is clamped by the screw 32 which extends through leg 73 and presses against insert plate 34 to compress the piezoelectric element 22 between the plate 34 and an opposing leg 75 of the C-clamp resonator 74. This clamping causes pre-load in the piezoelectric element 22, which increases and preferably optimizes the lifetime and performance of the piezoelectric element 22.

The legs 73, 75 of the C-clamp between which the piezoelectric element 22 is held, could be of similar stiffness, but are advantageously of different stiffness. Advantageously one leg 73 is at least a factor of 10 times stiffer than the opposing leg 73. The more flexible leg 75 vibrates with larger amplitude than the stiffer leg 73. The selected contacting portion 44 is preferably located on the less stiff leg 73 in order to achieve a larger amplitude of motion at the selected contacting portion 44. Moreover, in this configuration the leg 73 is placed in bending stress, with the largest stress being adjacent the interior end of the leg. A notch 77 can be placed adjacent to that location in order to localize the bending so that the leg 75 pivots about the notch 77.

A spring element 50 has a first end 50a connected to the base 52 and a second end 52b connected to a vibration element 26 to keep the vibration element in contact with the driven element 42. The second end 50b is shown as connected to the head of the screw 32 although other connections to the resonator 74 could be used. In this embodiment the spring 50 is depicted as a tension coil spring. The resonator 74 is loosely pinned by pin 78 extending through hole 80 and into the base 52 so the resonator 74 can pivot about pin 78. The pin 78 is offset from the line of action of spring 50 so that the contacting portion 44 is resiliently urged against driven element 42.

The spring 50 is under tension in the depicted configuration. The spring 50 provides a sufficient range of flexibility to ensure contact between the driven element 42 and the vibration element 74. This contact and a defined range of contact pressures are advantageously maintained throughout the life of the motor assembly 20. The spring 50 advantageously is designed to compensate for manufacturing uncertainties and wear that might reduce the size of the vibration element 26 at the selected contact portion 44.

To prevent the driven element 42 from separating from the vibration element 26, wheels 46 connected to the base 52 are provided as previously discussed. Alternatively, the base 52 can be equipped with sidewalls 80 having holes through which the driven element 42 extends in order to support the driven element while allowing it to move along its desired translational axis. Advantageously, the holes in the sidewalls 80 are designed to reduce friction, and thus could have linear bearings supporting the driven element 42. If the holes in the sidewalls 80 are enlarged so that they do not permanently contact the driven element 42, they function as auxiliary bearings instead and protect the driven element 42 from being forcefully pushed into the vibration element 26 by external forces, which could be damaging to the vibration element 26 as well as its suspension.

When an electrical signal of suitable frequency, waveform and voltage is applied to the piezoelectric element 22 the vibration element 46 starts to move the driven element 42. The direction of the linear motion generated is determined by the frequency. Changing the configuration of various components of the motor assembly 20, as discussed further below, can change the operating frequencies. In the depicted example, a multi-layered piezoelectric element is used that could operate the motor assembly 20 on 6V peak-to-peak amplitude to drive a cylindrical rod 44.

The vibration of the piezoelectric 22 at a first frequency makes the vibration element 26 vibrate in a way so that the selected contact portion 44 performs a first elliptic motion relative to the driven element 42. The elliptical motion consists of a phase where the vibration element 26 is pressed against the driven element 42 and a phase where this is not the case, as discussed in further detail below. If the selected contact portion 44 moves in a counterclockwise elliptical path 100a as depicted, the driven element 42 will move to the right as depicted in FIG. 5.

Advantageously, the vibration of the piezoelectric 22 excited at a second frequency makes the vibration element 26 vibrate in a way so that the selected contact portion 44 performs a second elliptic motion 100b relative to the driven element 42 in a direction opposite that of elliptical motion 100a. As depicted, the second elliptical motion is clockwise and that will move the driven element 42 in an opposite direction, to the left as depicted in FIG. 5. Typically, the elliptical motion 100a, 100b do not overlap, but have different major and minor axes, amplitudes and orientations. Ideally, the elliptical motions 100a, 100b overlap. The vibrating element 26 could be configured to cause the second elliptical motion 100b to be in a different orientation, as for example, to rotate a driven element 42.

In more detail, vibration of the piezoelectric element 22 causes the vibration element 26 to begin oscillating about the pin 78, which causes the contact portion 44 to have an up-and-down motion and a back-and forth motion along its elliptical path 100. The up-down motion and the back-forth motion are out of phase, and the contact portion 44 thus has an elliptical motion along one of paths 100a, 100b. That causes the rod-like driven element 42 to begin motion. The rotation of the vibration element 26 can be caused by interaction of the contacting portion 44 with the driven element 42, which may be viewed as conserving angular momentum about the pin.

The vibratory motor 26 of FIG. 5 could be used with a rotating driven element 42 as depicted in FIG. 4, and could be used in other driving arrangements.

Figure 6:
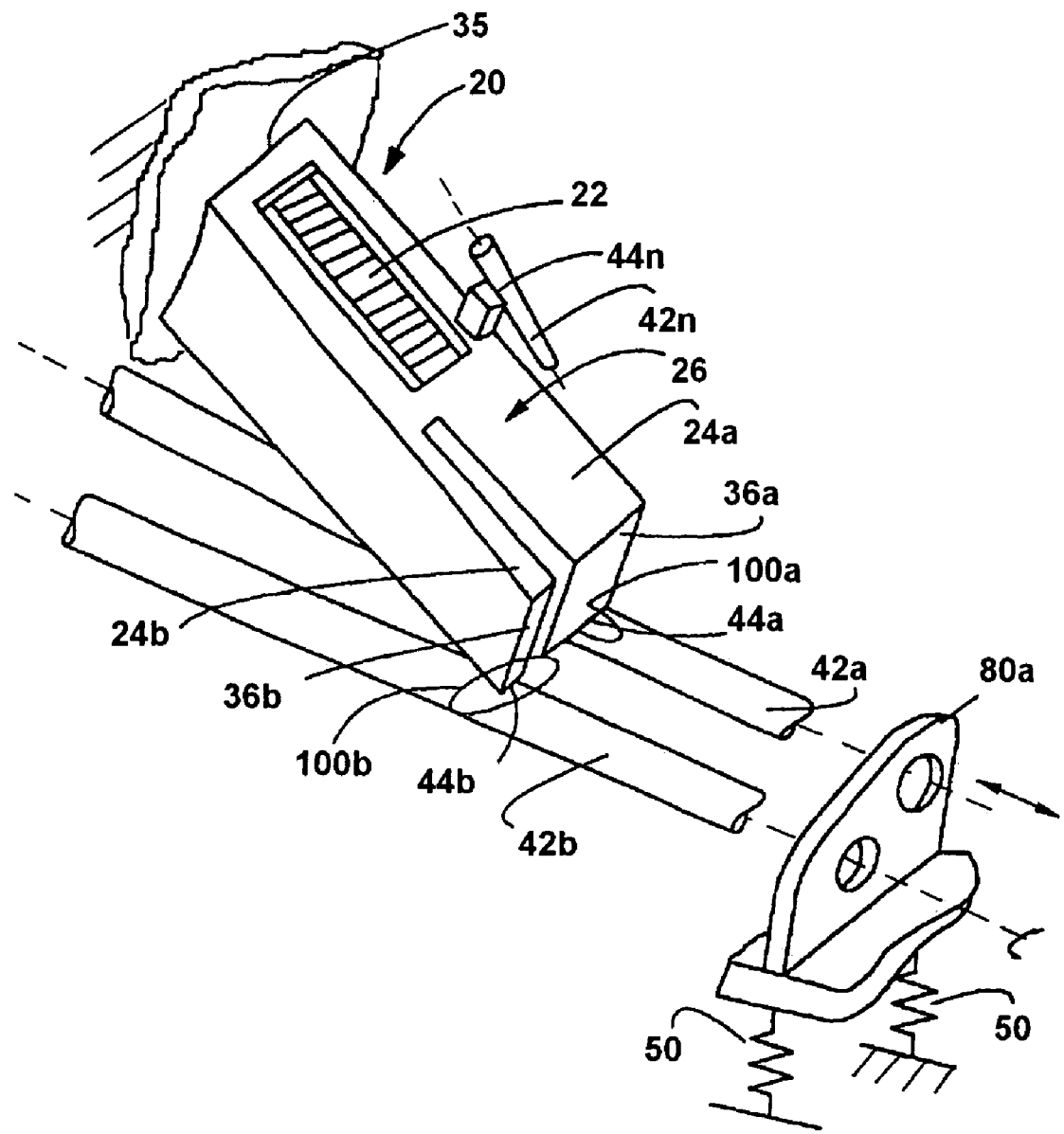
FIG. 6 shows a perspective view of a fourth embodiment of this invention driving multiple elements.

FIG. 6 shows a further embodiment in which the vibrating element 26 is mounted in a stationary manner, and the driven element 42 is resiliently urged against the vibrating element. If the driven element 42 is elongated, and especially if it comprises a rod or other structure that is flexible, merely pressing the driven element against the vibrating motor 26 may cause the parts to resiliently urged into contact. That requires the support of the driven element 42 to be such that a resilient support is inherently provided by the flexibility of the driven element. If that is not the case, a resilient support must be provided for the driven element 42, or a resilient support can be provided in addition to the flexibility of the driven element. Such a resilient support is illustrated schematically by springs 50a, 50b, resiliently urged against the selected contacting portion 44a, 44b of the vibrating element 26.

In this embodiment, the vibration element 26 is configured with a special shape so that there are more than one, and preferably a number of selected contacting portions 44a, 44b, . . . 44n. The ability to use different portions of the vibrating element 26 to generate a desired elliptical motion 100 resulting from free vibration modes excited at a specified frequency, offers the ability to have a variety of arrangements. For each of several separate excitation frequencies, a different selected contacting portion 44 can resonate in a predetermined elliptical motion 100. Alternatively, the same selected contacting portion 44 may resonate at a different excitation frequency to cause an elliptical motion but in a different orientation. Preferably the elliptical motion is in opposite direction to reverse the motion of the driven element, but other motions are possible depending on the needs of the user. As a result, several driven elements 42a through 42n that are resiliently urged against separate and corresponding selected contacting portions 44a through 42n, can be individually controlled.

For example, it is believed possible to have one driven element 42a translate, and another driven element 42b rotate, by generating appropriately orientated elliptical paths 100a, 100b respectively, at selected contacting portions 44a, 44b, respectively. The generation of the elliptical paths 100a, 100b is preferably caused by a single excitation frequency to piezoelectric element 22, which causes a sufficiently resonant vibration to generate the elliptical paths. Alternatively, a first excitation frequency could be required to generate depicted motion 100a, and a second excitation frequency used to generate motion 100b. Yet other excitation frequencies provided by the piezoelectric 22 could be used to change the direction of the elliptical motion to travel in an opposing direction.

Moreover, while the contacting portions 44a, 44b are shown at the distal ends 36 of the vibrating element 26, the contacting portions 44 could be at various locations and orientations on the vibrating element 26. This is shown illustratively by engaging portion 44n and driven element 42n, with the driven element 42n rotating (e.g., to drive a gear) or translating along its longitudinal axis.

Figure 62:
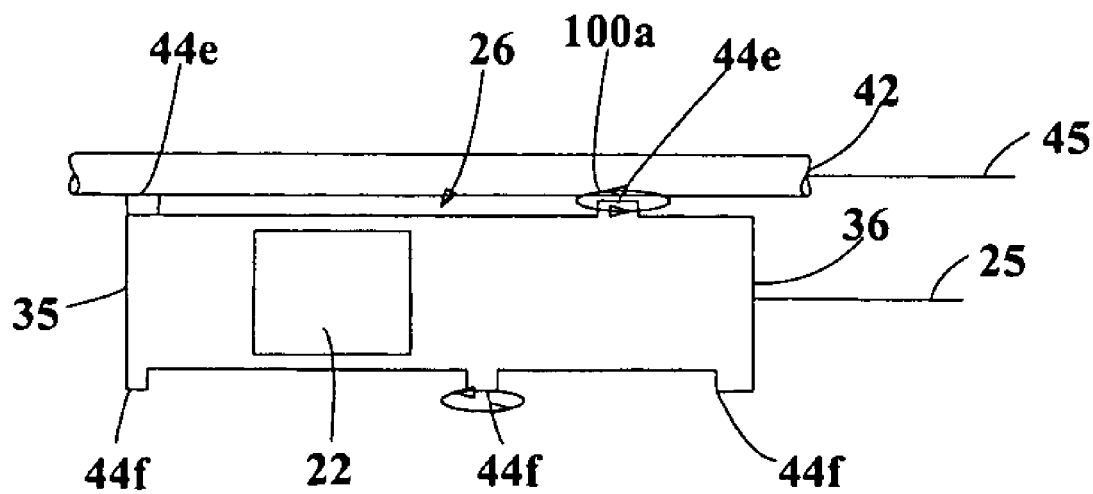
FIG. 62 is a side view of a vibratory element having several selected contacting portions to engage a driven element.

These aspects are further illustrated by the embodiment of FIG. 62, which shows that the selected contacting portion 44 need not occur at the distal end 36 of the vibratory element 26. In FIG. 62 the vibratory element 26 has one or more selected contacting portions 44e located along the periphery of the element along the longitudinal length of the element. A second one or more selected contacting portions 44f are located on an opposing surface of the vibratory element. Preferably the selected contacting portions 44 comprise slightly raised areas extending above the surrounding portion of the vibratory element 26. A driven element 42 such as a cylindrical shaft is placed in contact with the contacting portions 44e. In the depicted embodiment, the axes 25, 45 of the vibratory element 26 and driven element 42 are aligned and coplanar, but that need not be the case.

When the vibratory element 26 is excited at a first frequency, the contacting portions vibrate in an elliptical path 100a causing motion of the driven element 42 in a first direction. The contacting portion 44e moves in an elliptical path opposite to that of contacting portion 44f. To shift the motion of the driven element 42, the contacting portion 44f and driven element 42 are placed into contact. This can be achieved by moving one or both of the vibrating element 26 and driven element 42. A rotation of the vibratory element 26 would suffice in the illustrated embodiment. Thus, a single excitation frequency could result in opposing directions of movement of the driven element 42. This embodiment also shows that the contact between the vibration element 26 and the driven element 42 can be a multiple point contact. It is not limited to a single point contact. This also allows, for example, the use of only one bearing pressing a driven rod 42 at two to four points against the vibration element 26. The increased number of contacting portions 44 can increase the frictional engagement with the driven element 42 and allow a greater power to be exerted on the driven element 42, and thus allow a greater power to be exerted by the driven element 42.

Alternatively, more than one driven element 42 could be placed in contact with differing portions 44 of the vibratory element 26, achieving different motions for each driven object. Moreover, the vibratory element 26 could be urged against a stationary surface and by selecting various contacting portions 44 (e.g., 44e, or 44f), move the vibratory element and any object connected to the vibratory element in various directions over the surface.

Preloaded Motor Configurations

It is advantageous in many cases to use multilayer piezoelectric elements 22. These elements 22 are preferably of rectangular cross-sectional shape, but other shapes could be use such as square, circular, or other shapes. The piezoelectric elements 22 have layers of piezoelectric material with printed electrodes that are stacked on top of each other. Often many piezoelectric components are made at the same time by producing a large stacked plate that is pressed and cut to form many single piezoelectric elements.

As a result of this manufacturing method, the mechanical output areas of the piezoelectric are typically parallel to the electrode layers and are also flat. In order to use multilayer piezoelectric elements, a mechanical preload is often applied. This increases the lifetime of the piezoelectric by preventing delamination under dynamic movement of the piezoelectric element, and it also optimizes the contact between the piezoelectric element 22 and the resonator 24 in which it is mounted. As a result, mechanical motion generated by the piezoelectric element 22 is efficiently transferred through the contact zone to the resonator.

There are different methods to generate the preload. A resonator 24 can be used that has two parts. A spring is used to generate the preload by inserting a piezoelectric element 22 and the compressed spring between the two parts of the resonator which are then welded or otherwise fastened together. This way, a permanent preload is generated.

An alternative way to generate the preload is shown in FIG. 1, where the preload is preferably achieved by having the resonator 24 exert a pressure on the piezoelectric element 22. The compression ensures that the vibrations of the piezoelectric element 22 are transferred to the resonator 26 and selected contacting portion 44. The compression also avoids at least some damage to the piezoelectric element 22 when high voltages are applied. The pressure is equal to the axial force on the piezoelectric element 22 divided by the area over which the force acts. This area is the contact area between the piezoelectric element 22 and the abutting portions of the resonator 26. Because the contact area can be difficult to measure, it is more straightforward to use the force rather than the pressure as a characterizing parameter.

The force exerted on the piezoelectric element 22 when no current is passed through the piezoelectric element 22 includes: a static pre-load equal to the axial force in the sidewalls 29 counteracting the preload and a load component from the contact force arising from the contact surface 44 being urged against the driven object 42. All of these forces fluctuate when a fluctuating current is passed through the piezoelectric element 22.

The piezoelectric element 22 can be aligned so that the preload on the piezoelectric element 22 is in the most active direction of the piezoelectric element 22. While this is not necessary for the vibratory motor 26 to operate, this configuration results in the highest efficiency. Preferably, for the beam-type vibratory element 26 depicted in FIG. 1, the greatest motion occurs in the line 3—3 direction that is preferably aligned with the longitudinal axis 25.

Methods of producing a preload on the piezoelectric element 22 that are described herein include: (1) clamping the piezoelectric element 22 in the resonator 24 with a threaded fastener or other compressive mechanism; (2) using force to press the piezoelectric element 22 into a hole in the motor body in a manner similar to press fitting of shafts; and (3) combinations thereof. Other preload mechanisms can be used. The following disclosure expands on the threaded fasteners described thus far, and then discusses some press-fit mechanisms and methods. A wedge-based method and some variations on the above methods conclude the discussion.

Threaded Preload Device & Method: FIGS. 1 and 5 illustrate a threaded fastener preload method and apparatus that is further described below. The resonator element 26 is configured so that a hole, cavity or opening 28 is formed to accommodate the piezoelectric element 22. The resonator can have various shapes, for example cross-sections that are round, square, rectangular, or polyhedral. The opening 28 is larger than the piezoelectric element 22 in all dimensions. A threaded fastener 32 extends through a hole in a stationary object in order to allow the distal end of the fastener 32 to press the piezoelectric element 22 against the resonator 24. The threaded fastener 32 advantageously passes through a threaded hole in the resonator to directly abut the plate 34 that is urged against the piezoelectric element 22.

Once the parts are assembled, a preload can be achieved in the piezoelectric element 22 by tightening the threaded fastener 32. The preload can be approximately calculated by tightening the fastener 32 to a known torque. The threaded fastener 32 need not be aligned with the longitudinal axis of the piezoelectric 22, but can be offset in a variety of ways so that tightening the threaded fastener urges two bodies toward each other to compress the piezoelectric element 22. A variety of other mechanisms can be used to place the piezoelectric element 22 in compression. Other preloading mechanisms are discussed later.

Uni-Axially-Stressed, Press-Fit Preload Device & Method: Several aspects of the press-fit of the piezoelectric element 22 are described with respect to FIG. 7a. The resonator 24 is configured so that a hole or opening 28 for the piezoelectric element 22 is formed in the resonator, with sidewalls 29 defining the sides of the opening. The opening 28 is slightly smaller in the axial direction of the piezoelectric element 22 than the combined length of the piezoelectric element 22 and any other elements to be pressed into the opening 28. The required interference between the resonator 24 and the parts to be pressed into the opening 28 depends on the geometry and dimensions of all parts and also the elastic strain of the material from which the resonator 24 is made.

Referring to FIG. 7b, the piezoelectric element 22 can be pressed directly into the resonator 24.

This press-fit can be made easier by providing a tapered surface 82 which places an inclined contact area between the abutting edges of at least one of the piezoelectric element 22 and an end wall of the resonator 24 at the mating portion of opening 28. The inclined surface 82 avoids an offset, abutting-type of interference, and provides a sliding interference at the start of the press-fit. An improved way to achieve this press-fit is described later. This preload mechanism and method produces large shear stresses on the contacting surfaces of the piezoelectric element 22. Because the piezoelectric material is brittle, the stresses can result in cracking of the piezoelectric element 22. To avoid these shear stresses and protect the piezoelectric element 22, it is also possible to simultaneously press in a piezoelectric element 22 sandwiched between two strips of a less brittle material 84 (FIG. 7a) such as a metal, preferably steel. The strips of material 84 can have a variety of shapes suitable to the configuration of the piezoelectric element 22 and the vibrational element 26. The protective cap 84 can also advantageously be used to guide the piezoelectric element 22 into the opening 28, thereby eliminating the need for tapering of any parts. One of the strips of material 84 can advantageously comprise the end 50b of spring 50 that connects the vibrating element 26 to the base 52.

When the piezoelectric element 22 and any end protectors 84 are inserted into the opening 28, the sidewalls 29 are stretched to accommodate the longer length element 22 and any end protectors 84. The stretched sidewalls 29 act as springs and maintain the preload on the piezoelectric element 22. Ideally, the preload on the piezoelectric element 22 could be specified by knowing the cross-sectional dimensions of the sidewalls 29 and fixing an interference that results in an elastic strain in the sidewalls 29 and therefore known stress and preloads in the sidewalls. The preload is then this stress multiplied by the combined cross-sectional area of the sidewalls 29.

Unfortunately, this method may not be practical because the required interference for small vibratory elements 26 of an inch or less in length is likely to be too small, on the order of 0.0001 inches, which is beyond a tolerance currently obtainable by traditional machining processes at a reasonable cost. Larger vibratory elements may have larger preloads that require larger dimensions, but the accuracy needed to achieve those dimensions is likely to require similarly small tolerances and thus also require expensive machining or polishing. This arises in part because small variances in the interference would result in great differences in the preload when the sidewalls 29 are in the elastic portion of the stress-strain curve and act as a spring as the piezoelectric element 22 expands and contracts.

Because of these disadvantages, it is desirable to make the interference between the length of the vibratory element 26 and the opening 28 sufficiently large so that the sidewalls 29 forming the opening 28 are stressed beyond their yield strength but below their ultimate tensile strength, and a sufficient amount below their fatigue strength to provide an acceptable product life. When stressed beyond the yield strength, the sidewalls 29 provide a relatively constant preload even though the dimensions of the opening 28, or the piezoelectric element 22 or the end protectors 84 may vary. This allows looser manufacturing tolerances and results in greatly simplified manufacturing and significantly lower costs.

The plastic portion of the stress-strain curve from yield up to the point where necking of the sidewalls 29 begins, can be used to achieve the desired preload. The usable portion of the strain occurring after yield and before necking is at least ten times larger than the elastic portion in strain. This is believed to apply to all non-ferrous metals, which are the preferred material for the resonator 24, with aluminum being the most preferred non-ferrous metal. Ferrous metals and some non-metallic materials could also be used in other embodiments.

This method significantly loosens the required tolerance on the interference fit between the vibratory element 26 and the opening 28. Further, the slope of the stress-strain curve above yield is much less than that of the elastic portion. Thus, the preload will also not depend so greatly on the amount of interference. Using this method and design, the preload can be estimated as the yield strength multiplied by the combined cross-sectional area of the sidewalls 29 for the depicted configuration. Other configurations will require other calculations, but such calculations are known to one skilled in the art and are thus not described in detail herein.

The press-fit method has several advantages over using threaded fasteners to preload the piezoelectric element 22. The performance of press-fit piezoelectric elements 22 is more repeatable because the preload and contact area are better defined. Furthermore, the preload of a press-fit piezoelectric elements 22 can be easily calculated and does not depend heavily on manufacturing tolerances. The press-fit method also reduces the number of total motor parts, because it does not require the spring 50 to be clamped separately to the vibrating element 50 as the end 50b can be used to press-fit the piezoelectric elements 22 into the opening 28. In addition, assembly of the vibratory element 26 is made easier by eliminating the need for a threaded fastener 32 and uncertainties in its tightening and loosening during vibration. Eliminating the threaded fastener 32 also eliminates the need for a tapped hole and thus reduces manufacturing costs.

The vibratory element 26 shown in FIG. 1 has two straight sidewalls 29 on opposing sides of the opening 28. The sidewalls could comprise different configurations, such as beams at each corner. But in these configurations the sidewalls 29 are straight and generally parallel to the longitudinal axis of the piezoelectric element 22. That results in sidewalls that remain primarily in uni-axial tension during preloading and operation of the piezoelectric element 22.

Curved-Beam Configurations for Press-Fit Preloads: Alternative configurations having sidewalls that curve away from the piezoelectric element and from each other can provide a number of advantages. The press-fit operation for these two general types of vibratory elements 26 does not differ. But the resulting advantages of the basic configuration can differ significantly, as discussed below. The source of the problem and some partial solutions are discussed first, and then the advantages of curved sidewalls 29 are discussed relative to FIG. 8.

Referring to FIG. 7, the preload on the piezoelectric element 22 is estimated as the yield strength of the material multiplied by the combined cross-sectional area of the sidewalls 29, because the sidewalls are stressed in uniaxial tension. This means that the entire cross-section of a sidewall 29 experiences the same stress. If the sidewalls 29 have the same cross-sectional area and the piezoelectric element 22 is pressed so its longitudinal axis coincides with the longitudinal axis 25 of the vibratory element 26, then the sidewalls 29 also experience the same force and the same stress. If the sidewalls 29 are of constant cross-sectional area, the stress is also constant over the length of the sidewalls measured along the longitudinal axis 25 of the vibratory element.

The piezoelectric element 22 must move the resonator 24 and selected driving portion 44 to achieve a sufficient physical displacement to move the driven element 42. Because the sidewalls 29 act as springs to preload the piezoelectric element 22, a portion of the preload must be overcome in order to extend the vibratory element 26 and move the selected contacting portion. If the stiffness of the sidewalls 29 is too large, too much of the energy of the piezoelectric element 22 may be expended in pushing against the sidewalls 29 and the amount of vibratory energy that is transferred to movement of the selected contacting portion 44 and driven element 42 thus is reduced.

For a small vibratory element 26 of about one inch (2.54 cm) or less in length, the maximum forces on the piezoelectric element 22 and the desire to have the sidewalls 29 in the yield region result in configuring the sidewalls 29 to have a thickness on the order of 0.01 inches (0.25 mm). At such dimensions, or smaller, inaccuracies in manufacturing parts of aluminum can result in significant percentage differences in the thickness of sidewalls 29. This leads to larger stresses in areas with smaller cross-sections and ultimately a concentration of stresses and strains in the smallest cross-sectional area. This concentration of stresses and strains over a short section of the sidewall 29 increases the chance of necking in this region during the press-fit operation.

Necking is undesirable for several reasons. Because all further strain in the sidewalls 29 produced by handling, temperature changes, or operation of the motor assembly 20 will be concentrated in the very short necked region, the large stresses and strains in the necked region can lead to fatigue failure during operation of the motor assembly 20. Moreover, the necking can result in the geometry and therefore the vibrations of the sidewall 29 and vibratory element 26 to change and alter the performance of the motor assembly 20.

Fatigue failure in vibratory elements 24 with sidewalls 29 in predominantly uniaxial tension is a concern even when necking is not present. Because the sidewalls 29 are put into yield, the fatigue mean stress during motor operation is near the yield strength of the material. The amplitude of the stress is very small because the piezoelectric element 22 produces deflections on the order of hundreds of nanometers as it operates at about 30 kHz–90 kHz. The high frequencies result in very large cycles of operation, but at very small amplitudes. Ferrous metals have a stress endurance limit such that these metals, if operated below this limit, do not suffer from fatigue failure. An endurance limit for aluminum and other nonferrous metals has not been observed (at least not below 100 million cycles). There is a concern that small stress amplitudes eventually may lead to fatigue failure in these materials because the motors 20 are operated at frequencies in the range of tens of kilohertz, and at this rate it does not take more than several hours for a motor to accumulate more than a billion stress amplitude cycles, albeit cycles of low amplitude.

Published fatigue data here is not available but fatigue failures in such motors have been observed at more than one billion cycles implying that it is desirable to take steps against fatigue failure. Using a manufacturing process that produces sidewalls 29 with nearly constant cross-sectional dimensions will improve fatigue properties by allowing the entire sidewall 29 to absorb stresses and strains instead of just one small area of the sidewall. Improving the surface finish of the sidewalls 29 also helps by reducing the number of crack initiation sites. Assuring that the sidewalls are equally stressed by giving them the same cross-sectional area and taking care to center the piezoelectric element 22 will also help avoid fatigue failure.

Referring now to FIG. 8, a vibratory element 26p is shown that can be used with any of the motor assemblies 20 described herein. The vibratory element 26p has curved sidewalls 29p, which are put in a more complicated state of stress, when the piezoelectric element 22 is pressed into opening 28p in resonator 26p. The opening 28p has opposing flat portions 31 to abut the ends of the piezoelectric element 22, and is configured to produce curved sidewalls 29p. Thus the opening 28p is generally circular but with two opposing flats located orthogonal to an axis 25p corresponding to the longitudinal axis of the piezoelectric element 22. The remainder of the resonator 24p can have various configurations suitable to the desired motion of and location of the selected contacting portion 44. Here the resonator 24p is shown with a rectangular configuration except for the opening 28p defined by curved sidewalls 29p. The curved sidewalls advantageously have a uniform cross section along the curved length, with the depicted configuration having a rectangular cross-section along the length of the curved sidewalls. The curved sidewalls preferably have a uniform cross section for a substantial portion of the length of the sidewall. As used here, that substantial length advantageously refers to more than half the length of the sidewall 29, and preferably refers to 75% of the length of the sidewall 29, and ideally refers to over 90% of the length of the sidewall 29 between the end walls 31.

For curved sidewalls 29p, the stress state can still be approximated as uniaxial but the stress in the sidewalls is not uniform and is actually a combination of bending and axial stresses. These stresses can be determined using classical beam theory calculations. Alternatively, the deformations of the sidewalls can be approximated by finite element methods or Castigliano's theorem.

In this embodiment, the sidewalls 29 are also advantageously put into plastic deformation during the press-fit of the piezoelectric element 22 and any protective plates 84 in order to make the preload approximately constant regardless of small differences in the amount of the interference fit. But the vibratory element 26p has sidewalls 29p that are not uniformly stressed, and are instead stressed like a curved beam in bending. The curved configuration of the sidewalls 29p always results in the maximum stress being located on the outside and inside surfaces of the sidewalls 29p, at the ends of the curved walls 29p joining the main body of the resonator 24. These stresses basically occur where the curved walls 29p join the remainder of the body of the resonator 24. These stresses occur on the inside of the walls 29p forming the opening 28p, and also on the outside of the walls 29p. The curved walls result in four defined areas of maximum stress 86 on each sidewall 29p, two on the inside of the walls and two on the outside of the walls.

Significantly, this implies that these areas reach plastic deformation first rather than having the entire cross-section of sidewall 29 reach plastic deformation simultaneously when the piezoelectric element 22 is press-fit into the opening 28p. This localized yielding can have advantageous results.

The vibratory element 26p has several advantages over the vibratory element 26 of FIG. 7a. Because the sidewalls 29p are curved, they can be much thicker than straight sidewalls 29 and still achieve the same preload on the piezoelectric element 22. This is better for manufacturing and better for the fatigue lifetime of the vibratory element 26p. Thicker walls increase the fatigue lifetime because small material flaws and manufacturing errors will be proportionally smaller. Such material flaws and manufacturing errors are the most probable locations of crack initiation leading to fatigue failure.

Further, in high cycle fatigue, most of the fatigue lifetime is spent in initiating the crack, and the thicker walls help reduce that crack initiation. Moreover, fatigue cracks start in the wall sections that are under the highest stress. In the walls 29p the locations of maximum stress are known as explained above, and that allows steps to be taken to reduce stress concentrations. For example, in order to reduce the stress concentrations in these high-stress areas it is preferable that the sidewalls 29p have fillets or rounded junctures (a points 86) with adjoining walls, on both the inside and outside of the walls 29p, as shown in FIG. 8. Because the critical stress areas are known and can be either reinforced or have stress-relieving steps applied to them, it is believed unnecessary with the vibratory element 26p to require more than a machined surface finish. The expense and effort of a polished surface is not believed necessary.

Additionally, necking is also not a severe problem with the vibratory elements 26p because of the non-uniform stress distribution across the thickness of the sidewalls 29p. The vibratory element 26p also has an advantage in that the spring constant of the sidewalls 29p, the axial force divided by axial deflection, is lower compared to the sidewalls 26 of FIG. 7a. A lower spring constant allows the piezoelectric element 22 to expend more energy in moving the driven element 42 rather than pushing against the preload spring formed by sidewalls 29, 29p. For these reasons, it is advantageous to use curved sidewalls 29p rather than straight, uni-axial tension sidewalls 29. The sidewalls 29p are preferably of uniform curvature, and symmetric about the portion of the longitudinal centerline 25p extending through the opening 28p. In comparison to straight sidewalls, curved sidewalls also allow the opening 28 to be dilated by a larger amount (elastically or plastically).

Wedging Preload Methods & Designs:

Referring to FIGS. 9–11, a method and apparatus using a wedging effect is described using a resonator of the configuration of FIG. 1. The resonator 24 is thus illustrated as a rectangular body with a rectangular opening 28 both symmetrically aligned along longitudinal axis 25. Other shapes could be used. The opening 24 is slightly larger than the piezoelectric element 22 and any protective cap 84, measured along the longitudinal axis as reflected in FIG. 10. A slight press-fit is also acceptable. A hole 90 is placed through the resonator 24 at one end of the opening 28. The hole 90 is shown here as being placed in the end of the resonator 24 opposite the driving end 44 (FIG. 1) and adjacent the end connected to spring 50 (FIG. 1).

As shown in FIGS. 10–11, a wedge 92 is forced into the hole 90 sufficiently to deform the hole 92 and the adjacent end of the opening 28. As illustrated, the hole and wedge are both cylindrical, and located adjacent an end of the opening 28, so as to cause a bulging along the longitudinal axis into the opening 28 sufficient to compress the piezoelectric element 22 within the opening 28. Basically, the wedge distorts one wall of the opening 28 to place the piezoelectric into compression. The intervening protective plate 34 (FIG. 1) could be used on one or both ends of the piezoelectric element 22, or omitted.

Because the dimensions of the cylindrical hole and wedge can be closely controlled and positioned on the resonator 24, and because the material properties of the parts are known and predictable, a precise deformation of the opening 28 can be achieved. The distortion must be symmetrically achieved if the forces in sidewalls 29 are to be kept equal. But if an offset compression is desired in order to potentially skew the axis along which the force of the piezoelectric element 22 acts relative to the resonator 24, then the hole 90 can be offset from the longitudinal axis 25.

Referring to FIGS. 12, the hole need not be circular, but could comprise a rectangular slot, with the wedge 92 being correspondingly configured to distort the hole 90 as needed to create the appropriate preload. A wedge 92 with a rectangularly shaped cross-section, or with an elliptically shaped cross section, could be used. As the shape of the wedge 92 changes to increase the amount of deformed material, the force needed to insert the wedge 92 into the hole 90 increases.

As discussed later, there are advantages in some situations if the piezoelectric element 22 applies its force along an axis either parallel to but offset from the longitudinal axis 25 of the resonator 24, or at a skew angle relative to that longitudinal axis 25. FIGS. 13–16 illustrate several ways to achieve this offset and skewing of the relative longitudinal axes of piezoelectric element 22 and resonator 24. Another variation is discussed later regarding FIG. 53.

FIG. 13 shows the piezoelectric element 22 offset within the opening 28 so the centerline 95 of the longitudinal axis of the piezoelectric element 22 is laterally offset from the centerline of the axis 25 of resonator 24. The offset can be above, below, or to either side of the centerline 25, depending on the desired motion of the selected contacting portion 44.

FIG. 14 shows a small, hardened insert 94 interposed between one end of the piezoelectric element 22 and the adjacent wall of the opening 28. A hardened steel ball or a small disk could be used, but it must be sized or shaped relative to the abutting portions of the resonator so that no unacceptable deformation of the insert 94 occurs under driving forces applied by the piezoelectric element 22. In this embodiment a protective cap 34 is preferably used in order to avoid localized forces on the more brittle piezoelectric element 22 that might damage the piezoelectric. The location of the insert 94 can be above, below, or to either side of the centerline 25, depending on the desired motion of the selected contacting portion 44. More than one insert can be used.

FIG. 15 shows the opening 28 and piezoelectric element 22 aligned along axis 95 of the piezoelectric element 22, but both located at a skew angle relative to longitudinal axis 25 of the resonator 24. This results in an asymmetrical mounting of the piezoelectric element 25 relative to the centerline of the resonator 24. The amount of skewing of the relative axes of the piezoelectric element 22 and the resonator 24 will depend on the desired motion of the selected contacting portion 44. This configuration has the disadvantage of creating sidewalls 29 having a varying cross-section. But given the present disclosure, it is possible for one skilled in the art to mount the piezoelectric element 22 at a skew angle to the longitudinal axis 25 of the resonator 24 and the vibratory element 26. Placing small inserts 94 on opposing ends of the piezoelectric element 22 (see FIG. 16), and on opposing sides of the longitudinal axis 25, could also achieve a skew axis of the piezoelectric element 22 relative to axis 25. Various combinations of the above, and later described mounting systems can be used.

Mounting Of Vibratory Elements & Driven Elements

Given the present disclosure, a variety of mounting configurations are possible for the vibrating element 26 and resilient mounting system 50. The mounting configuration is often determined by the location of the selected driving portion 44 and the mating engaging portion of the driven element 42, and the required motion of those elements.

Figure 17:
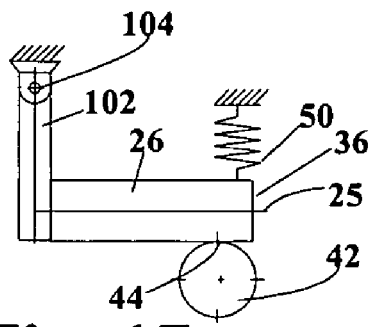
FIGS. 17–19 show suspension configurations for a vibratory element of this invention having a pivoted support for the vibratory element.

Referring to FIG. 17, the vibratory element 26 is mounted to a distal end of a rigid beam 102 that is pivotally mounted at a pivoted end to rotate about pivot point 104. The vibratory element 26 has a selected contacting portion 44 resiliently urged against the driven element 42. The selected contacting portion 44 is shown inward of the distal end 36 of the vibratory element 26 to reiterate that the location of the selected contacting portion 44 can be at various locations on the vibratory element 26. The same applies for the other mounting configurations discussed herein.

As illustrated in FIG. 17, spring 50 resiliently urges the parts to maintain sufficient contact during the desired portion of the motion to move the driven element. The spring 50 may take various forms and be connected in a variety of ways. The driven object 42 can have a variety of shapes, or motions. Useful forms of driven objects 42 comprise one of a rod, a ball or a wheel that is located at a distal end of the vibratory element 26. The driven element 42 needs to be appropriately supported to allow its intended motion, and that support is not shown here as the motion can vary according to design.

Figure 18:
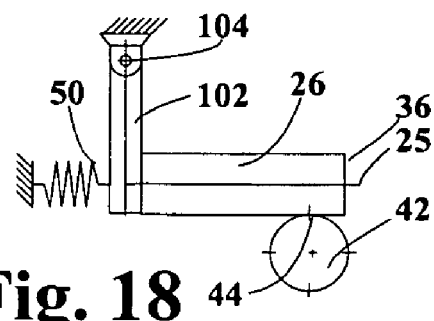

FIG. 18 shows an arrangement similar to FIG. 17, but with the location of the resilient force altered so that it is exerted on the distal end of the pivoted rigid element 102 and pulls the vibratory element 26 into contact with the driven element 42 rather than pushing it into contact. The spring 50 applying the resilient force advantageously applies its urging force along an axis aligned with the longitudinal axis 25 of the vibratory element 26, but that is optional.

Figure 19:
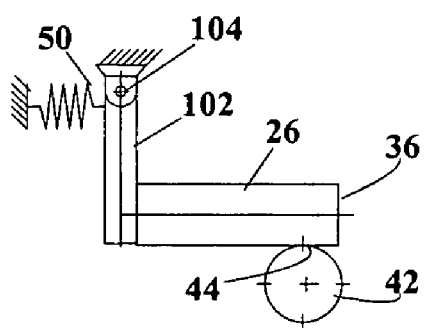

FIG. 19 shows an arrangement similar to FIGS. 17–18, but with the location of the resilient force altered so that it is exerted adjacent to the pivoted end of rigid element 102. The location of the resilient force, such as applied by spring 50, can affect the displacement of the spring. When the spring 50 is located nearer the pivot point 104, the spring 50 does not move much because the effective moment arm between the pivot point and the connection to the spring is less.

If the vibratory element 26 is rigidly mounted, configurations similar to those described herein can be used to resiliently urge the driven element 42 to maintain sufficient contact with the fixedly mounted vibratory element 26 to achieve the desired movement of the driven element.

Figure 20:
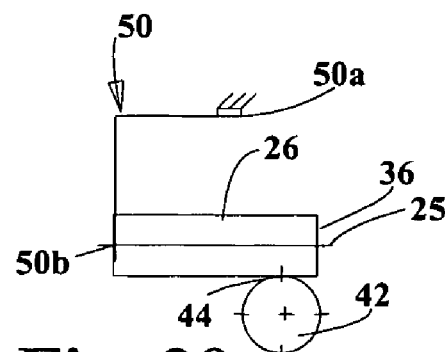
FIGS. 20–21 show suspension configurations for a vibratory element of this invention having a resilient support.

FIG. 20 shows one advantageous mounting configuration that uses a flat strip of spring metal for the spring 50. The spring 50 has a first end 50*a* mounted to a base 52, and an opposing end 50*b* connected to the vibratory element 26. A first leg of the spring 50 containing end 50*a* is parallel to the longitudinal axis 25 of the vibratory element 26, with the second leg of the spring being bent at about a right angle. The distal end of the vibratory element 26 is resiliently urged against the driven element 42. The driven element 42 can in principle have any sufficiently smooth shape, but readily useful forms of driven objects 42 comprise one of a rod, a ball or a wheel that is located at a distal end of the vibratory element 26. The driven element 42 needs to be appropriately supported to allow its intended motion, and that support is not shown here as the motion can vary according to design.

Figure 21:
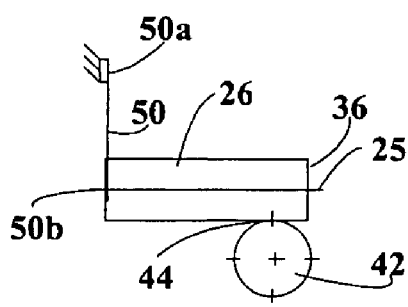

FIG. 21 shows a straight, leaf spring 50*a* having one end rigidly mounted to base 52, with an opposing distal end 50*b* mounted to the vibratory element 26. The distal end of the vibratory element 26 is urged by the spring 50 against the driven element 42. Other shapes of springs 50 are possible.

Figure 22:
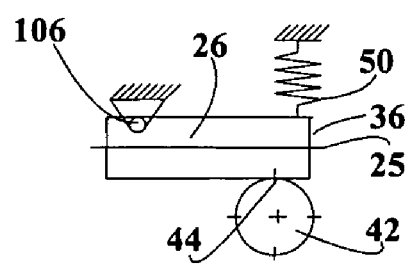
FIG. 22 shows a suspension configuration for a vibratory element of this invention having a pivoted support.

FIG. 22 shows a vibratory element 26 having a first end pivoted about pivot 106 and an opposing distal end resiliently urged by spring 50 against a driven element 42. The selected contacting portion 44 is intermediate the pivot point 106 and the connection of spring 50 along the longitudinal axis 25, and is on an opposing side of the axis 25 as is the spring 50 and pivot 106. But various locations of the selected contacting portion 44 relative along the axis 25 are possible, depending on the desired motion and the configuration of the parts.

There is thus provided a method and apparatus for generating at least two components of motion at the selected contacting portion 44. These two motion components have mutually different directions, with each component oscillating when the piezoelectric element 22 is excited at a predefined frequency, and with the two components having mutually different phases. These two motion components are shaped so as to create an elliptical motion 100 along a desired orientation, by configuring the vibratory element 26, its suspension 50, or both. There is also advantageously provided a method and apparatus by which the same or other contacting portions 44 create suitable ellipses 100 at various excitation frequencies of the piezoelectric element 22, resulting in mutually different macroscopic motions of the driven body 42 engaging one or more of the selected contacting portions(s) 44.

In one embodiment, the vibration element 26 is attached to the base 52 with a spring-like element 50, wherein the spring can be of the bending, torsion, pneumatic, elastomeric, or any other type. The spring could for example be made from portions of an electronic circuit board, which has advantages in manufacturing. The spring constant or flexibility of the spring can be adjusted to compensate for wear in the contact area between contacting portion 44 and the engaging portion of the driven element 42, and can also compensate for production inaccuracies. For instance, high compliance of the spring 50 results in small variations in the resilient contact force the contacting portion 44 exerts on the driven element 42 despite relatively large deflections of the contacting portion 44.

The spring 50 can be attached to the vibration element 26 in many different ways. In one embodiment, the vibration element 26 contains an opening 28 with a dimension slightly smaller than the sum of a corresponding dimension of the undeformed piezoelectric element 22 and the thickness of the spring 50. Inserting the spring 50 and the piezoelectric element 22 into the opening 28 causes the opening to expand, thus creating a press-fit that functionally connects said vibration element to the spring and the piezoelectric element. In another embodiment, the vibration element contains an opening, such as a slot, into which an end of the spring can be pressed, glued, screwed, or otherwise fastened. The slot can be oriented in any preferable way. In one embodiment, the slot is oriented perpendicular to the longitudinal axis 25 of the vibrating element 26. In another variation, it is oriented parallel thereto.

In addition to connecting the vibration element 26 to the housing or base 52, the spring-like element 50 can also be a functional extension of the vibration element 26. With proper adjustments, the spring 50 can isolate the vibrations of the vibration element 26 functionally from the housing 52. Also, the spring 50 can influence the dynamic behavior of the vibration element 26 in order to enhance the performance of the vibration element 26 through amplification or other dynamic effects. For instance, if the spring 50 has axes of symmetry which are different than, or offset to those of, the axes of symmetry of the vibration element 26, then the assembly of the piezoelectric element 22, vibration element 26 and spring 50 becomes dynamically asymmetrical resulting in a coupling of what were formerly independent modes of vibration.

In a further embodiment, the vibrating element 26 can be attached directly to the housing or base 52. It is preferable if the housing or base 52 functionally isolates the vibrations of the vibrating element 26. In this embodiment, the housing itself must exert the resilient force that presses the vibrating element 22 against the moving element 42. It is preferable if the design of the housing or base 52 provides a mechanism to adjust the contact force and to compensate for motor wear. A screw in a slot to adjustably position the vibratory element 26 relative to the driven element 42 is one example.

In yet another embodiment, the vibration element 26 is rigidly connected to the housing 52, and the driven element 42 is resiliently urged against the vibrating element 26 by the bearings in or on which the moving element is supported. For this purpose, it is preferable if the support contains some sort of spring or other compressible medium to provide a resilient force to urge the parts into contact. In this situation, the motor assembly 20 could also mounted in a position so that gravity acting on the driven element 42 may provide the necessary resilient force.

Locating Driving & Driven Elements

Referring to FIGS. 23–36, various configurations are shown for mounting the vibratory element 26 relative to the driven element 42. These figures are schematically shown, and omit the mounting systems of the parts that allow the desired motion and that maintain the parts in sufficient contact for the intended use. For illustration the driven object 42 is shown as a rod with a cylindrical cross section, but it could be a ball, a wheel, a rod, a bar, a gear or something else. The vibratory element 26 needs to be urged against the driven object 42 with a certain force and angle to achieve the contact needed to cause motion. This can be achieved through the mounting mechanisms described earlier or apparent to those skilled in the art given the present disclosure. The mechanism causing that resilient contact is not shown. Also not shown is the mounting arrangement that allows the desired movement of the driven part 42 as that will vary with the particular design. The following arrangements are only examples. Others are possible but are not described since it is not possible to cover all of them. Combinations of these arrangements are possible as well.

Figure 23:
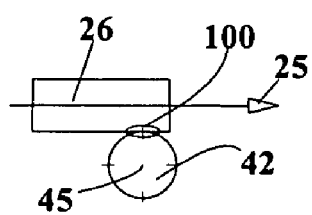
FIGS. 23–24 show configurations of a vibratory element and driven element of this invention with the longitudinal axes of the parts in parallel but offset planes.

Single Vibratory Element Configurations: FIGS. 23–26 show configurations using a single vibratory element 26. In FIG. 23, the vibratory element 26 is above the driven element 42, with at least one of the elements 26, 42 being resiliently urged to maintain the selected driving portion 44 in sufficient contact with the selected engaging portion of driven element 42 to achieve the desired motion. The longitudinal axes of the vibratory element 26 and the driven element 42 are perpendicular to each other, but they could be at various intermediate angles. The contact portion 44 is inward of the distal end 36, but could be at an location along the length of the vibratory element 26 achieving the desired motion at a selected amplitude. The contact portion 44 is thus advantageously selected to occur at a location having the desired elliptical motion 100. The motion 100 is shown generally aligned with the axis 25 of the vibratory element 26, which will cause rotation of the driven element 42 about axis 45. But that need not be the case, as it could be in a plane orthogonal to axis 25 to cause translation along axis 45, or at orientations in between, depending on the desired motion and the design of the components. As used herein, an alignment of about 0–5 degrees will be considered to be aligned.

Figure 24:
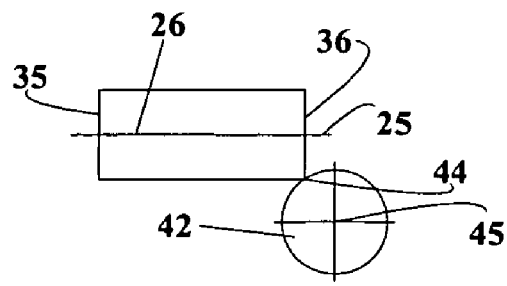

FIG. 24 shows the longitudinal axis 25 vertically offset from and perpendicular to the axis 45 of the driven element. Various intermediate angles of inclination are possible. The selected contact portion 44 is at the distal end 36, at a lower peripheral edge of the vibratory element 26. This arrangement lends itself to producing rotation of the driven element 42 about axis 45, or translation along that axis, or combinations of those motions.

Figure 25:
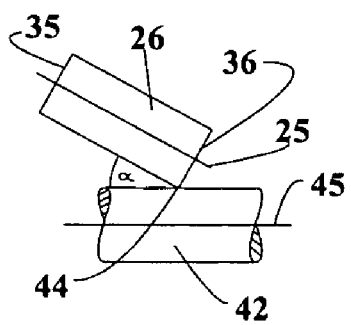
FIG. 25 shows a configuration of a vibratory element and driven element of this invention with the axes of the parts inclined at an angle.
Figure 26:
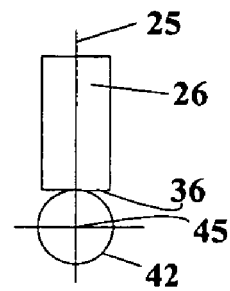
FIG. 26 is an end view of the configuration of FIG. 25.

In FIGS. 25–26, the longitudinal axes 25, 45 are coplanar and inclined relative to each other at an angle $\alpha$ as discussed relative to angle $\alpha$ of FIG. 1. The selected contact portion 44 is at the distal end 36, at a lower peripheral edge of the vibratory element 26. This arrangement lends itself to producing translation of the driven element 42 along axis 45, or rotation about that axis, or combinations of those motions. Referring to FIG. 26, the axes 25, 45 are shown as coplanar, but they need not be so and could intersect at skew angles.

Multiple Vibratory Element Configurations: Configurations using multiple vibratory elements 26 that cooperate to move the driven element 42 are shown in FIGS. 27–42. The use of multiple vibratory elements 26 has the advantage of providing more locations of support to the driven element 42 so that some of the bearings may be omitted. Thus, cost savings and friction reduction that typically comes with low cost bearings or bushings are achieved. In some applications, it can be enough to suspend the driven element 42 entirely using vibratory elements 26 without the need for additional bearings. The vibration of the contacting portion of the vibratory element 26 can provide a low friction support, and an elliptical motion of the supporting portion of the vibratory element 26 is not necessary for this low friction support application.

Further, the use of multiple vibratory elements 26 can accordingly multiply the force, and/or the speed with which the driven element 42 is moved. A single, common excitation signal could be provided to each of the vibratory elements 26 in order to simplify the electrical system, or separate signals could be provided to cause different simultaneous motions of the driven element 42.

In the following, configurations with a specific number of vibratory elements 26 are described. Given the disclosures therein, a variety of other mounting configurations can be configured that use multiple vibratory elements 26 to restrain various degrees of freedom of the driven element 42.

Figure 27:
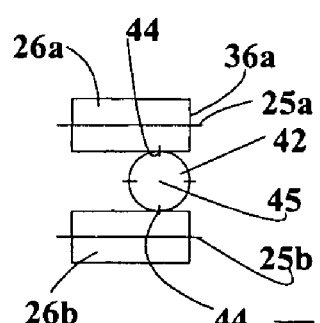
FIGS. 27–29 show configurations of two vibratory elements located in parallel but offset planes relative to the plane of the driven element.

Double Vibratory Element Configurations: Configurations using specifically two vibratory elements 26 and a single driven element 42 are shown in FIGS. 27–36. In FIG. 27 there are two vibratory elements 26 resiliently urged against opposing sides of driven element 42. The two vibratory elements 26 have axes 25 perpendicular to the longitudinal axis 45 of driven element 42, and on opposing sides of that axis 45. The selected contacting portion 44 of each vibratory element 26a, 26b is preferably intermediate the distal ends of the vibratory elements, but that need not be the case as the contacting portion 44 could be at distal end 36. The axes 25 of the vibratory elements 26 can be parallel and coplanar, but they do not have to be either parallel or coplanar. This arrangement lends itself to producing translation of the driven element 42 along its longitudinal axis 45, or rotation about that axis, or combinations of those motions.

Figure 28:
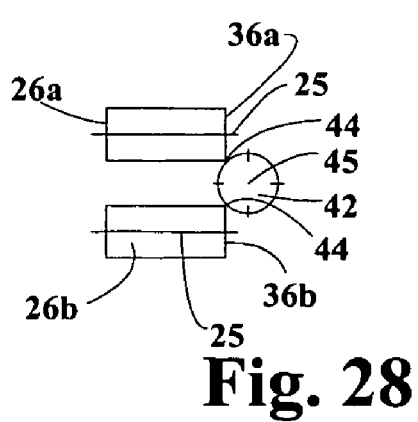

FIG. 28 shows two vibratory elements 26 resiliently urged against a common side of driven element 42. The two vibratory elements 26 have axes 25 perpendicular to the longitudinal axis 45 of driven element 42, but the axes 25 could be inclined to axis 45. The axes 25 of the vibratory elements 26 can be coplanar, but need not be so. The contact portions 45 are at distal edges of each face 36. The contact portion 44 is at an angle 45 degrees from the horizontal plane in which the axis 45 is shows as being located, but on opposing sides of that plane. This configuration lends itself to producing translation of the driven element 42 along its longitudinal axis 45, or rotation about that axis, or combinations of those motions.

Figure 29:
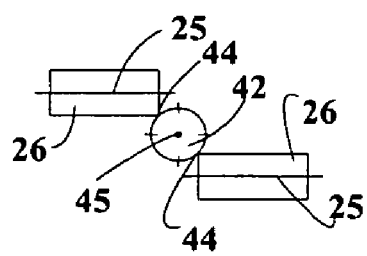

FIG. 29 shows a configuration similar to FIG. 28 except that the vibratory elements 26 face each other and are located on opposing sides of the driven element 42 relative to the vertical axis.

Figure 30:
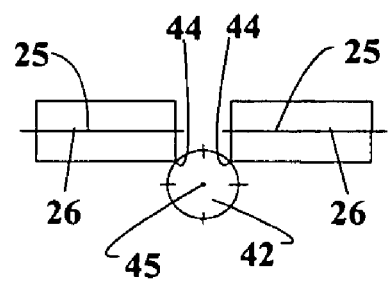
FIG. 30 shows a configuration of two vibratory elements located in the same plane but offset from the plane containing the driven element.

FIG. 30 shows a configuration similar to FIG. 24, except there are two vibratory elements 26 on opposing sides of the driven element 26, on a common axis 25. The longitudinal axes 25 of each vibration element 26 need not coincide, but could be coplanar and skewed relative to each other.

Figure 31:
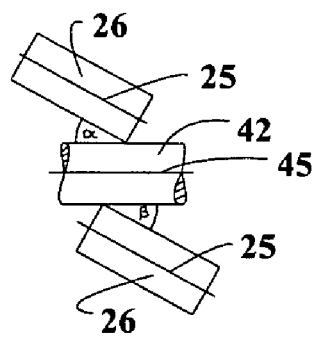
FIG. 31 shows a configuration of two vibratory elements and one driven element with the driven elements located above and below the driven element and at inclined angles relative to the driven element and facing each other.

FIG. 31 has two vibratory elements 26 on opposing sides of the driven element 42, with the elements 26 facing each other but oriented at inclined angles $\alpha$, $\beta$, respectively, relative to a plane through the longitudinal axis 45 of driven element 42. The angles $\alpha$, $\beta$ are shown so the axes 25 of each vibratory element 26 are parallel, but they need not be parallel. The angles preferably cause the longitudinal axes 25 to intersect the longitudinal axis 45 of the driven element 42, but need not do so. The selected contact portion 44 is at the distal end 36 of each vibratory element 26.

Figure 32:
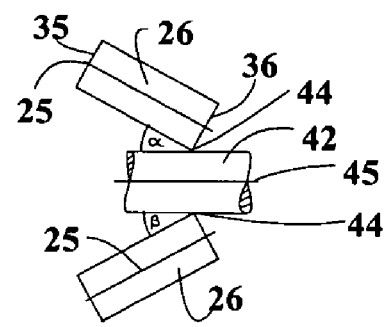
FIG. 32 shows a configuration of two vibratory elements and one driven element with the driven elements located above and below the driven element and at inclined angles relative to the driven element and facing the same direction.

FIG. 32 has two vibratory elements 26 on opposing sides of the driven element 42, with the elements 26 facing the same direction and oriented at inclined angles $\alpha$, $\beta$, respectively, relative to a plane through the longitudinal axis 45 of driven element 42. The angles $\alpha$, $\beta$ are such that the longitudinal axes 25 preferably intersect longitudinal axis 45 of the driven element 42, but need not do so. The selected contact portion 44 is at the distal end 36 of each vibratory element 26.

Figure 33:
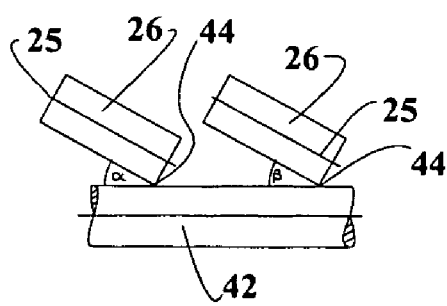
FIG. 33 shows a configuration of two vibratory elements and one driven element with the driven elements located on one common side of driven element and at inclined angles relative to the driven element and facing the same direction.

FIG. 33 has two vibratory elements 26 on the same side of the driven element 42, with the elements 26 facing the same direction and orientated at inclined angles $\alpha$, $\beta$, respectively, relative to a plane through the longitudinal axis 45 of driven element 42. The angles $\alpha$, $\beta$ are such that the longitudinal axes 25 preferably intersect longitudinal axis 45 of the driven element 42, but need not do so. The axes 25 need not lie in the same plane, but preferably do so. The selected contact portion 44 is at the distal end 36 of each vibratory element 26.

Figure 34:
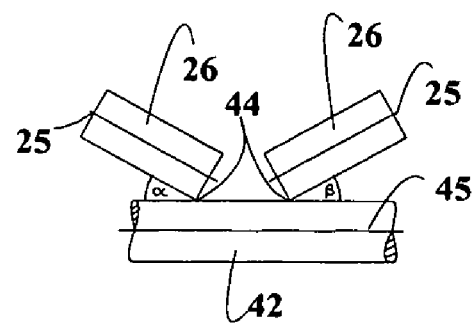
FIG. 34 shows a configuration of two vibratory elements and one driven element with the driven elements located on one common side of the driven element and at inclined angles relative to the driven element and facing each other.

FIG. 34 has two vibratory elements 26 on the same side of the driven element 42, with the elements 26 facing each other and oriented at inclined angles $\alpha$, $\beta$, respectively, relative to a plane through the longitudinal axis 45 of driven element 42. The angles $\alpha$, $\beta$ are such that the longitudinal axes 25 preferably intersect longitudinal axis 45 of the driven element 42, but need not do so. The axes 25 need not lie in the same plane, but preferably do so. The selected contact portion 44 is at the distal end 36 of each vibratory element 26.

FIGS. 35–36 show a configuration with two vibratory elements 26 on opposing sides of the driven element 42, with the elements 26 facing the same direction and orientated at inclined angles $\alpha$, $\beta$, respectively, relative to a plane through the longitudinal axis 45 of driven element 42. The angles $\alpha$, $\beta$ are such that the longitudinal axes 25 preferably intersect longitudinal axis 45 of the driven element 42, but need not do so. The axes 25 need not lie in the same plane, but preferably do so. Advantageously, the axes 25 intersect at a common location on axis 45, with the engaging portions 44 being in the same plane orthogonal to axis 45.

In this configuration, the selected contact portion 44 is at the distal end 36 of each vibratory element 26. The selected contact portions 44 of each element 26 are configured to have a shape mating with the shape of the engaged portion of driven element 42. Here, the circular cross-section of rod 42 results in a convex curved surface for the selected contacting portions 44. This curved engagement results in the vibratory elements 26 providing a support for the driven element 42 that restrains motion except for translation along axis 45. If the contacting portion 44 has a small engaging surface along the length of axis 45, then the driven element 42 will rock about the engaging portions 44. If the contacting portion 44 has an engaging surface with a sufficient length along the length of axis 45, then the driven element 42 can be supported without rocking about the engaging portions 44. This configuration can simplify the mounting of the driven element 42 by allowing the vibratory elements 26 to also act as bearings by clamping the rod between the tips of two vibratory elements 26.

Triple Vibratory Element Configurations:

FIGS. 37–40 show configurations using three vibratory elements 26a, 26b and 26c, with the letters a, b, and c being associated with the various corresponding parts of the first, second and third vibratory elements, respectively. FIG. 37 shows two vibratory elements 26a, 26b as described in FIG. 27, each of which is resiliently urged against opposing sides of driven element 42. The two vibratory elements 26a, 26b each have axes 25 perpendicular to the longitudinal axis of driven element 45, and on opposing sides of that axis 45. The selected contacting portion 44a, 44b of each vibratory element 26a, 26b is preferably intermediate the distal ends of the vibratory elements, but that need not be the case as the contacting portion 44 could be at distal end 36. A third vibratory element 26c is located on an opposing side of the driven element 42 with its selected contacting portion 44c intermediate, and preferably equally between, the contacting portions 44a, 44b along an axis between 44a and 44b. The driven element 42 has its longitudinal axis along the z axial direction. Preferably, the first and second vibratory elements 26a, 26b contact the driven element 42 at the 12 and 6 o'clock positions, with the third vibratory element 26c contacting the driven element 42 at the 3 o'clock position. Other contact locations are possible. The contacting portion 44c is preferably at a distal edge of the vibratory element 26c, with the third vibratory element 26c being oriented at an angle α parallel to the plane containing axes 25a, 25b. The axes 25 of the vibratory elements 26a, 26b are preferably parallel and the axes 25a, 25b and 25c are preferably coplanar, but the various axes do not have to be either parallel or coplanar. This configuration provides for translation and rotation of the driven element 42 along and about its longitudinal axis 45, with the vibratory elements restraining translation in both directions along the y-axis, and in the +x direction, but allowing motion along the −x direction.

FIG. 38 shows the vibratory elements 26 with their longitudinal axes 25 perpendicular to a radial axis extending in a plane orthogonal to the axis 45 of the driven element 42. The contacting portions 44 are illustrated as offset from distal ends 36, but that need not be the case. The vibrating elements 26 are shown as equally spaced with angles β, γ, and α each being about 60 degrees, but the angles can vary. The axes 25a, 25b, 25c are shown as coplanar, but they need not be so. The driven element 42 has its longitudinal axis along the z axial direction. This arrangement allows the vibrating elements 26 to restrain translation of the driven element 42 in both directions along the x-axis and y-axis.

FIG. 39 places two of the vibratory elements 26a, 26b on one side of the driven element with axes 25a, 25b parallel to the x-axis, and with their respective contacting portions 44a, 44b engaging the peripheral portion of the driven element at corresponding locations along an axis parallel to the vertical y-axis. The contacting portions are located at edges of the distal ends 36a, 36b. The axes 25a, 25b are parallel and coplanar, but need not be coplanar or parallel. The third vibratory element 26c is on the opposing side of the driven element 42, with axis 25c parallel to the y-axis. The axis 25c is preferably coplanar with axes 25a, 25b, but need not be so. The driven element 42 has its longitudinal axis along the z axial direction. This arrangement allows the vibratory elements 26 to restrain translation of the driven element 42 in both directions along the x-axis and y-axis.

FIG. 40 places two of the vibratory elements 26a, 26b on one side of the driven element with axes 25a, 25b parallel to the x-axis, and with their respective contacting portions 44a, 44b engaging the peripheral portion of the driven element at corresponding locations along an axis parallel to the vertical y-axis. The axes 25a, 25b are parallel and coplanar, but need not be coplanar or parallel. The driven element 42 has its longitudinal axis along the z axial direction. The third vibratory element 26c is on the opposing side of the driven element 42, with axis 25c parallel to the x-axis, and coaxial with axis 25b. The contacting portions are located at edges of the distal ends 36a, 36b, 36c. This arrangement allows the vibratory elements 26 to restrain translation of the driven element 42 in both directions along the x-axis and y-axis, but does permit motion along one direction of a skew axis at 45 degrees from the horizontal as shown in FIG. 40.

In the above configurations using multiple vibratory elements 26, each vibratory element is preferably activated at the same time as the other vibratory elements so that the vibratory elements cooperate to produce the desired motion of the driven element 42. But the vibratory elements 26 could be separately activated at different times or in different combinations or in different sequences in order to achieve separate motions of the driven element.

Six Vibratory Elements:

FIGS. 41–42 show a configuration in which six vibratory elements 26a through 26f are used to support a driven element 42 that can rotate and translate about its longitudinal axis 45. The vibratory elements 26 each have one end attached to a ring 110 that encircles the driven element 42, preferably in a plane orthogonal to the longitudinal axis 45 of the driven element. The opposing distal end 36a through 36f of the vibratory elements 26 is pressed against driven element 42. Three of the vibratory elements 26 extend toward the driven element 42 in directions opposite to the other three vibratory elements as best seen in FIG. 42. The relative position of each vibratory element 26 viewed in the x-y plane orthogonal to the axis 45 of driven element 42 (FIG. 41), is determined through the angles α, β, γ, σ, ε, and ρ. These angles are preferably 60 degrees in order to equally distribute the support and driving forces, but the angles can be different from that. The vibratory elements 26 advantageously have their longitudinal axes 25 intersecting the longitudinal axis 45 of the driven element 42, but the axes 25 could be skewed so they do not intersect the axis 45. The angles between the vibratory elements 26 and the driven element 42 are defined by δ and φ as shown in the drawing, and will vary depending on the dimensions of the various parts and on the orientation of the vibratory elements 26. The flexibility of the ring 110 helps to ensure that the vibration elements 26 are pressed against the driven element 42. As a result the rod is suspended at six points.

This configuration allows the vibratory elements 26 to support the driven element 42 so as to allow translation only along the longitudinal axis 45 of the driven element 45 and to allow rotation about that axis.

Motor Operating Principles

The following description helps understand the operation of the above-described embodiments, and helps understand the variety of ways to implement these embodiments and variations thereon.

The present motor uses only one piezoelectric element 22 with one electrical excitation signal to excite various modes of vibration of the vibration element 26. The motion of the contact portion 44 is determined by these modes of vibration. In particular, the present motor achieves an elliptical movement of the contact portion 44 in a first direction for a sinusoidal electrical excitation signal at a first frequency, and an elliptical movement of the contact portion 44 in a second direction for a sinusoidal excitation signal at a second frequency, providing a required force or amplitude of motion or speed at the contact portion 44. Elliptical movements of the contact portion 44 in a third and more directions for sinusoidal excitation signals at third and more frequencies are known to be possible.

The motor assembly 20 is advantageously configured so that the contact portion 44 traces the elliptical motion several tens of thousand times per second to make motor operation inaudible for humans and most pet animals. During a selected segment of each elliptical cycle, the contact portion 44 comes into contact with the engaging surface of the driven object 42 where it exerts a frictional contact force that transports the driven object 42 by a small amount into a corresponding direction. The observed macroscopic motion of the driven object 42 is the accumulation of all individual transportation steps.

While the bulk of this disclosure refers to a contact portion 44 located at a distal end 36 of vibration element 26 and moving in a first elliptical path 100*a* causing the driven object 42 to be transported in direction of the driven object's longitudinal axis 45, and the same selected contact portion 44 moving in a second elliptical path 100*b* causing transportation in an opposing direction (as in FIGS. 2 and 5), the first and second selected contacting portions 44 need not be the same, need not be adjacent, and need not be located at a distal end 36. They need only be located on the same vibratory element 26. Further, the number of selected contacting portions 44 and the directions and orientations of respective elliptical paths 100 at each contacting portion can vary according to the particular design. There could be three, or there could be more. There can thus be a plurality of selected contacting portions 44 on the vibratory element 26 moving in a plurality of elliptical paths 100 in a plurality of directions.

Advantageously the desired motion of a selected contact portion 44 is identified, whether it is in a single direction or multiple directions, and whether there is a single selected contact portion 44 or several contact portions 44, or combinations thereof. The motor assembly 20 is then designed to achieve that motion. As often occurs, the design does not achieve perfection but instead achieves an acceptable approximation of the desired motion. A number of the factors that can be used to configure the components of motor assembly 20 to achieve that desired motion are discussed below.

Generation of Elliptical Motion: If the piezoelectric element 22 is excited with a sinusoidal electrical signal, it generates a sinusoidal force and a sinusoidal displacement principally along its longitudinal axis 95, shown in FIGS. 1–3 as being alongside longitudinal axis 25 of the vibration element 26, or shown in FIG. 15 as being at an oblique angle to the longitudinal axis 25. Said force and displacement are then used to excite modes of vibration of the vibration element 26. The vibration element 26 is preferably configured so that at a predetermined excitation frequency at least two of its modes of vibration are substantially excited. If a mode has only a uniform motion component in the direction of the longitudinal axis 25, it is considered to be a longitudinal mode. If the motion components of a mode lie in a direction perpendicular to the longitudinal axis 25, the mode is considered to be a bending mode. Further well known modes include torsion and shear modes. A mixed mode is neither of these modes but can have components of motion in, or rotating around, any of the directions 25, 38 or 40. Each mode that is excited adds a sinusoidal motion component to the motion of the contact portion 44. If at least two of these components of motion are non-parallel and mutually out of phase, the resulting motion of the contact portion 44 is known to be elliptical.

The bulk of this disclosure refers to a piezoelectric element 22 that generates force and displacement principally along its longitudinal axis 95, but a piezoelectric element having a different principal direction, or a force and displacement-generating element other than a piezoelectric element, could be used.

Making Use of Elliptical Motion: It is an advantage of the present invention over prior art motors that elliptical motions do not have to be achieved exclusively with mutually perpendicular longitudinal and bending modes that are excited 90 degrees out of phase, but instead that the elliptical motion can be generated with at least two excited modes that can be mutually oblique and have a phase difference that can be substantially different from 90 degrees. In this case, the contact portion 44 traces an ellipse 100 whose semi-axes are not necessarily aligned with any of the directions 25, 38 or 40, thus making it advantageous for the vibration element 26 to be mounted at an oblique angle to the driven object 42. That is, the longitudinal axis 25 is preferably inclined to the vibration element 26 at an angle α (FIG. 1), which will vary with the particular design and components involved. Oblique mounting of the vibration element 26 rotates the ellipse 100 with respect to the driven object 42. Associated with this rotation, a coordinate transformation is formulated elsewhere that exposes the beneficial and enhancing effects of this rotation on relative phase shifts between components of motions that generate the elliptical path 100.

While the elliptical motion 100 of the selected contacting portion 44 is achieved even if the selected contacting portion 44 is not engaged with the driven element 42, in order to achieve useful motion the contact portion 44 of vibration element 26 is placed in physical contact with the engaging surface of the driven object 42 during a certain portion of each elliptical cycle 100. This portion preferably remains the same for each subsequent cycle. During each engagement, the vibration element 26 exerts frictional forces on the driven object 42. These forces can vary over the period of an engagement but their accumulative effect transports the driven object 42 relative to vibration element 26. It is believed that this transport is most efficient if the direction of transport coincides with the direction of motion of the contact portion 44 at the point of the ellipse that is closest to the driven object 42.

The speed of contacting portion 44 tangential to the elliptical path 100 is largest where the minor-axis of the ellipse intersects the elliptical path, and smallest where the major axis of the ellipse intersects the elliptical path. An ellipse whose major axis is tangential to the engaging surface of driven object 42 is therefore expected to provide an efficient transportation mechanism. It can be beneficial to use an ellipse whose major axis is inclined with respect to the engaging surface of driven object 42. In this situation, the contact portion 44 moves towards the driven object 42 at a different rate than the rate at which it moves away from it after having passed the point closest to driven object 42. Inherent to the elliptical shape, a faster approach typically results in a slower retreat and vice versa, so that the process of engagement with the driven element 42 can be selected to be more gradual or more abrupt. At its extreme, such a motion is known as a saw-tooth motion. Motors that generate exact saw-tooth motion are in the prior art. Purposefully employing an inclined ellipse in the present disclosure provides therefore some of the advantages only seen in those saw-tooth motors.

To ensure efficiency of transport, it is preferable that the frictional engagement is sufficiently large, and that the contacting portion 44 moves against the direction of desired transport of driven object 42 only while the friction forces are reduced or vanish, which occurs when some or all of the contact portion 44 has lost contact with the engaging surface of the driven object 42.

The amount of friction and wear depends also on the friction parameters and the material combination used for the contact portion 44 and the size of contact portion 44. These parameters also influence the strength of the motor 20. More friction typically results in stronger force but may also result in more wear. Material combinations that are believed suitable for use include steel, aluminum and glass on one side of the contact, and glass, fiberglass, PMMA, PVC, ABS or steel on the other side of the contact. The friction parameters of glass surfaces are modifiable chemically or physically by adding particles or etching a texture.

It is an advantage of the motor assembly 20 that the dimensions of the engaging surface of the driven object 42 do not have to be precise and that variations are accommodated by the resilient mounting system of the motor 20, which is discussed later. Also, it has been shown that wear due to the vibrations can modify the contact portion 44 of vibration element 26 and create a larger contact area. This effect is especially strong at the beginning of the lifetime of the motor. The effect fades quickly, resulting in better motor performance. This wear can be used to advantage since the resilient mount 50 urges the selected contacting portion 44 against the driven element 42, allowing for wear-in between harder and softer materials, that can reduce initial manufacturing tolerances. As desired, the wear-in can also be used to increase the selected contacting area 44.

Achieving desired elliptical motion: The size and orientation of the elliptical trajectory 100 depend on the amplitudes and phases used to generate the ellipse. The ability to maintain a useful elliptical trajectory 100 of contact portion 44 over a sufficiently large frequency range depends on the vibration design properties of the motor assembly 20.

It is known that a mode of the vibration element 26 undergoes a smooth phase change of −180 degrees with respect to the excitation signal applied to the piezoelectric element 22 if the frequency of excitation is increased across the resonance frequency of the mode. The width of the frequency range within which this transition occurs increases with the amount of mechanical damping in the system. It is desirable that such a frequency range is sufficiently large in order to assure that the phase difference between two excited modes can remain sufficiently different from 0 or 180 degrees over an extended frequency range and can potentially sustain a desired elliptical motion of the contact portion 44. This renders the motor 20 in principle less sensitive to variations in manufacturing and operating conditions. In order to achieve a desired amount of damping at a particular location, a separate dampening element could be added to any part of the vibration element 26 or the portion of the suspension that participates in the mechanical vibrations. But preferably the damping that is inherent in the system design and materials is used.

To achieve a stronger motor, it is also desirable if the excited modes of vibration show significant amplitudes at the contact portion 44 near the desired frequency of excitation and thus it is preferable to have a frequency of excitation that is close to a resonance frequency of a selected mode. Since the amplitude of a mode at the contact portion 44 also depends on the amplitude of its excitation, it is preferable that the vibration element 26 is designed to appropriately distribute the mechanical vibrations generated by the piezoelectric element 22 to the various modes. This distribution can be achieved in a controlled fashion in a number of ways using combinations of damping, geometric and material properties of the vibration element 26, and the forces that are generated between the vibration element 26 and the driven object 42 at the contact portion 44. Conceptually, methods and modifications that affect the force distribution are different from methods that affect the shape of a mode and its resonance frequency. In reality however, a modification that affects force distribution very often modifies also a mode shape and its resonance frequency. For example, it is known for a rod-like vibration element 26 that some modifications that would distribute mechanical energy forces to a pure longitudinal and a pure bending mode would typically also couple the two modes together to create new modes of mixed type.

Distributing Mechanical Vibrations: Internal damping forces can couple one mode to another so that the piezoelectric element 22 can potentially drive a first mode, which in turn excites a second mode indirectly by way of damping. This effect is particularly strong if the respective resonance frequencies and the frequency of excitation lie close together.

A first mode that is excited by the piezoelectric element 22 at a certain frequency can excite a second mode also by way of the contact forces generated in the contact portion 44. Specifically, the elliptical motion of the contact portion 44 can produce a force that is sinusoidal or a force that is intermittent with the same frequency that drives the first mode. This force then excites other modes in the vibration element 26, as well as vibration modes of the driven object 42 discussed elsewhere. This form of excitation can be mutual, and this effect can be deliberately used, so that formerly independent modes can be coupled together to form new modes. The orientation of the ellipse 100 at the contact portion 44 and the portion of the ellipse during which contact forces are generated determine the phase with which a second mode is excited relative to the first mode. This phase is preferably not a multiple of 180 degrees.

Which modes of vibration element 26 are excited by way of contact, and by how much they are excited, also depends on the position and orientation relative to vibration element 26 of contact portion 44 and engaging surface of driven object 42. The contact portion 44 can be chosen to lie in a plane of symmetry of the assembly 20, vibration element 26, resilient mounting system 50 or driven object 42, or not. Non-symmetric positioning can be used to excite modes that otherwise would be harder to excite by the piezoelectric element 22 alone, for example certain bending modes or torsion modes of vibration element 26. To the same end, the orientation of the engaging surface relative to vibration element 26 can be chosen to be perpendicular or parallel to certain planes of symmetry, or not.

Location and Orientation of Piezoelectric Element: Referring to FIG. 1, the vibrating element 26 preferably has an elongated, rod-like shape with an opening 28 perpendicular to the longitudinal axis 25 of the rod. The opening 28 has dimensions slightly smaller than corresponding dimensions of the piezoelectric element 22, so that the piezoelectric element can be inserted into the opening 28 in a press-fit manner. If the vibrating element 26 has a symmetric shape, and if the piezoelectric element 22 is inserted symmetrical with respect to the longitudinal axis 25, and if the contact between the piezoelectric element 22 and the vibration element 26 is nearly perfect, then it is expected that primarily only longitudinal vibrations in direction of axis 25 are generated. These vibrations can be transformed into bending or other vibrations by way of the previously discussed contact forces at contact portion 44, or they can be transformed by the action of the resilient mounting system 50 discussed below, which urges vibration element 26 against the driven object 42.

The piezoelectric element 22 can directly generate other than longitudinal vibrations in the vibration element 26 if element 22 is non-symmetrically inserted into the opening 28, e.g., if the longitudinal axis 95 of the piezoelectric element 22 is offset (cf. FIG. 14) or inclined (cf. FIG. 15) with respect to the longitudinal axis 25 of vibration element 26, or if at least one of the contact areas between the piezoelectric element 22 and the resonator 24 is made non-symmetrical. For example, the vibration element 76 in FIG. 5 has the longitudinal axis of the piezoelectric element 22 offset from a principal longitudinal axis of the resonator 74. This offset couples various modes of the resonator 74 and the vibration element 76. Moreover, the resonator 74 rotates about pin 78, and that may further modify vibrating modes of the vibrating element 76.

The more pronounced the modifications are that let the piezoelectric element 22 be inserted in a asymmetric fashion, the more bending and other vibrations are typically excited. Also, such modifications typically couple formerly independent longitudinal and bending modes together to create new modes of mixed type. Torsion modes in a rod-like vibration element could also be excited.

In a preferred embodiment, the piezoelectric element 22 is inserted into the opening 28 in the resonator 24 such that the resonator and the piezoelectric element 22 do not enter into perfect contact along the entire area where contact could be possible. To achieve such a purposefully partial contact during the insertion process, the sidewalls 29 of the opening 28 could for example be deformed by the inserted piezoelectric element 22 such that contact is lost in certain portions of the potential contact area. Alternatively, partial contact can be achieved by making the potential contact surface of the piezoelectric 22 non-even, for example by removing material in parts of the contact area of the resonator 24 before inserting the piezoelectric into the opening 28. In FIGS. 10 and 11, this could also be achieved by inserting a pin 92 at a location offset from the depicted longitudinal axis 25. Also, inserts 94 (FIG. 16) could be used to provide localized contact areas at the location of the insert. Moreover, combinations of the above methods may be used to achieve a desired partial contact and to induce a desired combination of lateral and longitudinal motion components at a desired contacting portion 44.

Figure 73:
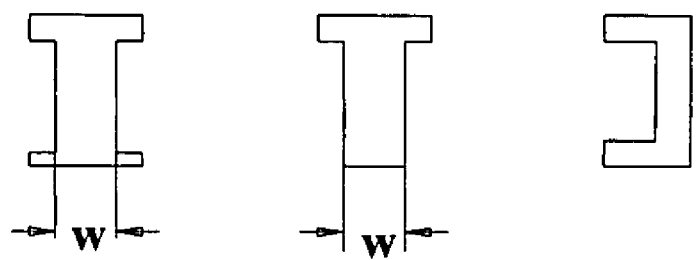
FIG. 73 shows cross-sections for resonator elements of this invention.

Shape of Vibration Element: The resonance frequencies of the various vibration modes typically decrease if the vibration element 26 is made longer, and vice versa. Also, the shape and size of the cross-sections of the resonator 24 affect the resonance frequencies and modes involving bending and torsion. For example, referring to FIG. 73, the cross-section of the resonator 24, or at least of a portion of the distal end of the resonator 24 could be I-shaped, which can be used to vary the relative stiffness and resonance frequencies of modes involving longitudinal motion and lateral bending since the I beam cross-section can have the stiffness along one lateral axis much different than the stiffness along the other lateral axis. It also produces a lower lateral bending stiffness without having to greatly increase the length of the resonator 24. FIG. 73 also shows a T-shaped cross section, which could introduce a twisting mode if the T was made non-symmetric about its vertical axis. C-shaped cross-sections and variety of other cross-sectional shapes can be used to vary the resonance modes of the resonator 24 and of the vibrating element 26. Other non-symmetric, cross-sectional shapes can be used.

To purposefully achieve modes of vibration that can generate a desired elliptical motion 100 at the contact portion 44 of vibration element 26 so that the ellipse 100 is inclined with respect to the longitudinal axis 25 of vibration element 26 and/or the engaging surface of driven object 42, it can be advantageous to have a non-symmetric design of the vibration element 26. For example, the resonator 24 could be made helical, or it could have an arched or an L-shape. Other shapes are possible. The asymmetric mass distribution that is achieved this way results in modes of vibration that are neither purely longitudinal nor purely transversal in nature, which is beneficial for generating inclined elliptical motion 100.

Figure 77:
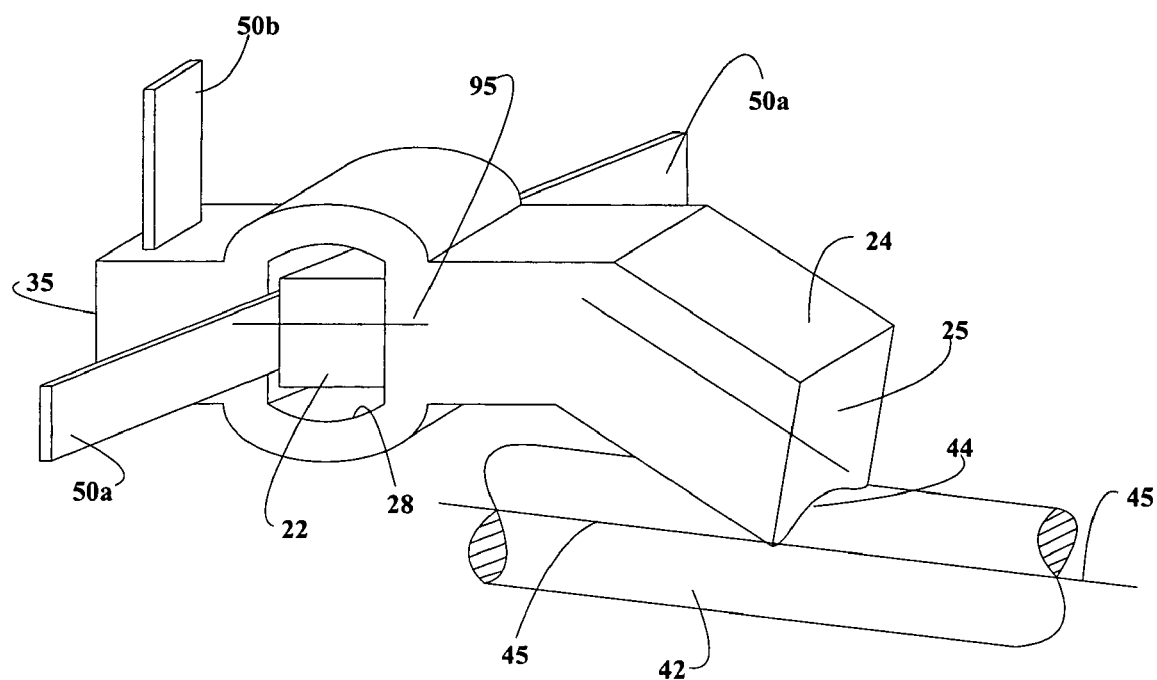
FIG. 77 shows a further embodiment of a piezoelectric motor assembly of this invention.

Moreover, referring to FIG. 77 a further embodiment is shown that has advantageous design features. This embodiment illustrates a resonator 24 that is not straight. Further, it illustrates the location of the piezoelectric element 22 along an axis that does not intersect the driven element. Moreover, it illustrates a different alignment and orientation of the piezoelectric element 22 and the resonator 24. The axes are inclined relative to each other, with the axis of piezoelectric element 22 generally parallel with the axis 45 of the driven element 42. The axis 25 of the resonator 24 is inclined to bridge the gap between the two axes 95, 45. The selected contacting surface 44 comprises a curved surface conforming the shape of the abutting contact area on the rod-like driven element 42. The curved surface may be manufactured or it may be generated by natural wear during operation of the motor. The resilient mounting system accommodates motion of the selected contact surface 44 that moves the rod 42.

Advantageously, the resilient mounting system comprises one or more springs 50. In the illustrated embodiment, if the rod 42 is in a horizontal plane, then a spring 50a aligned in the horizontal plane through piezoelectric axis 95 and perpendicular to (but offset from) the longitudinal axis 45 provides the resilient mounting system. Advantageously, there are two springs 50a extending on opposing sides of the resonator 24 to provide a symmetric resilient mounting, although only one spring 50a could be used. The springs 50a are shown connected to the resonator 24 by interposing distal ends of the springs 50a between the piezoelectric element 22 and the opening 28 in resonator 24. Instead of separate springs 50*a*, a single leaf spring element with its middle abutting piezoelectric element 22 could be used.

Alternatively to spring 50*a*, or in addition to spring 50*a*, a spring 50*b* connects to the resonator 24 adjacent the end 35 in an axis orthogonal to the horizontal plane. Depending on the relative stiffness of the springs 50*a*, 50*b*, and the relative location of those springs, various motions of the driven element 42 can be achieved. Preferably, the motion is a combined rotation about, and translation along axis 45, but a pure rotation or a pure translation of the driven object 42 could also be achieved.

Suspension: A resilient mounting system 50, called the suspension, is connected to the vibration element 26 to ensure that the selected contact portion 44 is consistently urged against the engaging portion of the driven element 42 so that the elliptic motion 100 of the contact portion 44 can transport the driven element 42. Similar principles apply if the driven element 42 is resiliently suspended and urged against the contacting portion 44 instead. This consistent resilient force is preferably maintained even if the driven element has a varying surface smoothness or configuration and if the contact portion 44 shows signs of wear. For a small resilient force, these motors have been shown to transport the driven object 42 quickly, but provide small force. For a larger resilient force, the transportation speed decreases, but the transportation force increases. If the resilient force is selected too large, the driven object typically stops.

Depending on the location of the selected contacting portion 44 and the configuration in which one or more vibratory elements 26 are arranged (e.g., FIGS. 23–42, different suspension systems will be needed. A variety of suspension systems are illustrated in FIGS. 1, 2, 5 and 17–22, and portions of the suspension system are discussed in the section on Mounting Of Vibratory Elements & Driven Elements. The suspension system described here is primarily a spring-based suspension system, but need not be so limited. The suspension could include leaf springs, coil springs and other types of springs; it could include resilient materials such as elastomers or compressed gas springs, to name a few. The effect of the suspension system on the vibration modes of the vibratory element 26 will vary with the specific type of suspension system used and its arrangement.

For example, FIG. 74 shows a suspension system using a curved, flat spring 188 having a first end 188*a* connected to base 52 and an opposing end 188*b* connected to the vibratory element 26. In the depicted embodiment, the spring 188 is interposed between one end of the piezoelectric element 22 and the adjacent wall, which defines an opening 28. The vibratory element 26 is inclined at an angle α relative to the engaging surface of the driven object 42. The curved spring 188 offers the possibility of providing a smaller motor assembly 20 because the curved spring can reduce the needed space for the suspension. The wheel 46 could contacts the driven element 42 using a flat edge of the wheel concentric with the rotational axis 65, as illustrated in FIG. 74. The wheels 46 could also have contoured peripheries configured to engage mating shapes on adjacent portions of the driven element 42 in order to appropriately support and guide the driven element 42. Given the present disclosure, a variety of movable support configurations will be apparent to those skilled in the art.

Another example is shown in FIG. 1 where the vibrating element 26 is mounted to and moves about the location where end 50*a* is mounted to base 52. The selected contact portion 44 is located relative to the mounting of spring end 50*a* to the base 52 so that a generally vertical axis passes through both the mounting point 50*a* and the contacting portion 44.

In contrast, the C-clamp configuration of FIG. 5 has the vibrating element 76 rotating about pin 78. A vertical axes passing through the contacting portion 44 is offset from a vertical axis passing through the pivot pin 78. The offset, combined with an asymmetric location of the piezoelectric element 22, results in a different suspension system that can have different characteristics.

Portions of the resilient suspension system typically participate in the vibrations of the vibration element 26 and therefore affect the vibration modes. The design of the suspension system is advantageously such that it enhances the desired motion of the selected contact portion 44.

If a resilient suspension system, such as spring 50 is connected at a node of vibration at an operational frequency of the vibrator element 26, then it does not participate in the vibration. But if the resilient suspension system is connected at a location other than a node of vibration at selected operating frequencies, then it creates an asymmetry that can couple various otherwise independent modes of vibration of vibration element 26 together. This can result in elliptical motion 100 at the selected contacting portion 44 that is especially useful if the engaging surface of the driven object 42 is inclined with respect to the vibration element 42.

For example, in the embodiment of FIG. 5, the vibration element 76 oscillates about the pin 78, which can cause the contact portion 44 to have an up-and-down motion along its elliptical path 100. The mounting of the vibrating element 46, 76 can result in a variety of vibration modes of the motor assembly 20 and various movement of the contacting portion 44.

Moreover, referring to FIG. 77 the further embodiment is shown that is suitable for use in a torsional motion or rotational motion of the driven element. In this embodiment, the driven element 42 rotates about its longitudinal axis 45. The longitudinal axis 95 of the piezoelectric element 22 is not aligned with the longitudinal axis 25 of the resonator 24. The axes are inclined relative to each other, with the axis of piezoelectric element 22 generally parallel with the axis 45 of the driven element 42. The axis 25 of the resonator 24 is inclined to bridge the gap between the two axes 95, 45. The selected contacting surface 44 comprises a curved surface conforming the shape of the abutting contact area on the rod-like driven element 42. The resilient mounting system accommodates motion of the selected contact surface 44 that rotates the rod 42 about its longitudinal axis 45.

Advantageously, the resilient mounting system comprises one or more springs 50. In the illustrated embodiment, if the rod 42 is in a horizontal plane, then a spring 50*a* aligned in the horizontal plane through piezoelectric axis 22 and perpendicular to (but offset from) the longitudinal axis 45 allows the rotational motion of rod 42. Advantageously, there are two springs 50*a* extending on opposing sides of the resonator 24 to provide a symmetric resilient mounting, although only one spring 50*a* could be used. The springs 50*a* are shown connected to the resonator 24 by interposing distal ends of the springs 50*a* between the piezoelectric element 22 and the opening 28 in resonator 24. Instead of separate springs 50*a*, a single leaf spring element with its middle abutting piezoelectric element 22 could be used.

Advantageously, but optionally, a spring 50*b* connects to the resonator 24 adjacent the end 35 in an axis orthogonal to the horizontal plane. Depending on the relative stiffness of the springs 50*a*, 50*b*, and the relative location of those springs, various motions of the driven element 42 can be achieved. Preferably, the motion is predominantly or purely rotation about longitudinal axis 45, although a combined rotation about, and translation along axis 45 could also be achieved.

FIG. 77 also illustrates that the vibration element 26 and resonator 24 can be non-symmetric. It also shows that the spring 50 can have various locations, configurations and orientations. Indeed, the spring 50 can be a bending or torsion spring, each of which can affect the suspension and resonant vibration modes of the system or of the vibratory element 26. FIG. 77 also shows that the spring 50 need not be connected to the piezoelectric element 22. Moreover, the axis 25 of the predominant vibrating portion of resonator 24 need not be parallel to the axis 95 through the piezoelectric. Further, the contacting portion 44 can be molded to conform to the abutting surface of the driven element. The molding can be preformed in the resonator 24, cut or otherwise formed into the resonator 24, or it can be formed by wear and run-in.

A Mode of Operation to Reduce Friction:

It is an additional feature of the motors of this disclosure that when excited at certain frequencies, which are not the operational frequencies, they produce a varying contact force at the contact portion 44, and possibly liftoff, which can reduce the effective frictional holding force on the driven object 44. In other words, it is easier to pull the driven object through the motor when operated at those frequencies, then when the motor is turned off. This property of selectively reduced friction can be beneficial in certain applications.

Theoretical Design Aspects

The piezoelectric 22 and resonator 26 are configured to achieve a desired motion of the selected contact portion 44 that moves the driven element 42. The contact portion 44 preferably moves in an elliptical path 100 as shown in FIG. 1. Changes in phase and amplitudes of two rectangular components of motion of the resonator 26 and their superposition to achieve that elliptical motion are described here (similar results can be derived for oblique angles). By modifying the phase and amplitudes several properties of the ellipse useful to the present application in motor assembly 20 are better understood. These properties include the orientation and lengths of the short and long semi-axes of the ellipse that is the path preferably traveled by the selected contact portion 44. Other relevant properties could also include the speed by which the ellipse is traversed, which correlates to the speed of the contact portion 44 and thus the speed with which the driven element 42 moves. The design may require the direction of the semi-axis of the ellipse to be aligned with certain dimensional tolerances within the piezoelectric motor assembly 20. The design may also require that the lengths of the semi-axes of the ellipse 100 do not exceed certain predefined limits. Moreover, the ratio of the semi-axes of the ellipse 100 can be advantageously selected to provide greater motion, or faster movement, with the ratio of the axes advantageously being 5:1, preferably 10:1, and ideally from about 10–50:1.

Figure 43:
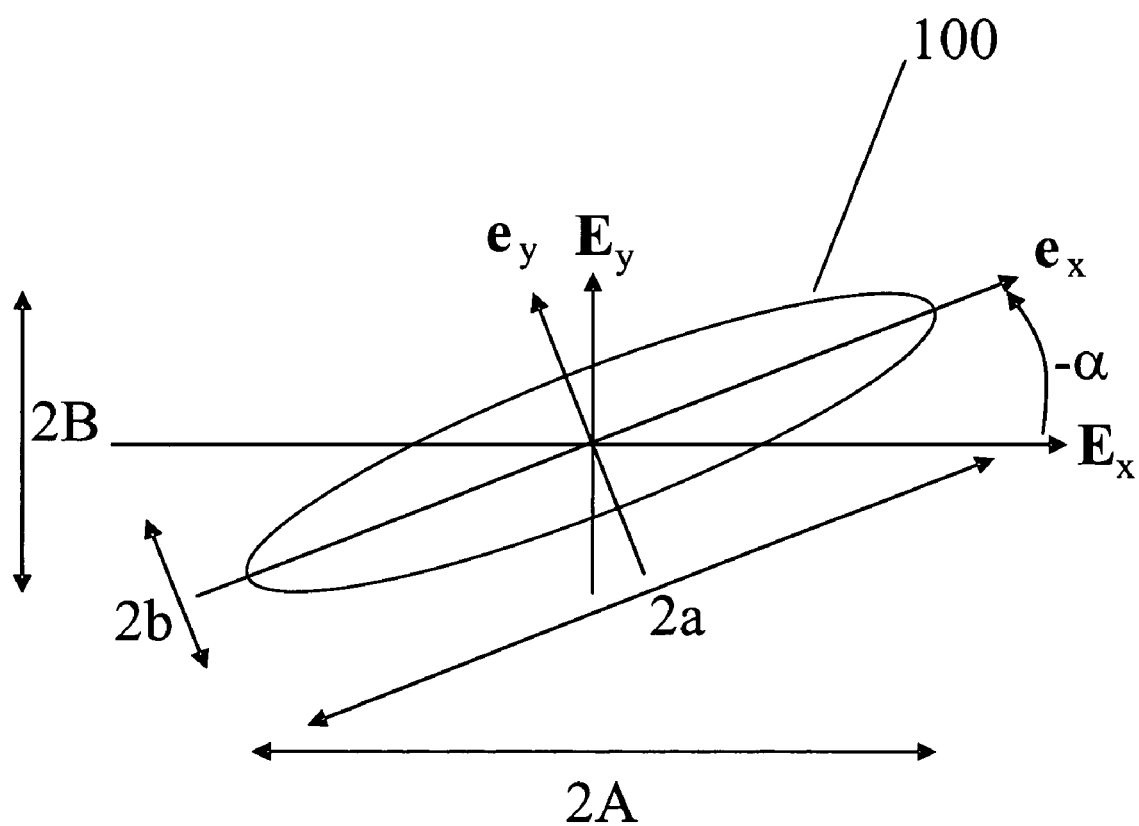
FIG. 43 shows a diagram of the elliptical motion of the selected contact portion of this invention.

Referring to FIG. 43, the ellipse 100 represents the potential motion of contact portion 44 of the vibrating element 26 as shown in FIGS. 1 and 5, among others. The ellipse 100 is generated by two components of motion, the first acting in the $E_x$-direction (which corresponds to motion along the longitudinal axis 45 of the driven element 42 in FIG. 1). The second component of motion acts in the $E_y$-direction, which is perpendicular to the $E_x$-direction. The two components of motion $E_x$, $E_y$ are generated at the selected contact portion 44 of the motor assembly 20. The mechanism used to generate the components of motion do not affect the following disclosure. Localized major and minor axes $e_x$, $e_y$, respectively, of the ellipse 100 are also shown.

For illustration, the first and second components of motion $E_x$, $E_y$ are assumed to be sinusoidal with amplitudes A and B, respectively, and to have a phase difference of $\phi=\pi/2+\Delta\phi$[rad]. But other waveforms could be used. The position vector r of the selected contact portion 44 located at the edge of the resonator 24 as depicted in FIG. 1, as a function of time, is:

$$r = A\cos(\omega t + \phi)E_x + B\sin(\omega t)E_y.$$

Figure 44:
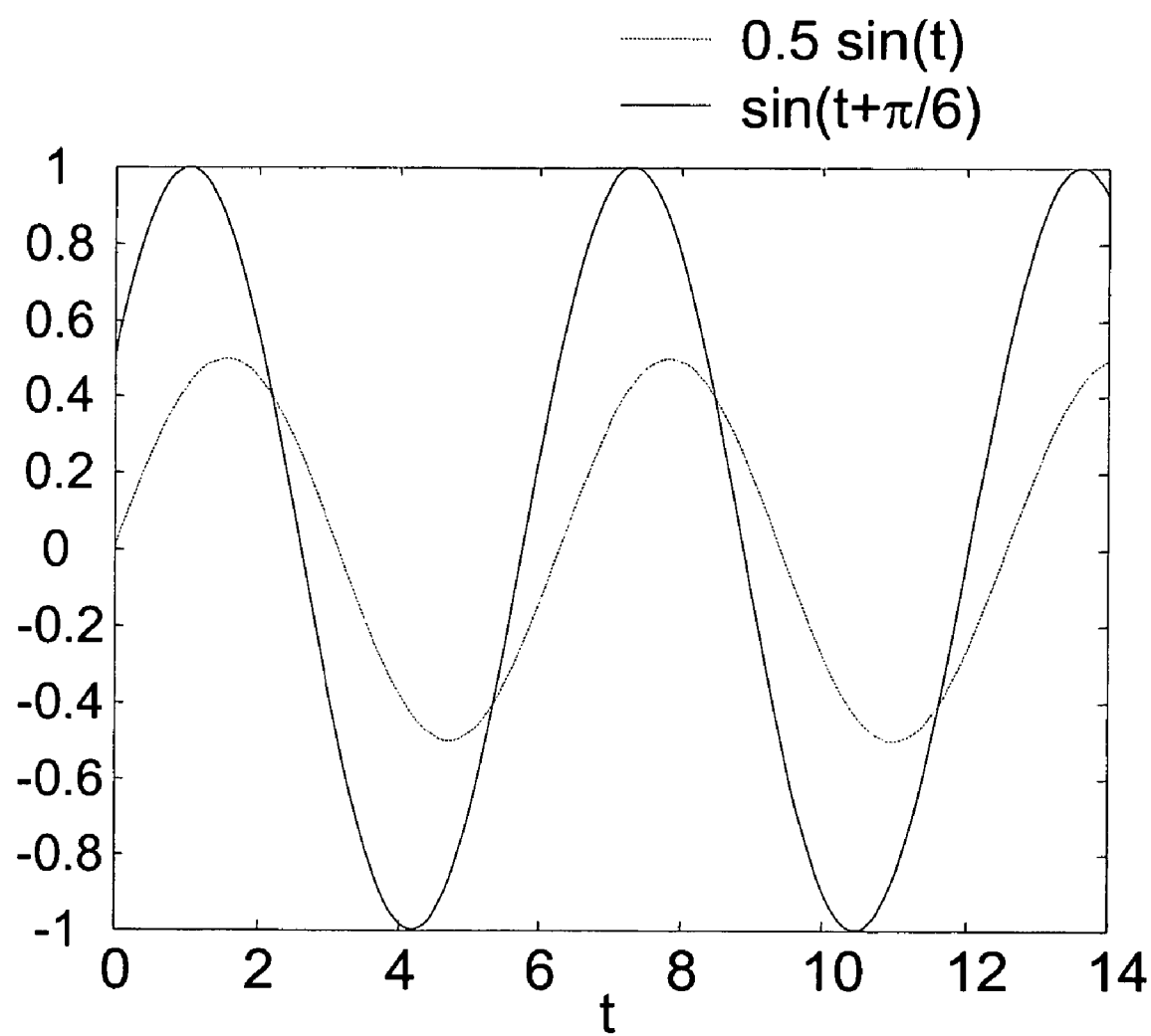
FIGS. 44–51 show graphical presentations of various aspects affecting the elliptical motion of the contacting portion depicted in FIG. 43.

In this equation, $\omega$ is the frequency of the oscillation. FIG. 44 shows an example of the partial components of motion for A=1, B=0.5, $\omega$=1 and $\phi=\pi/6$[rad]. The ellipse 100 of FIG. 43 is traversed counterclockwise for $|\Delta\phi|<90°$, and clockwise for $90°<|\Delta\phi|<270°$.

The lengths $2a$ and $2b$ of the long and short semi-axes are then computed from, respectively:

$$2a^2 = A^2 + B^2 + \sqrt{A^4 + B^4 - 2A^2B^2\cos(2\Delta\phi)},$$

$$2b^2 = A^2 + B^2 - \sqrt{A^4 + B^4 - 2A^2B^2\cos(2\Delta\phi)}.$$

Figure 45:
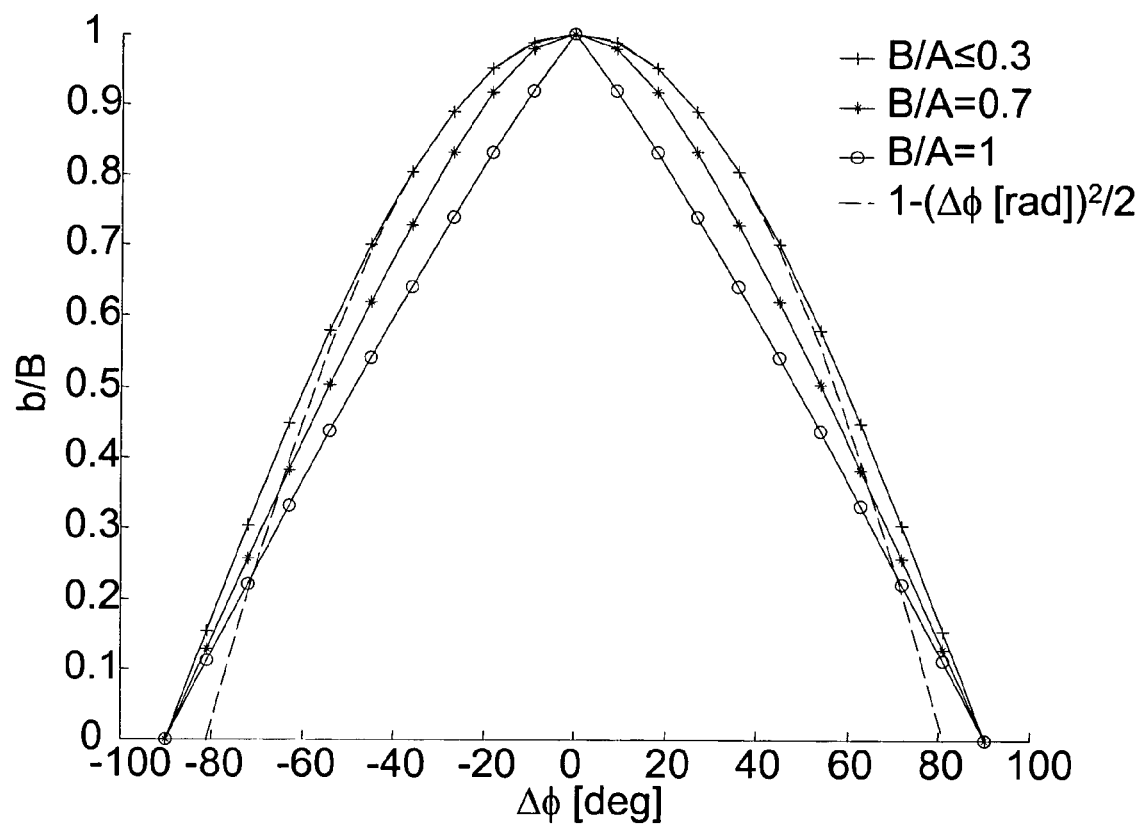
Figure 46:
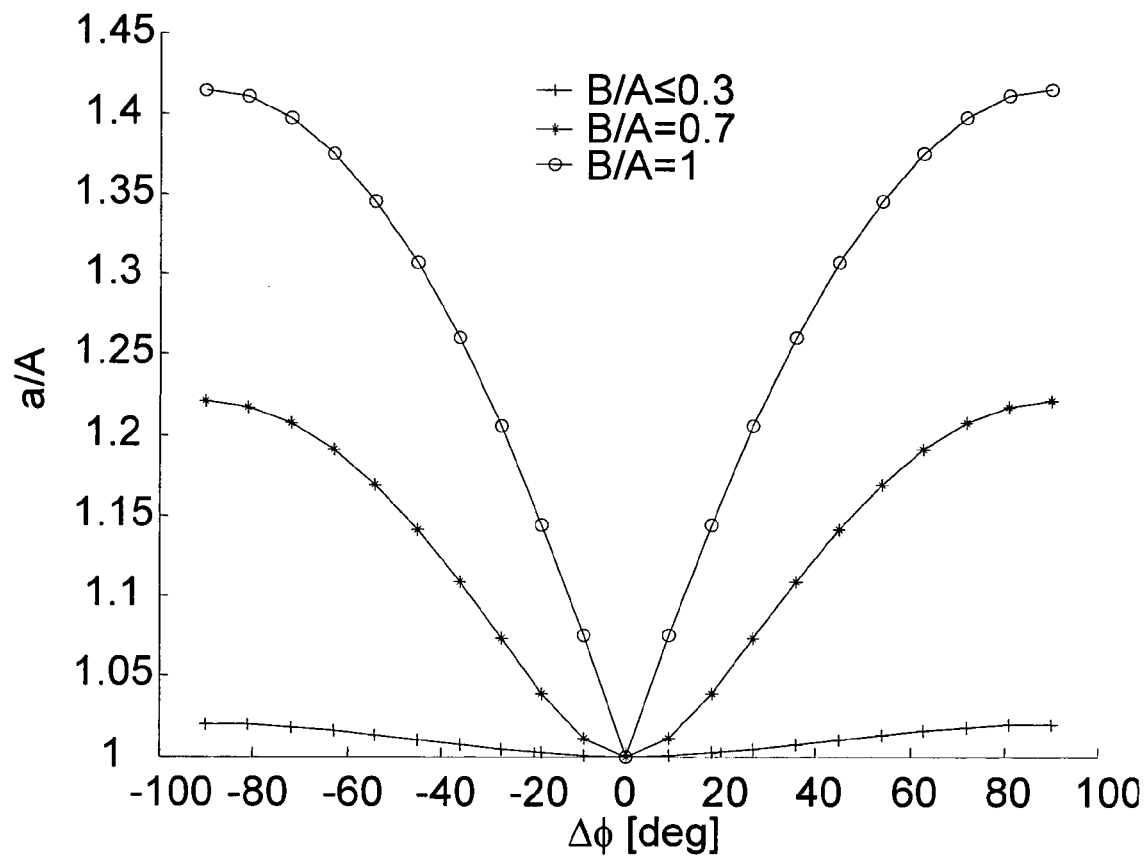

FIG. 45 depicts how b/B depends on $\Delta\phi$ and the ratio B/A. FIG. 46 depicts the dependence of a/A. It is important to notice that the dependence of b/B does not change substantially for ratios of B/A<=0.3. A good approximation of this dependence for $|\Delta\phi|<50°$ and B/A<=0.3 is given by the function $$\frac{b}{B} = 1 - \frac{(\Delta\varphi \, [\text{rad}])^2}{2}.$$

Figure 47:
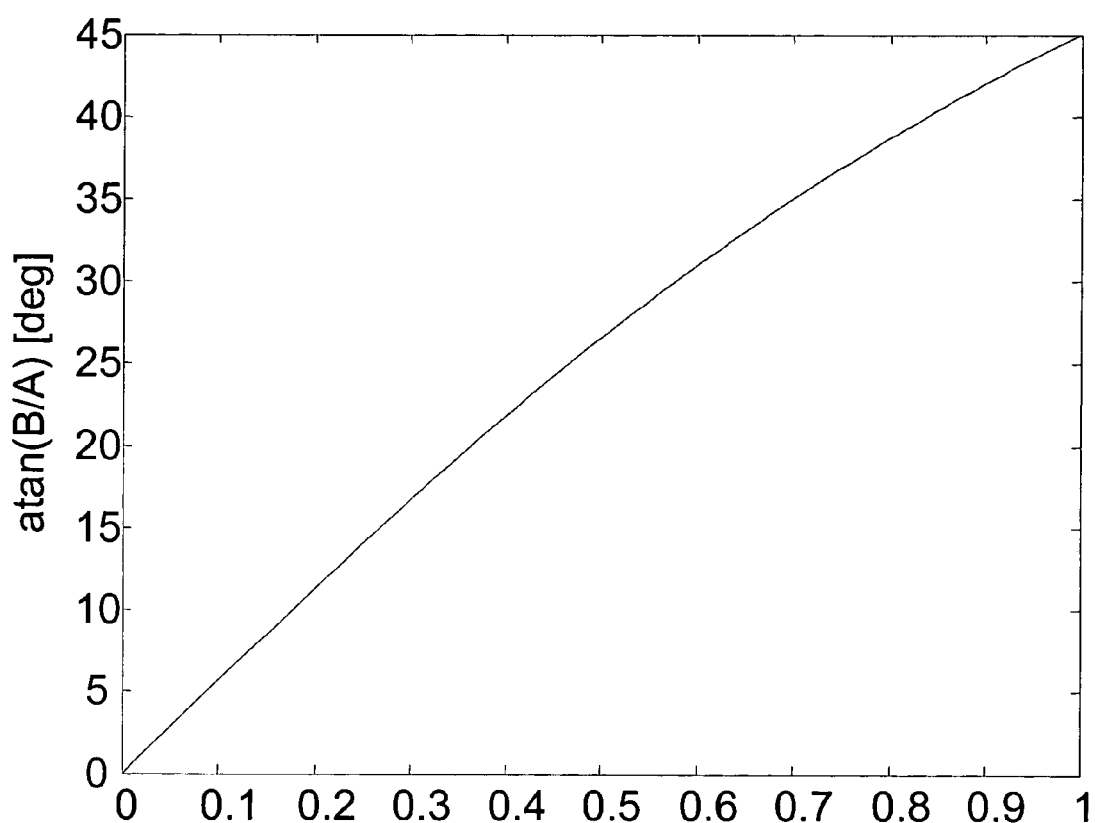

The orientation angle $\alpha$ (FIG. 43) cannot exceed the value atan(B/A) (see FIG. 47). As design rule, one has, for B/A<0.5

$$\text{atan}\left(\frac{B}{A}\right) \approx \frac{B}{A}.$$

Figure 48:
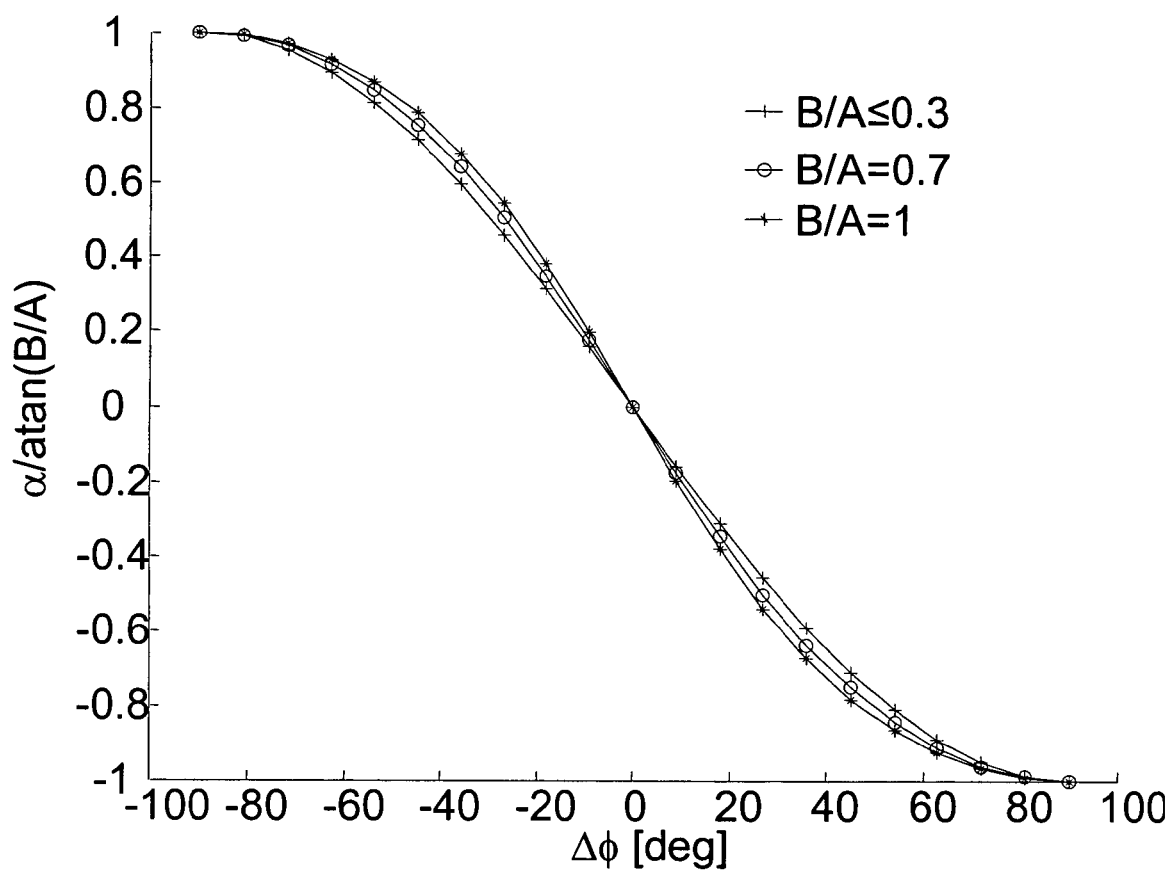

The angle $\alpha$ can for sufficiently small ratios B/A be approximated by (see FIG. 48):

$$\tan(\alpha) = -\frac{B}{A}\sin(\Delta\varphi).$$

The following example illustrates the usage of the previous material. Assuming that B/A=0.3. From FIG. 47 we find that atan(B/A)≅15°. It follows then from FIG. 48 that for $\Delta\phi$=45°, $\alpha$≅0.8*15°=12°. FIGS. 45–46 indicate that b/B≅0.7 and a/A≅1.025.

This information illustrates how to change A, B and $\Delta\phi$ together in a way that preserves or achieves various properties of the ellipse 100. In the previous example, the changes can be made such that the angle of inclination $\alpha$ (FIG. 1) between the longitudinal axis 25 of the vibratory element 26 remains close to 12 degrees in order to achieve a large translation of the driven element 42. The changes may also be made to ensure that $2b$, the length of the minor axis of the ellipse 100 (FIGS. 1, 43) remains larger than a given value in order to ensure the vibratory element 26 causes the selected contact portion 44 to disengage from the driven element 42 sufficiently to not only avoid undesired movement of the driven element 42, but to avoid unacceptable wear of the driven element 42. Over a relatively wide parameter range a desired ellipse 100 can be achieved that is particularly useful for moving a driven element 42 in the present invention. In the example above, the driven element 42 would be preferably oriented in an angle of 12 degrees to the $E_x$-direction. But it should apparent to one skilled in the art that the optimal angle is in general not restricted to this value.

Referring to FIGS. 1, 43 and 49–51, it is also advantageous to consider the influences of a coordinate transformation from the coordinate system having an axis aligned with the longitudinal axis 25 of the vibratory element 26, to the coordinate system corresponding to the elliptical motion of the selected driving portion 44. This can illustrate useful affects on the frequency response curves and therefore on the performance and design of the motor assembly 20. FIG. 43 illustrates the motor coordinate system defined by axes $E_x$ and $E_y$, where the $E_x$ axis corresponds to the longitudinal axis 45 of the driven element 42 (FIG. 1). The ellipse 100 is believed to be generated by a first and a second motion component of the selected driving portion 44 on the vibratory element 26 of FIG. 1. The localized axes of the ellipse 100 are represented by axes $e_x$ and $e_y$.

For example, we assume the first component of motion lies in the $E_x$-direction and has a transfer function that in the vicinity of a selected frequency can be approximated by a constant amplification factor $g_1(s)=A$. The second component of motion lies in the $E_y$-direction and has a transfer function that in the vicinity of a selected frequency can be approximated by a second order resonator given by its Laplace transform:

$$g_2(s) = \frac{k}{s^2 + 2e\omega_o s + \omega_0^2}.$$

Here $\omega_0$ is the (undamped) resonance frequency, and e is a dimensionless damping parameter arising inherently from damping in the mechanical system, i.e., the motor assembly 20 in this case.

Figure 49:
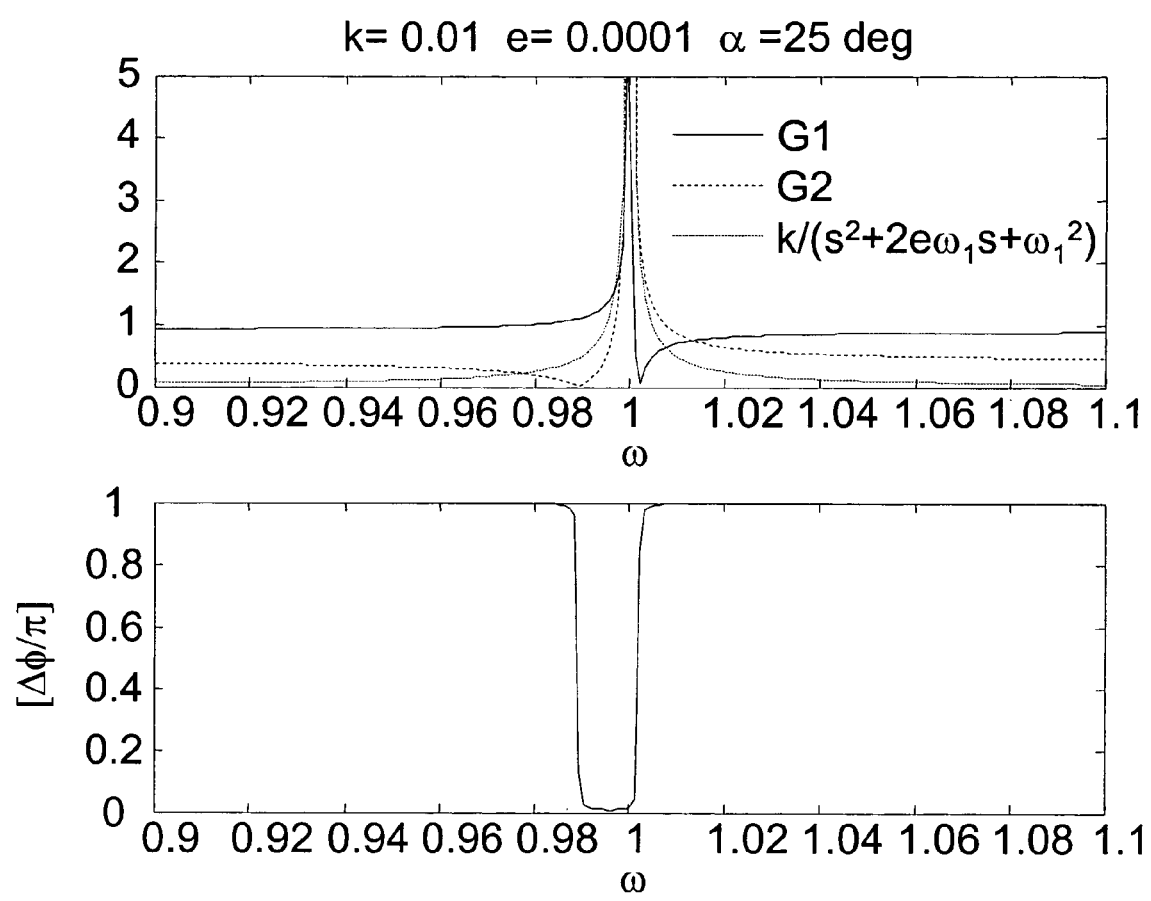
Figure 50:
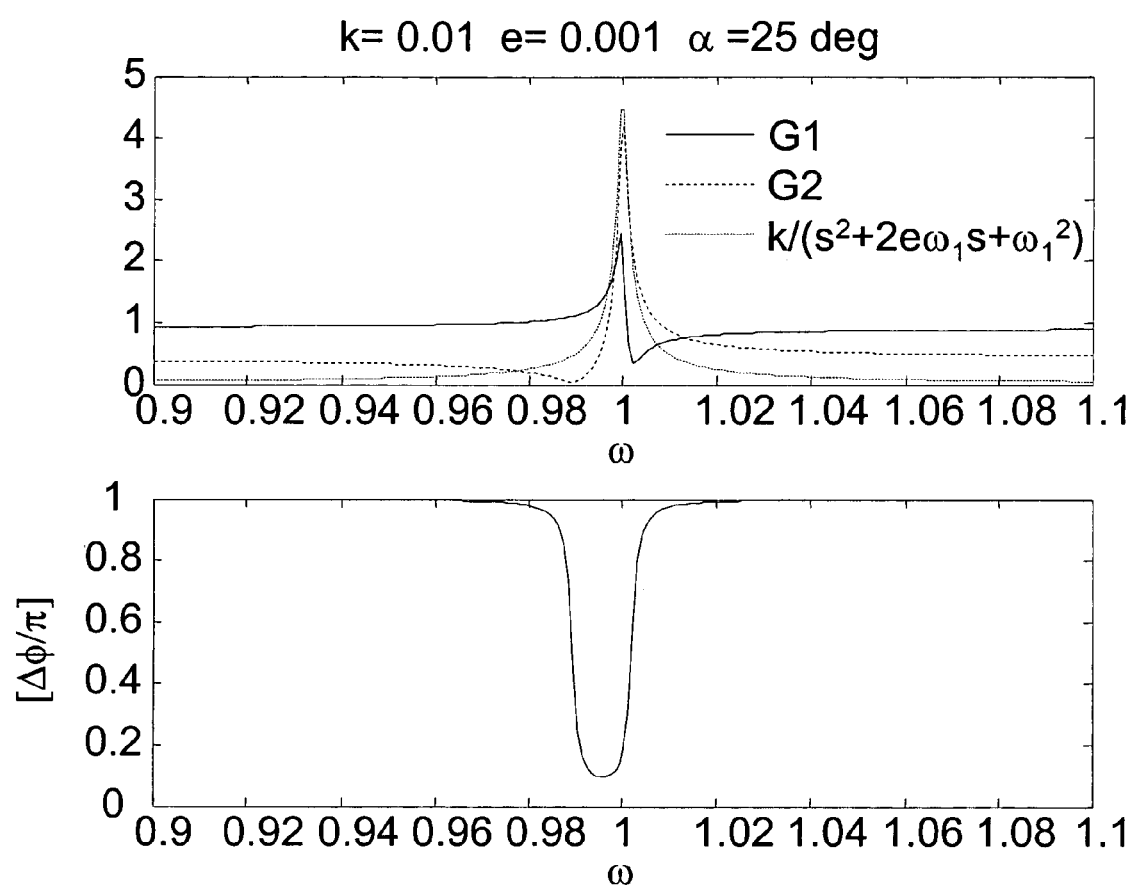
Figure 51:
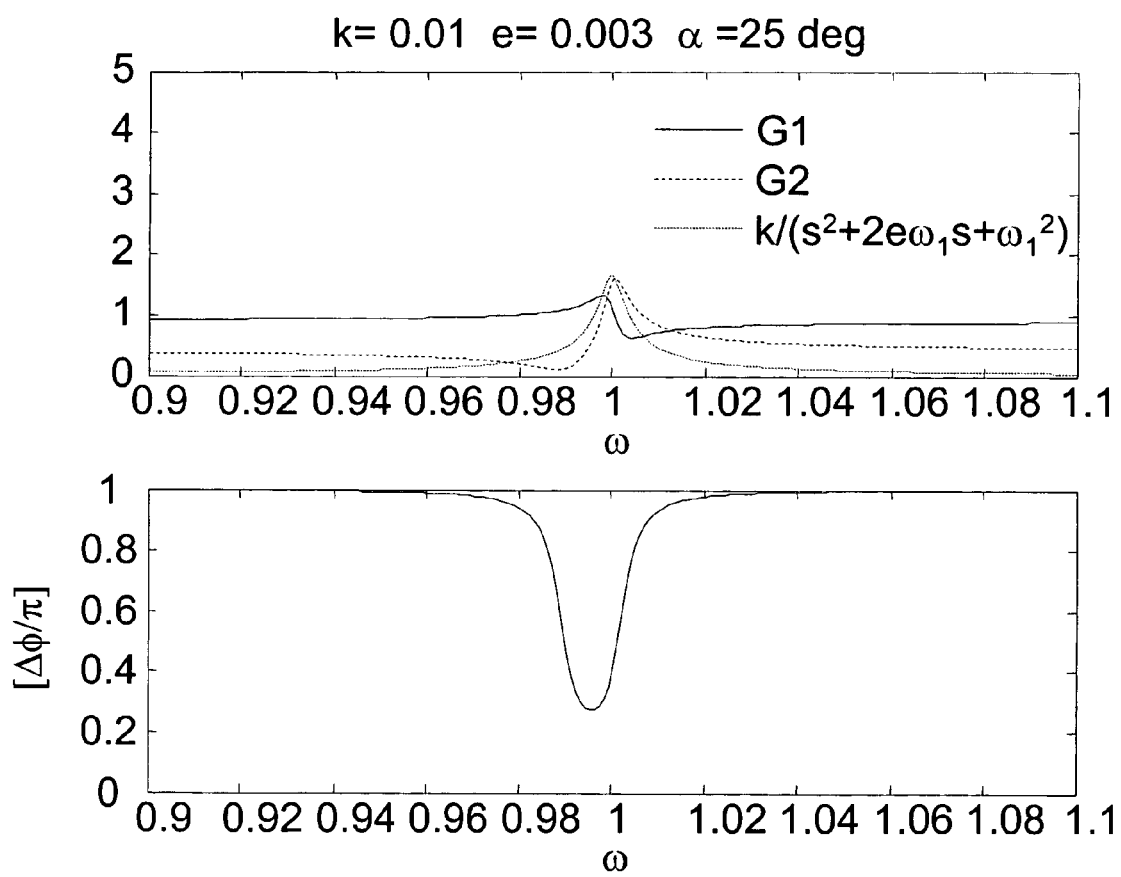

The superposition of $g_1(s)$ and $g_2(s)$ yields transfer functions $G_1(s)$ and $G_2(s)$ in the $e_x$ and $e_y$ directions, respectively. For illustration, examples are given in which A=1 and $\omega_0=1$. FIGS. 49–51 depict $G_1(s)$ and $G_2(S)$ for k=0.01 and $\alpha=25$ degrees. The parameter e increases from FIG. 49 to FIG. 50 to FIG. 51. The combination of these two signals results in a behavior where the phase difference $\Delta\phi$ between $G_1(s)$ and $G_2(s)$ undergoes an intermittent change that becomes more rounded as the damping in the system increases. This effect results in an expanded frequency range where the relative phase difference lies between 0 and 180 degrees, which makes it easier for a resonant frequency to be found that results in a useful, elliptically shaped motion. This frequency range is considerably wider than what would be achieved with the transfer function of a simple second order oscillator. Such a particularly widespread phase range can be used in conjunction with other design aspects to help select the shape and orientation of the resulting ellipse 100 as the selected driving frequency is changed.

The influence of the above coordinate transformation becomes more involved as $G_1(s)$ and $G_2(s)$ are replaced by higher order, and more realistic, transfer functions as they arise from the piezoelectric motor assembly 20. Such transfer functions can create relative phase shifts $\Delta\phi$ between $G_1(s)$ and $G_2(s)$ that fluctuate between 0 and 180 degrees in even wider frequency ranges, thus rendering the motor assembly 20 even less dependent on production tolerances, material properties, temperature variations, and other manufacturing factors and criteria.

This phase shift between the longitudinal and lateral motion is used to achieve the desired elliptical motion. Phase shifts of between 3 and 177 degrees are believed well suitable to achieve useful motion at the selected contacting portion 44. A 90 degree phase shift results in a circular motion if amplitudes are equal. Preferably, but optionally, the phase shift results in non-circular motion of the selected contacting portion 44 in order to obtain greater movement along the major axis of the elliptical motion.

The portion of the ellipse 100 below the $E_x$ axis can be thought of as reflecting the engagement of the driving portion 44 with the driven element 42. By altering the shape of the ellipse 100 (i.e., 2a, 2b measured along $e_x$ and $e_y$) the duration of the engagement can be varied and to some extent the pressure of that engagement can be varied. Further, by altering the orientation of the ellipse 100 (i.e., the angle of inclination α between the axis 45 of the driven element and the major axis of the ellipse) the duration of the engagement can be varied. As the angle of inclination α comes closer to aligning the ex axis with the $E_x$ axis, the duration of the contact between the driving portion 44 and driven element 42 increases.

For practical reasons, the longitudinal axis of the driven element 42 may often be placed between the two axes $E_x$ and $e_x$. But the more important aspect is that these equations show that as the excitation frequency of the piezoelectric 22 changes, the amplitude and phase of the selected driving portion 44 (i.e., ellipse 100) change. This shows the ability to alter the amplitude and orientation of the ellipse 100 and thus alter the characteristics of the motion driving the driven element 42. Moreover, the equations reflect an ability to offer these variations over a wide range of amplitudes and frequencies which offers a flexibility in functional design characteristics of the piezoelectric 22 not previously available. Further, the equations reflect the ability to vary the engagement criteria to a sufficient extent that the manufacturing tolerances can be less, and potentially significantly less than with many of the existing motors using piezoelectric drives.

Historically, these various manufacturing criteria have been so precise that they result in costly manufacturing of piezoelectric vibratory elements 26, and the motors have narrow operating ranges and criteria. Thus, the ability to use more liberal criteria offers the possibility of significant cost savings in producing the motors while offering wider operating parameters.

The direction of the motion of the driven element 42 depends on the relative orientation of the driven element 42 and the direction of the selection contacting portion 44 as it moves around its elliptical path of travel 100. Different points of the vibration element 26 can show different vibration shapes. Typically areas with clockwise and counterclockwise motion around elliptical paths 100, alternate along the length of the vibration element 26. The driving direction of a rod shaped vibration element 26 can typically be reversed by turning the vibration element by 180 degrees about longitudinal axis 25.

The shape of the motion of the contact point 44 is important to this invention. This shape must achieve more driving force in one direction than in the other. This is typically achieved by increasing the contact pressure while the selected contact portion 44 moves in the direction the driven element 42 gets moved. When the contact portion 44 moves in the opposite direction the contact pressure is reduced or the contacting portion 44 even looses contact with the driven element 42. One important aspect is how to generate the appropriate motion.

Because of mechanical noise and unwanted vibrations, the shape of the ellipse does not always follow the ideal theoretical path. This may result in the selected contacting portion 44 sometimes performing motions that are undesired, such as figure-eight shaped motion. But these motions may nonetheless regularly appear with the vibrator element 26. They are, however, not used to drive the driven elements 42. This is clarified in the discussion of the three-dimensional vibration shapes of the contacting portion 44.

In the description only the two-dimensional shape of the vibration will be addressed. In actuality the contacting portion 44 will have some slight motion in the third dimension, the direction perpendicular to both directions of the driving force along axis 25 and the direction of the contact force between vibration element 26 and driven element 42 which is generally along axis 45. These vibrations might also contain higher frequency components. As a result the motion of the contact portion 44 could look like a figure-eight motion if projected into certain planes. Although this figure-eight motion can be observed, it is not relevant for the operation of the vibratory element 26 driving the driven element 42 and is merely a side effect of unused motion.

Ideally, the major axis of the elliptical motion 100 is perfectly aligned with the direction in which the driven element 42 moves in order to optimize performance. Perfect alignment is difficult to achieve for many reasons, including manufacturing tolerances and performance variations. Further, even the elliptical path 100 is not perfectly elliptical and may vary over time. Variations in voltage, current, power disruptions or fluctuations, degradation over time, electrical noise, mechanical noise, electromagnetic interference, to name a few, can affect the shape and smoothness of the elliptical paths 100. Thus, it is desirable to be able to configure a system that can accommodate a practical range of variations in order to reduce manufacturing costs and assembly costs, and to produce a system that can accommodate environmental variations and other variations that arise during use of the system. Because of such variations, an alignment of about 0–5 degrees will be considered to be aligned, in part because in most instances this variation from perfect alignment does not substantially affect the performance of the systems disclosed herein.

The vibrator element 26 does not rely on traveling waves for the movement of the selected contacting portion 44. But any mechanical wave existing in material also travels through it. In the present invention such waves get reflected at some part of the vibration element 26 causing another traveling wave that superimposes with the first one. This results in a standing wave, and in some instances this standing wave can be used in connection with a selected contacting portion 44. Several prior art motors require a wave that is not standing, but rather traveling—with the driven object moving with or being moved by the traveling wave. The traveling wave is different from the standing wave.

Practical Design Aspects:

The contacting portion 44 is the point of the vibrating element 26 that comes in contact with the driven object 42 in order to move the driven object. That contacting portion is typically a portion of the resonator 26, and is preferably on the distal end 36 of the resonator. The power of the motor assembly 20 to move heavier driven elements 42 and the efficiency of the motor assembly 20 are functions of the periodic motion of the contacting portion 44 and of the force between the contacting portion 44 and the driven element 42.

The spatial motion of the selected contacting portion 44 is the result of the superposition of several vibration modes of the motor. These modes are all excited, to varying amplitudes and relative phases, at the same frequency generated by the piezoelectric element 22. Their contributions to the desired motion of contacting portion 44 and forces applied by contacting portion 44 are a function of the relative magnitudes and the relative phase angles of each of these several vibration modes. These vibration modes in turn are functions of the motor geometry, constitutive relations, and the material properties.

In order to increase the performance of the motor assembly 20, the following guidelines may be used. Preferably all of the following guidelines are simultaneously satisfied at the selected contact portion 44 in order to optimize the performance of the motor assembly 20, but compromises of one or more of these guidelines can occur if the resulting motor performs satisfactorily.

The motion of the selected contacting portion 44 is elliptical with major and minor axes of lengths a and b, respectively. As used here, and unless specified otherwise, the reference to elliptical motion or to an ellipse includes ellipses with the major and minor axes are equal, which forms a circle. The reference to elliptical motion or to an ellipse also includes ellipses in which either of the major or minor axes are small relative to the other axis, which results in a very elongated ellipse approaching a straight line.

The major axis of the ellipse is preferably aligned with the driving direction of the driven element 42. The length of the major and minor axes, a and b, are both large enough to achieve their desired uses, and preferably large enough to provide optimum performance for the selected application. The generally preferred elliptical shape has an elongated major axis "a" relative to the minor axis "b" in order to increase speed, and has a minor axis "a" sufficient to disengage the contacting portion 44 from the driven member 42 during the return portion of the ellipse, as discussed next. As discussed above, ratios of about 3:1 up to 150:1 or even greater are believed usable, although the higher ratio's provide more linear motion and result in more impact motion with the driven element.

The force at the selected contact portion 44 normal to the contact surface on driven element 42 is large when the contacting portion 44 moves in the driving direction, and small (or zero), when the contact portion 44 moves against it. If the force is zero, the contacting portion 44 has lost contact with the driven object 42. In that lost-contact case, the backward motion of the vibratory element 26 tip is very efficient, but the motor assembly 20 also loses traction during that period of time. This loss of traction should be considered when evaluating motor efficiency and strength. If the normal force is too large when the contact portion 44 moves against the driving direction, the driven element may not be properly transported in the driving direction, which results in a loss of performance.

Moreover, the normal contact force between the selected contacting portion 44 and the driven element 42 is a measure of the friction force between the contacting portion 44 and the driven object 42. Larger normal forces provide the motor assembly 20 with stronger thrust. But the wear occurring over the repeated contact from the many thousands of cycles of elliptical travel must also be considered. Larger contact areas on the contacting portion 44 have the advantage of tolerating more defects in the surface of the driven element 42 that engages the contacting portion 44.

In the embodiments thus far disclosed, the selected contacting portion 44 is often illustrated as being located on one edge of the distal end 36 of the vibration element 26, in part because the desired elliptical motion can be readily achieved at that location. Moreover, the edge location provides a narrow area of contact and good frictional engagement. But it is not necessary that the selected contacting portion has to be located on an edge. Moreover, typically some material wear will wear out the edge and provide a flat or flattened contact surface 44 after some period of use. This wear typically does not affect the operation or use of the motor assembly 20. As discussed elsewhere, the contact portion 44 can also be located at other places on the vibration element 26. For example, the contact portion 44 could be located on the side of the vibration element 26 as in FIG. 62. The selected contacting portion 44 does not have to be a point contact. The particular applications will thus influence the size and location of the selected contacting portions 44.

The displacement of the contacting portion 44 in the driving direction and the normal contact force are not in phase. These two quantities form an ellipse when plotted in a displacement/force diagram. The orientation of the major axis of this ellipse with respect to the displacement axis provides another design parameter. Depending on this orientation, the maximal contact force is generated earlier or later during the forward motion of the tip. In a certain sense this could be interpreted as somewhat analogous to a saw-tooth-like movement. Because useful motion can be achieved when one semi-elliptical axis of the elliptical path 100 is about 5, 10 or more times greater than each other axis, even relatively small motions can be of potential use for one of the semi-axes.

The motion of the selected contacting portion 44 is the result of the vibrations of the entire motor assembly 20 and its components. Large motions of the selected contacting portion 44 are achieved if the excitation frequency lies close to a resonance frequency of the system, and if the selected contacting portion 44 is located where a large amplitude occurs. In order for the motion of the selected contacting portion 44 to be multi-directionally large, the motor assembly 20 is advantageously designed to have several resonance vibrations clustered in a selected frequency range. For example, if the natural frequency of a bending mode is close to that of a longitudinal mode, and the excitation frequency lies in between the frequencies that excite these bending and longitudinal modes, then the resulting motion of the selected contacting portion 44 will have moderately large amplitudes. The elliptical nature of the motion of the selected contacting portion 44 is generated by the phase difference of the respective motions. The phase difference is generated in part by the damping in the system. Various combinations of these factors can be used to achieve the desired motion of contacting portion 44 and to achieve other criteria of the motor assembly 20, such as power, reliability, wear, etc.

The absolute and relative locations of the resonance frequencies and vibration modes of the motor assembly 20 are affected by a multitude of parameters. The following factors can be used to configure an acceptable design of the motor assembly 20.

Lower vibration modes are generally stronger than higher vibration modes because the lower vibration modes store relatively less elastic energy, leaving more energy for driving the object 42 through the selected contacting portion 44.

The location of the longitudinal resonance of the vibrating element 26 in a frequency diagram is affected mainly by the length of the piezoelectric 22 and resonator 24 and by the material properties of the parts. The first longitudinal mode is by far the strongest and therefore the more desirable mode to use.

The location of the longitudinal resonance of the vibratory element 26 in a frequency diagram can further be affected by the motor suspension, i.e., by the spring steel support 50 (FIG. 1) or other mechanisms that connect the vibratory element 26 to its housing. If a natural (resonance) frequency of the support such as spring 50 is brought close to the longitudinal resonance frequency of the vibratory element 26, it has the effect of splitting the longitudinal frequency into two frequencies which are close to each other. The phases of the modes fluctuate strongly between 0 and 180 degrees in these resonance areas. Resonance splitting can therefore be used to spread the working region of a motor over a wider frequency range, making the motor therefore more robust.

Phase differences other than 0 and 180 degrees are induced by damping mechanisms. In order to expand this effect over wider frequency areas, additional damping elements such as damping layers can be added to the vibratory element 26, or to various portions of the motor assembly 20. Also, internal damping is affected by the material properties of the piezoelectric 22 and resonator 24 and by the way in which they are assembled. These factors in turn can be affected by the material's history, i.e., its manufacturing process.

Moreover, whether the damping is inherent in the system materials or added by design components, the damping can be used so that a primary resonance mode is used to excite a secondary vibrational mode that results in the desired elliptical motion of a selected contacting portion 44 along path 100. Recall that the elliptical semi-axes can have amplitude ratios of 5, 10 or more, such that a vibration mode excited by damping need only have an amplitude of ⅕, ⅒ or so of the amplitude resulting from the primary vibrational mode. Because damping can couple vibration modes, the damping can be used to achieve the desired elliptical motion of the selected contacting portion.

Bending resonance vibration modes are affected mainly by the length and cross-sectional areas and shapes of the piezoelectric 22 and resonator 24 and also by the material properties of those parts. Lower resonance vibration modes are stronger than higher ones. Guidelines for placing and splitting of resonance longitudinal vibration modes also apply to bending modes.

Shearing resonance vibration modes can contribute to the longitudinal motion of the selected contacting portion 44, especially if the contacting portion 44 is located at a distal end 36 of the vibratory element 26 and on an edge of the distal end. The shape of the cross-sections of the resonator 24 affects these resonance vibration modes, as does the placement of the piezoelectric 22 relative to the resonator 24. Further, as an example, see FIG. 2. If the longitudinal axis of the piezoelectric 22 is appropriately offset from the longitudinal axis of the resonator 24, an edge of the distal end 36 can have a shearing resonance that causes opposing edges at distal end 36 to pivot about axis 40. Removing material close to the centerline of the motor can have an especially strong effect on this resonance mode. One configuration with material removed along the centerline is shown in FIG. 52, and described later.

Torsion resonance vibration modes can be used to support selected, and preferably vertical motion of the selected contact portion 44 if the portion 44 is close to a side of the vibratory element 26. The torsion resonant vibration modes are usually of smaller magnitude than other vibration modes, but they offer the possibility of using various portions along the length of the vibratory element 26 to drive various objects. Torsion resonant vibration modes could be used to rotate the driven element 42 in the embodiments of FIGS. 23, 25, 27, 28, 29, 30, 32 and others. Torsion resonant vibration modes could be used to translate the driven element 42 in the embodiments of FIGS. 38–40.

Resonant vibration modes arising from cross-sectional contraction are of little benefit when the driven element is elongated, such as the rod-like driven element 42 depicted in FIG. 1. The cross-sectional contractions appear at frequencies that are too high to produce readily usable amplitudes. Cross-sectional contraction is governed by the Poisson-effect. This effect is strongest where the longitudinal strains in the piezoelectric element 22 or resonator 24 motors are the highest, i.e., where the stresses are highest. Cross-sectional contraction can therefore be large where the piezoelectric element 22 is connected to the resonator or whatever frame is holding the piezoelectric element and the portion of that connection in which the forces are high. This contraction can drive the bending vibrations of the thin sidewalls 29 (FIG. 1) of the resonator 24. If the bending resonant vibration modes of the sidewalls 29 are tuned to the longitudinal vibration mode of the vibratory element 26, yet another splitting of natural vibration frequencies can occur with similar benefits as mentioned above.

The piezoelectric element 22 generates predominantly longitudinal forces in the resonator 24 within which it is mounted. Coupling of these longitudinal forces from the vibratory element 26 into directions other than along longitudinal axis 25 creates a number of other possible vibration modes within the vibration element 26, such as bending, shear and torsion. The intensity of the coupling of the longitudinal motion with other vibratory motions within the vibratory element 26 can determine the relative amplitudes of the various modes of the vibratory element 26 and therefore their relative contributions to the motion of the selected contact portion 44. Coupling can be generated by material properties, geometric imperfections and asymmetries within the components of the vibratory element 26, primarily the piezoelectric 22 and the resonator 24.

Some of these coupling effects are often poorly defined, difficult to analyze, and hard to measure or design. Well-defined mechanisms are therefore preferable. These mechanisms include mounting the piezoelectric element 22 off-center of the longitudinal axis 25, or at an angle to the longitudinal axis 25 of the vibratory element 26, or using flexible mountings for the vibratory element 26 such as a spring 50 or similar elements. In the case of a spring 50, the longitudinal motion of the vibratory element 26 generates bending in the spring 50. The end 50b of the spring that is clamped to the vibratory element 26 is forced to bend or possibly to twist. This bending or twisting causes bending moments to be generated in the vibrational element 26. The configuration of the spring 40 could be used to vary the vibrational mode, as for example by introducing bends, edges and similar modifications into a flat metal spring. Furthermore, the spring 50 can be made more flexible at specified locations to better define an axis of rotation about the flexible portion, if that is useful to the design. Coupling of vibration modes within the vibratory element 26 can also be achieved if the piezoelectric element 26 is selected or configured or excited to perform other than pure longitudinal motions.

Several additional factors are preferably considered in configuring the vibratory element 26 and the motor 22. These factors include: the orientation of ellipse 100 in which the selected contact portion 44 moves when it is not in contact with anything; the orientation of the force-displacement ellipse of the contact portion 44 when it is in contact with the driven element 42; and an estimate of mechanical power generated at the selected contact portion 44 when it is in contact with the driven element 42.

Reversing Direction

If a principle of operation of the vibration element 26 is known to transport the driven object 42 in one direction at a first frequency, it is desirable to use the same principle of operation at a second frequency to transport the driven object in the opposite direction. Such a design is not only useful for vibration elements that operate using elliptical motion, but also for vibration elements that operate on other principles. The vibration modes of the vibration element 26 that produce the transporting motion in the contacting portion 44 at the first frequency are not necessarily the same as those that produce the transporting motion at the second frequency, nor are they necessarily of the same type.

It is an advantage of such a multi-directional design that—provided the vibration element 26 is appropriately designed—the same mechanical components that are necessary to achieve unidirectional movement can be used to achieve bi-directional movement at two distinct operational frequencies. In particular, a single vibration source 20, e.g., a piezoelectric element, is sufficient.

The realization of a multi-directional design is simplified if the axis 25 of vibration element 26 is oblique to the direction of transport of driven element 42. Also, in many cases the shape of the motion of the contacting portion 44 at either operational frequency may not be optimal to achieve maximal force or speed of transport, but only a compromise to achieve suitable bi-directional performance. Furthermore, the frequency range within which the vibration element transports in one direction is not necessarily as large as the range within which it transports in the other. Testing has shown that a frequency range of 5 kHz at a first frequency and at least 300 Hz at the second frequency are possible to move or transport a driven element in opposing directions.

Illustrative Designs

Various modifications on the design of the resonator 24 holding the piezoelectric element 22 are possible to enhance the performance of the vibratory element 22. The following implementations are some possibilities. Combinations of these following embodiments, and of the prior embodiments, are possible. All combinations of methods for clamping the piezoelectric element 22 and of the various mounting methods are also believed possible.

FIGS. 52–55 show a vibratory element 26 having a resonator 24 with a slot 112 extending from adjacent the cavity 28 to adjacent the distal end 36, and extending through the resonator, along the direction of longitudinal axis 25. The slot 112 preferably has rounded ends and parallel sides. But the slot could have rectangular shaped ends. There are advantages to using longer, narrower 112 compared to wide slots as shown in FIG. 54. The narrower slots 112 result in beams 114 with larger dimensions, so that manufacturing tolerances have less effect on the resulting vibration. If the slots 112 are large, the walls 114 are usually smaller in dimension so that errors in manufacturing have a larger effect on the vibrational performance.

The slot 112 preferably opens onto the same surfaces of the resonator 24 as does the opening 28. But this need not be so, as the slot could open onto other surfaces of the resonator 24 depending on the vibrational modes and configurations that are desired. FIG. 55 shows the slot 112 opening onto a lateral surface turned 180 degrees from the orientation of the opening 28. Various angular orientations are possible, especially if the resonator 24 has a cylindrical body shape. The slot 112 creates a resonator with two beam segments 114a, 114b, on opposing sides of the slot, each of which forms a portion of resonator 24.

In FIGS. 52–54, the slot 112 is illustrated as fairly symmetrically located in order to produce side-beams 114 of approximately equal dimension with close vibrational modes and frequencies. But the slot 112 need not be symmetrically located as reflected in FIG. 55, and can be located to produce beams 114a, 114b of very different dimension and with different resonance frequencies. Moreover, more than one slot 112 can be used.

The slot 112 in the resonator 24 can thus create an increased number of beams 114 in the resonator, with each beam vibrating at its own eigenfrequencies and selected for that very reason. The increased eigenfrequencies leads to an increased number of phase shifts of the vibrations in the resonator 24. By having two almost identical beams 114a, 114b with eigenfrequencies very close together, it is also possible to get a wider frequency range with high amplitudes.

The slot 112 also changes the mass distribution of the resonator, the bending of the resonator, and the shear stiffness of the resonator 24. Each of these changes has an influence on the resonant frequencies and resonant vibration modes of the resonator 24 and of the vibratory element 26. This gives a flexibility of design that allows a broader range of frequencies to excite the requisite vibration modes of vibratory element 26 while allowing lower manufacturing tolerances.

In FIG. 53, the opening 28 for the piezoelectric element 22 has rounded ends rather than flat ends over the portion that abuts the piezoelectric element 22. The contact area between piezoelectric element 22 and the end of the opening 28 comprises two lines when the piezoelectric element has a square or rectangular cross-sectional area. This can provide a more defined contact. If the opening 28 is formed by a wall abutting the piezoelectric element 22, the wall is typically not perfectly flat and not perfectly orthogonal to the longitudinal axis 25. Moreover, the end of the piezoelectric element 22 is not perfectly flat and not perfectly orthogonal to the centerline (e.g., longitudinal axis 25). Thus, when the end of the piezoelectric element 22 abuts the walls (e.g., end walls 31) defining the opening 28, it is possible that the piezoelectric will not be compressed along its centerline, with the result that the piezoelectric will be compressed along an offset axis or a skewed axis. The offset axis or skew axis can result in a variation of vibrational modes. Alternative ways of resolving this contact location are discussed relative to FIGS. 9–16.

FIG. 56 shows an embodiment with two slots, on each side of the opening 28, along the piezoelectric element 122. The slots 112 open into the opening 28 to form an "H" shaped configuration with the piezoelectric element 122 mounted at the center of the "H". This configuration makes it easier to press-fit the piezoelectric element 122 into the resonator 24 since the sidewalls 29 can take more deformation before necking begins.

FIG. 57 shows an embodiment in which the opening 28 is formed in one leg 114 defined by centrally located slot 112, resulting in the leg 114a being divided for a portion of its length into further legs 114c. Configurations such as this can have a high shear contribution to the motion at the selected contacting portion 44, which is illustrated as being aligned along the axis of leg 114a. A different selected contacting portion 44b on leg 114b could be used to drive a different element at a frequency other than that used to activate the driving mode of leg 114a. A third potential contacting portion 44c on the leg 114 could represent yet another frequency to yet another driven element when activated. This is another illustration that the selected contacting portion 44 need not always be at the same location on the vibratory element 26, as it will depend on a variety of factors, including the number, configuration and arrangement of the vibratory element(s) 26 and the configuration of the driven element or elements motor assembly 20.

FIG. 58 shows an embodiment having a hole 116 in the resonator 24. The hole is shown extending along the longitudinal axis 25 of the vibratory element 26, but it could be located off-axis, or skewed relative to that axis 25. The hole 116 is shown as opening onto the distal end 36, but it could be formed on any of the surfaces of the resonator 26. The hole 116 is preferably cylindrical and results from drilling of the hole as close tolerances can be maintained at low cost with such holes. But other shapes could be used, as a drilled hole can be broached to achieve various cross-sectional shapes. The diameter of the hole 116 can vary depending on the desired effect, as the hole changes the mass distribution by removing material, and it changes the stiffness of the material remaining after the hole is formed.

FIG. 59 shows an embodiment with a larger mass behind the piezoelectric element 122, located between the piezoelectric element 122 and the proximal end 35 of the resonator 24 that is opposite the distal end 36. This extra mass enhances the vibration of the distal end 36 of the vibratory element 26 and is useful when the selected contacting portion 44 is on the distal end 36.

FIG. 60 illustrates an embodiment with multiple sidewalls 29. It is possible to not only have solid sidewalls 29 next to the piezoelectric element 22, but it is also have a more complex sidewall configurations.

Figure 61:
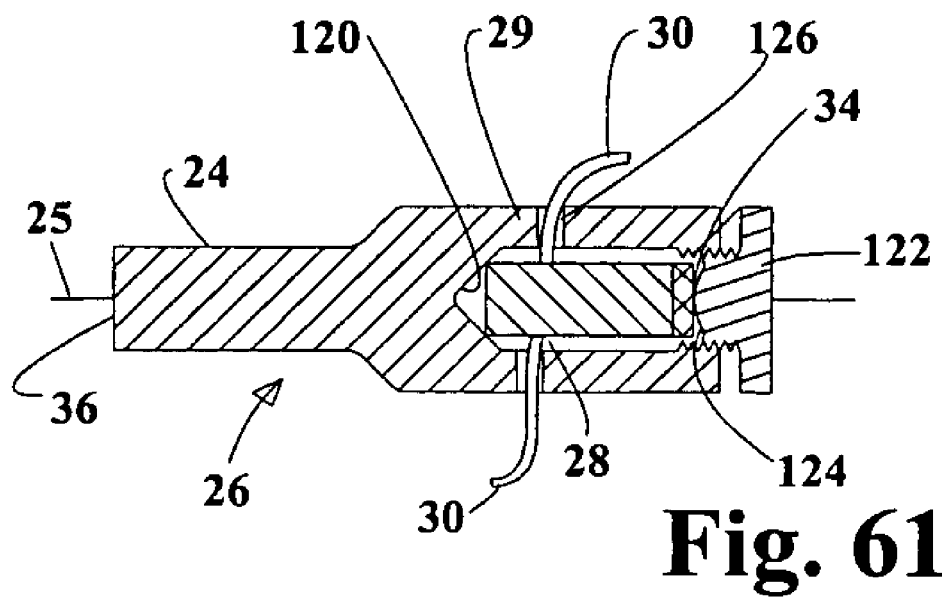
FIG. 61 is a cross sectional view of a vibratory element enclosing the piezoelectric element in a cavity within the resonator.

FIG. 61 shows a further embodiment in which the piezoelectric is substantially enclosed and surrounded by the frame. This configuration is akin to inserting batteries into a flashlight. The opening 28 comprises a close-ended hole, with the end 120 of the hole having either a conical shape or a flat shape depending on the drill used to create the hole. A cap 122 threadingly engages corresponding threads on the end of the hole 28 to compress the piezoelectric element 22 placed in the hole. The cap 122 is shown as having a curved end 124 to abut the cap 34 on the abutting end of piezoelectric element 22 and create a point contact. Preferably, one or more small holes 126 are formed in the sidewalls 29 defining the opening 28 so that the electrical wires 30 can be connected to the piezoelectric element 22. But other ways of providing electrical connections can be devised. The end 120 against which the piezoelectric element 22 abuts forms an area contact if the bottom 120 is flat; it forms a four point contact if the cross-section of the piezoelectric or any protective cap 34 (not show) is square; and it forms a line contact if the cross sectional area of the piezoelectric or any protective cap 34 (not shown) is round.

Preferably the resonator 24 is machined or cast of non-ferrous metal, preferably aluminum. The resonator could be sintered of appropriate materials. Moreover, it is believed possible that the resonator could comprise two separate sections joined by an appropriate adhesive to opposing sides of the piezoelectric element 22. Further, the resonator 24 could be formed of a suitable ceramic material. If formed of a ceramic material that is sintered, the resonator could be sintered directly to the piezoelectric during the sintering of the resonator 24.

Suspension of the Driven Element: The driven element 42 is preferably suspended so that it can move relative to the vibratory element 26 and support or move a desired load. Usually the load is moved by pressing a portion of the driven element 42 against the load, as for example a fiberglass rod connected to a CD tray that is moved reciprocally in and out of a housing by a linear motor assembly 20. But in some situations the driven element 42 itself may be the desired load. The driven element 42 can be suspended on bearings. Less expensive methods are to suspend the driven element on small wheels, or to use bushings as linear bearings. The bushings are believed to work well with rod-like driven elements 42. A low friction and stiction coefficient between the bushings and a glass or fiberglass rod reduces the performance loss of the motor assembly 20 due to friction. Self-lubricating bearings are desirable to further reduce friction losses. Other methods are possible. Other driven objects like a wheel or a ball also easily be suspended on an axle.

When the driven element 42 comprises a rod, it can also be suspended on at least four balls such that the rod can move linearly. The stiction of such a mounting using four Delrin balls is believed to be less than with four ball bearings. The balls preferably need to run in grooves in order to transfer radial loads applied to the balls by the rod. Thus, the rod could be grooved to provide a driven element 42 with longitudinal grooves in it when the configuration of the motor assembly 20 is arranged to translate the rod. The orientation of the grooves would change depending on the desired movement of the rod or driven element 42. Further, the length of the grooves could limit the motion of the rod.

A plate driven by the vibratory element 26 could also be suspended on at least three balls. This would give the motion of the plate three degrees of freedom. Other methods are possible.

The driven element 42 could be suspended in a manner that resiliently urges it against the selected contacting portion 44, using principles discussed above for mounting the vibratory element 26. One resilient support is discussed regarding FIG. 6 above.

Electronics

A number of different electronic circuits can be used to drive the piezoelectric element 22 of vibratory element 26 since the motor 26 is functional with a variety of different signal shapes applied to the piezoelectric element 22, as long as the power spectrum of the input signal provides a substantial amount of vibratory energy at the desired driving frequency sufficient to achieve the desired motion of the selected contacting portion 44. This ability is an advantage over those prior art motors that require specialized, more expensive electronics to generate special waveforms, such as, for example, saw-tooth waveforms. Some specific examples of driver circuits are shown in FIGS. 63 to 66.

Figure 63:
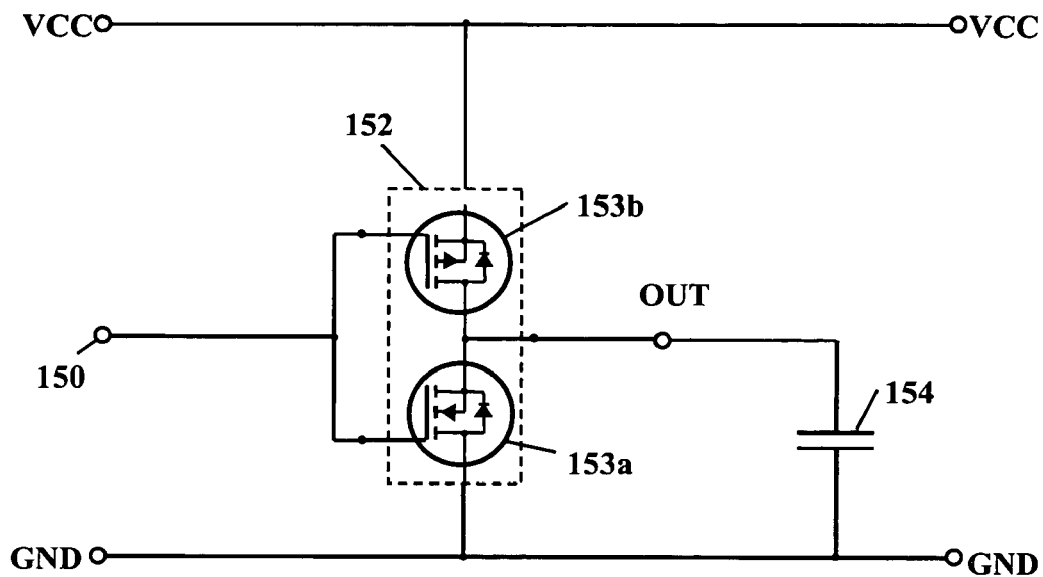
FIGS. 63–66 are electrical schematics for systems to provide electronic signals to the vibratory elements of this invention.

FIG. 63 shows an example of a driver circuit, preferably using a halfbridge 152 such as a NDS8858H halfbridge available from Fairchild Semiconductor. A discrete halfbridge is also believed suitable, but is not as preferred for size reasons. A rectangular input timer-signal 150 of specified frequency can be used to repeatedly switch between the inputs of the integrated halfbridge 152. This process generates an oscillatory waveform in the capacitor 154, which represents the piezoelectric element 22. It is however not necessary for the signal 150 to be rectangular as long as it reaches the necessary thresholds that can switch the halfbridge 152. The signal 150 can thus be generated by a microcontroller, or by other suitable signal generators such as a LM555 timer circuit available from National Semiconductor. The input timer-signal 150 is used to switch between the inputs of the halfbridge 153. The period during which one of the said inputs is connected to the output of the halfbridge is determined by the input signal 150 and can be appropriately chosen. Typically, the cycle during which the supply voltage (VCC) is connected through to the output of the halfbridge accounts for about 50% or less of the time in order to achieve the best energy efficiency in the circuit and in the piezoelectric element 22. If the signal 150 is high, the n-channel transistor 153a in the halfbridge 152 becomes conductive and discharges the capacitor 154. After this discharge, it is preferable for the signal 150 to change to a lower level so that the p-channel transistor 153b in the halfbridge becomes conductive instead and charges the capacitor 154. This process can be repeated indefinitely and, since the capacitor 154 represents the piezoelectric element 22, it results in a vibratory motion of the piezoelectric element 22 and therefore of the vibratory element 26 (FIG. 1).

As an alternative, one of the transistors 153a, 153b in the driver circuit can be replaced with a component 156, e.g. a passive component like a resistor, or an active component such as a constant current diode. Such an alternative embodiment is shown in FIG. 64, where the transistor 153b has been replaced with a component 156 such as a resistor.

Figure 64:
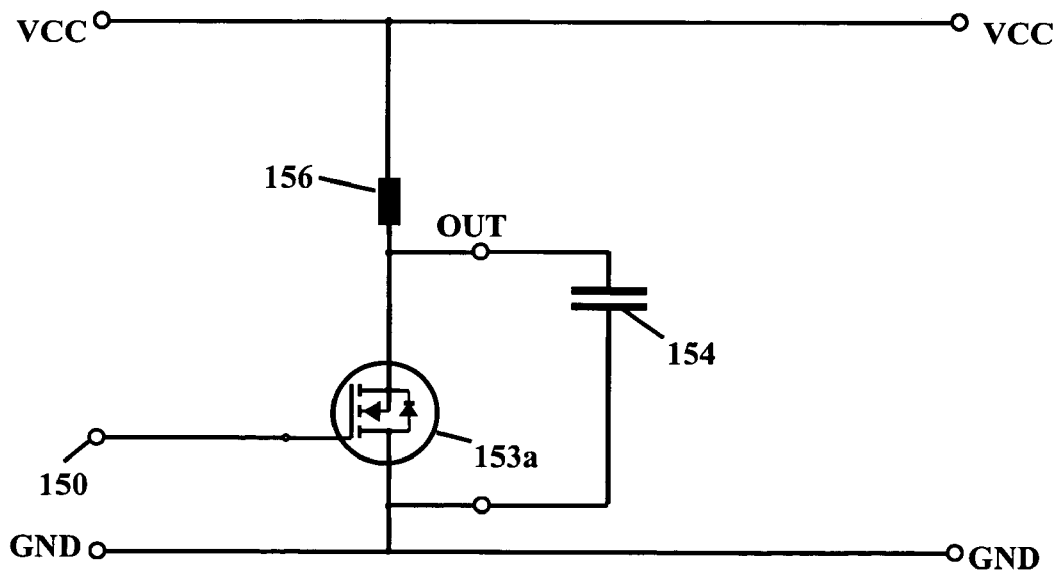

In accordance with specific embodiments, the driver circuits of FIGS. 63, 64 have the advantage that they can be implemented within an integrated circuit, e.g. as part of a microcontroller.

Figure 65:
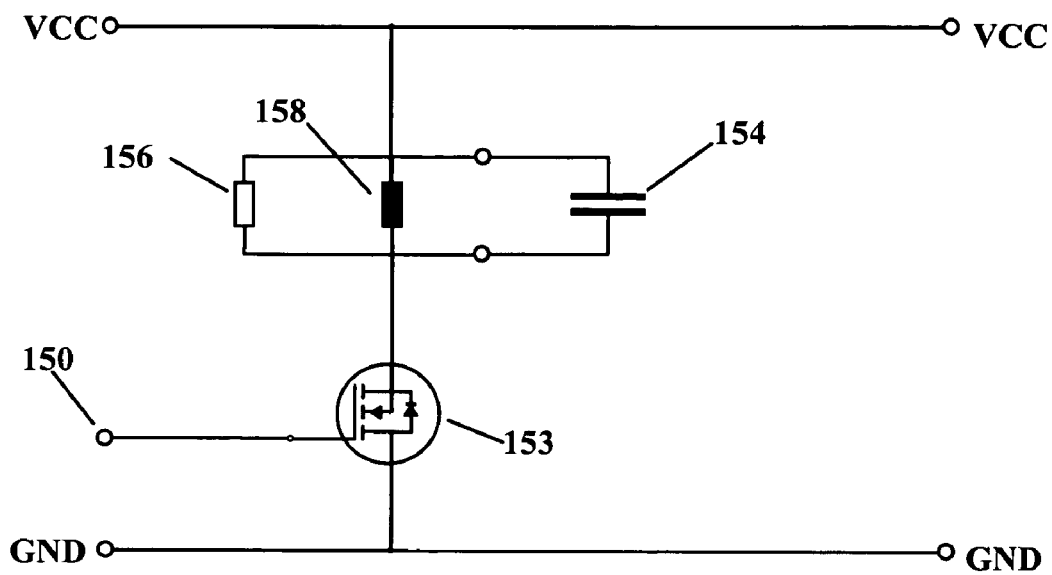

FIG. 65 shows an alternative driver circuit for the piezoelectric element 22 that uses a switched resonance circuit having a capacitor 154 (piezoelectric element 22), an electromagnetic storage device, such as inductive coil 158, and optional resistor 156 connected in parallel. One advantage of using a resonance circuit to drive the piezoelectric element 22 is the ability to lower the supply voltage (VCC) to battery level (e.g. 3V) while maintaining the higher voltages necessary to operate the piezoelectric element 22. Moreover, the entire circuit consists of only three electronic parts besides the capacitor 154, which represents the piezoelectric element 22.

In FIG. 65, an input signal 150 (like the one previously described in the halfbridge driver circuit of FIG. 63) is used to switch a control element 153, such as transistor, on and off in a well-determined fashion. Typically the cycle during which the transistor 153 is conductive is chosen to be about 50% or less in order to achieve the best energy efficiency in the piezoelectric element 22. When the input signal 150 is high, the transistor 153 becomes conductive and reverses the charge of the capacitor 154 while increasing the current through the coil 158. The current in the coil 158 reaches its maximum when the capacitor 154 is fully charged. At that point in time, the coil 158 stores a maximal amount of energy in its electromagnetic field, and it is preferable if the input signal 150 is set to low so that the transistor 153 is no longer conductive. The energy stored in the coil 158 sustains the flow of current, which in turn reverses the charge of the capacitor 154 resulting in an increased voltage across the capacitor 154 and therefore the piezoelectric element 22.

When the capacitor 154 has fully reversed its charge and if the circuit adjustments are correct, the energy in the coil 158 increases the voltage across the capacitor 154 beyond the supply voltage (VCC). When the coil 158 has relinquished its energy, the voltage across the capacitor 154 reaches a maximum, and the capacitor 154 now stores the entire electric energy of the system. Next, the current flow through the coil 158 reverses which in turn causes another reversal of the capacitor charge. At this point or shortly thereafter, it is preferable if the input signal 150 is switched to high again so that the cycle can be repeated.

The resistor 156 is not necessary for the operation of the circuit of FIG. 65, but it provides a method to shape the waveform at the capacitor 154 and to cut off possible voltage peaks that can originate from the fast switching of the current through the transistor 153, hence reducing potential electromagnetic interference as well as leakage of vibratory energy into undesired frequency spectra. Alternatively, the resistor can also be put in series with the inductor 158. As a further alternative, it can be beneficial to place the inductive coil 158 in series with the capacitor 154 to form another type of electric resonance circuit. If the resonance frequency of this circuit is chosen sufficiently close to an operation frequency of the motor, higher voltages at the piezoelectric element 22 can be achieved while maintaining relatively low electric power consumption. As mentioned earlier, the inductor 158 can advantageously also be a wire coil made from the same wire that connects the capacitor 154.

Figure 78:
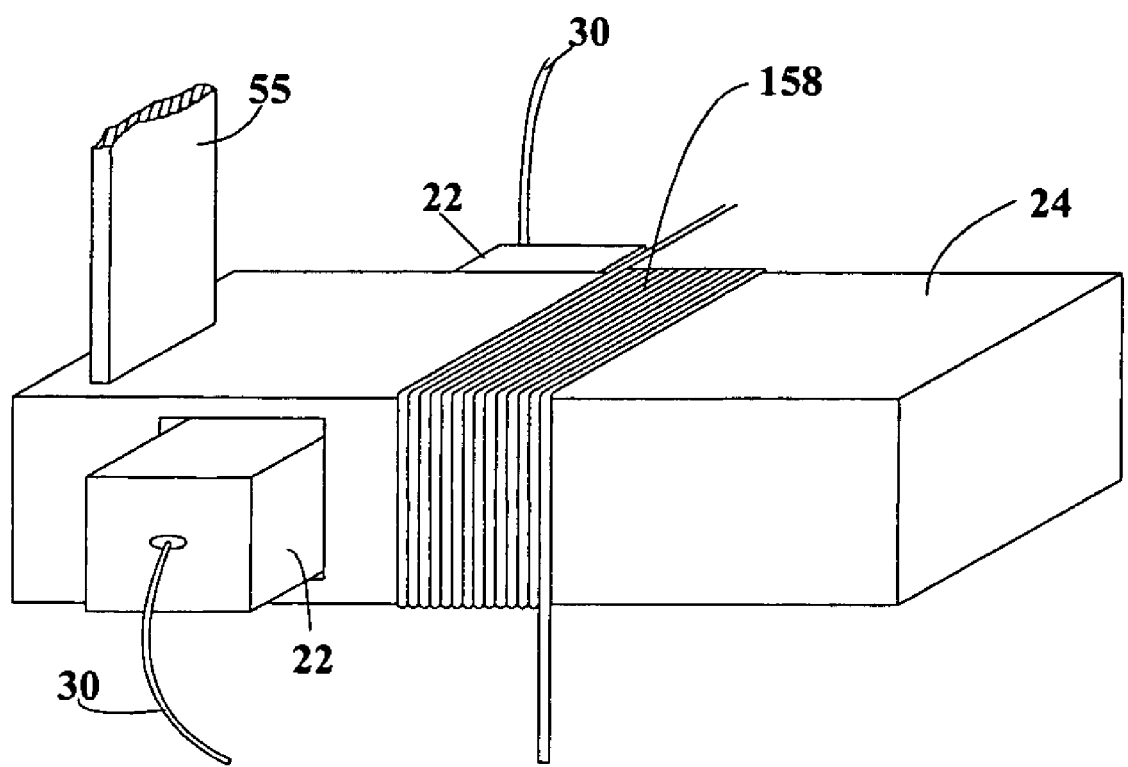
FIGS. 78–80 show further embodiments in which a coil is integrated with or associated with the motor or motor components of this invention.
Figure 79:
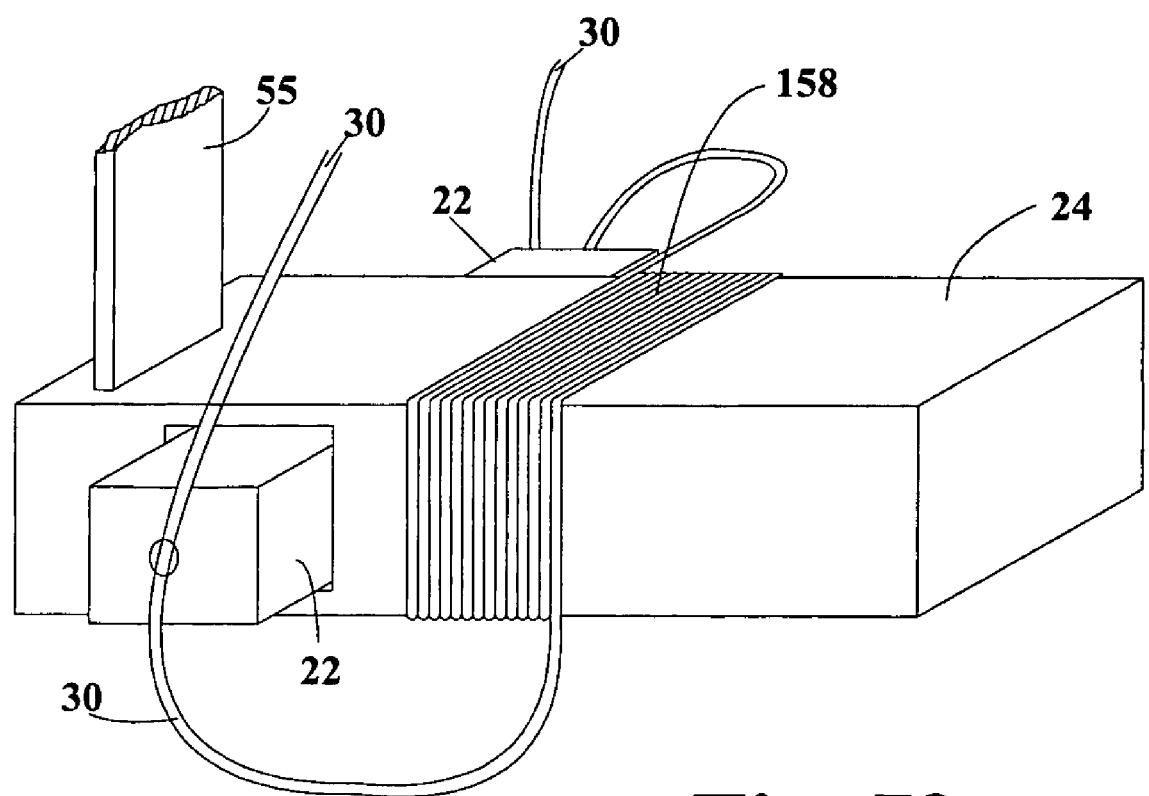
Figure 80:
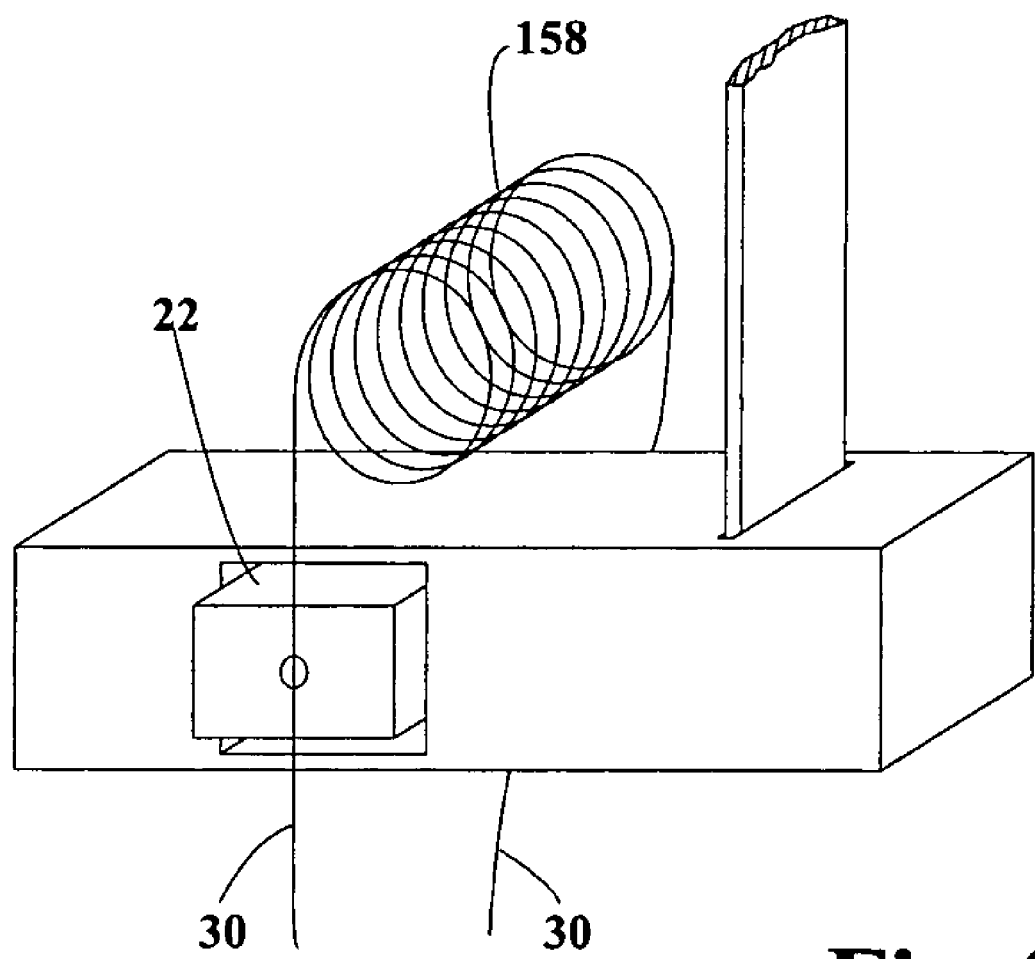

Further, referring to FIGS. 78–80, it is possible to integrate the coil 158, and even the resistor 156, directly into the vibratory element 26 by, for example, wrapping an insulated wire around the vibratory element 26 to form an inductive coil as shown in FIG. 78. In such an embodiment, the two ends of the wire coil 158 can concurrently be used as electrical leads to the piezoelectric element, as shown in FIG. 79. The wire coil 158 can be wound around the resonator 24 as in FIG. 30, or separate as in FIG. 80. These configuration place inductive coil 158 in parallel to the capacitor 154 and save additional wiring, although the coil 185 could be placed in series, with or without the damping resistors, half-bridge or single transistors.

Moreover, the inductive coil 158 can be mounted close to the piezoelectric element 22 with which it can form the electric resonator circuit. The physical proximity of the piezoelectric element 22 and coil 158 can reduce the inherent electrical resistance in the electrical connections of those parts and can make the circuit more effective, especially since most of the current used to drive the motor oscillates in this electric resonator. As a result, the wires leading from the electric resonator consisting of the coil 158 and piezoelectric element 22 to the signal generating unit can be reduced in diameter and increased in length and may result in lower electrical interference.

A source of electrical signals, such as a signal generator, is electrically connected to the vibratory element 26, and the source of vibratory motion, 22, through various ways, e.g., a pair of wires 30. In order to move the driven object 42 in a first direction, the signal generator produces an electrical signal with a spectrum whose dominant frequency is the corresponding operating frequency. Typical and usable signals include, but are not restricted to, pure sinusoidal, triangular and rectangular waveforms. Similarly, a signal with a spectrum whose dominant frequency is a second or third operating frequency, can cause the driven object 42 to move in a second or third direction.

The capability of the various vibratory motors described herein to reliably operate with a variety of waveforms is an advantage over those prior art motors that require special waveforms other than sinusoidal waves to function, e.g., saw-tooth waveforms, and that would not function reliably with a purely sinusoidal waveform. Therefore, since the quality of the signal applied to the piezoelectric element 22 can be less than compared to some prior art motors, the signal generator can have a simpler construction, which results in a reduced cost of the entire motor system.

Furthermore, it is desirable to have all electrical signals produced by the signal generator communicated through the same set of electrical connections to the vibratory element 26, and particularly to the piezoelectric element 22, e.g., by wires 30. When all signals are communicated through the same electrical connections, there is no need for a unit that switches between various selected connections. This further simplifies the vibratory motor compared to prior art motors. Further, some prior art devices generate a phase shift between two electrical signals and then communicate the signals individually through separate electric connectors to at least one piezoelectric element, and the present, more simplified electrical connection can avoid that more complex design. This can further reduce the cost of the motor in comparison to some prior art motors.

As illustrated in FIGS. 78–80, the piezoelectric element 22 can be sized to extend beyond the portions that engage the walls forming the opening 28. Thus, the piezoelectric element 22 is shown as extending beyond the end walls 31. This variation in the dimensions of the piezoelectric element can be used to vary the value of capacitor 154, and thus the performance of the control circuits, such as the circuit depicted in FIG. 65.

One potential disadvantage of the driver circuit of FIGS. 65 and 78–80 is due to negative voltages that can appear across the capacitor 154. Negative voltages can be damaging to the piezoelectric element 22, which is a polarized electrical component. In order to amend the situation for piezoelectric elements susceptible to negative voltages, a modification of the circuit can be provided as discussed relative to FIG. 66.

Figure 66:
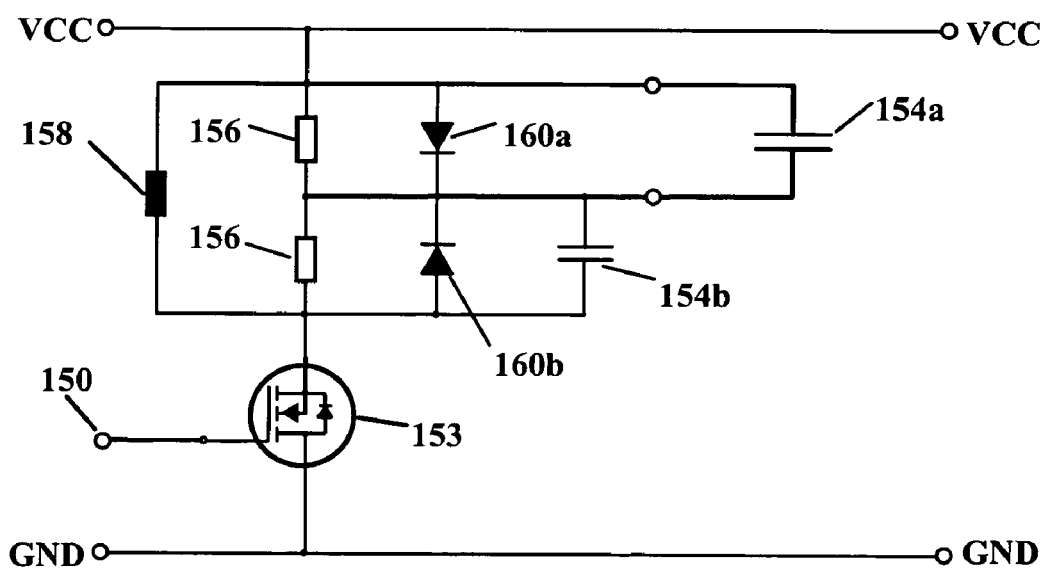

FIG. 66 shows a driver circuit suitable for use with a piezoelectric element 22 that may be more sensitive to a negative voltage. In this circuit, a second physical capacitor 154b is added to the piezoelectric element 22 (represented as capacitor 154a), or multiplayer piezoelectric element 22, if it has multiple piezoelectric layers that are electrically split as shown, can be represented as two capacitors 154a and 154b. Also, another resistor 156b is included in the circuit in addition to the existing resistor 156a. Parallel to the resistors 156 and the capacitors 154, two diodes 160a, 160b are added.

The orientation of the diode 156a prevents the voltage of the node between the two resistors 156a, 156b from falling below the supply voltage (VCC). The voltage across the capacitor 154a therefore cannot become more negative than the typical voltage drop across a conductive diode (about 0.5–0.7 Volts). This small negative voltage can be sustained by most piezoelectric elements.

If, in the same manner as before, the circuit is excited by the input signal 150 to resonate, the amplitude of the oscillating voltage across the piezoelectric element 22 (represented by capacitor 154a) can be made larger than the supply voltage (VCC), but the voltage cannot become negative. A similar statement holds true for the physical capacitor 154b so that a polar electrical component may be chosen there as well. Further, if the piezoelectric element has multiple piezoelectric layers and is electrically split so as to be represented as two capacitors 154a and 154b, the driver circuit of FIG. 66 advantageously requires only a single control signal 150 to drive the piezoelectric element.

It has been observed that for a given voltage amplitude of the electric input signal to the piezoelectric element 22, the electrical current consumption of the piezoelectric element increases sharply for excitation frequencies just below certain resonance frequencies of the vibration element 26, and drops sharply just above those resonance frequencies. For rod-like vibration elements 26, these frequencies typically correspond to longitudinal modes. This electrical effect can be used to cheaply and quickly determine a particular vibration mode without using specialized measuring equipment such as a laser vibrometer. The sharp decrease in current just above a certain resonance frequency can be used to reduce the electrical power necessary to drive the vibratory unit 26 if the motor assembly 20 can be operated at these frequencies. Also, the electronics could be configured to automatically detect the drop in current and track the frequency at which the drop occurs, hence advantageously providing feedback. This feedback can be used to adapt the optimal operating frequency to changing external influences, such as temperature and humidity. Also, this kind of feedback can be used to detect the mechanical load that the motor must move.

Specially Configured Piezoelectric Elements

In some embodiments where the piezoelectric element 22 is press-fit into the opening 28 in the resonator, the walls defining the opening 28 deform elastically and/or plastically during the press-fit process in order to accept the larger piezoelectric element 22 and generate the preload. One way to prevent the piezoelectric from experiencing sheer forces during the press-fit and to prevent the piezoelectric from breaking is to put additional metal layers on the mechanical contact sides of the piezoelectric. But this time and labor to do so increases costs.

Figure 67:
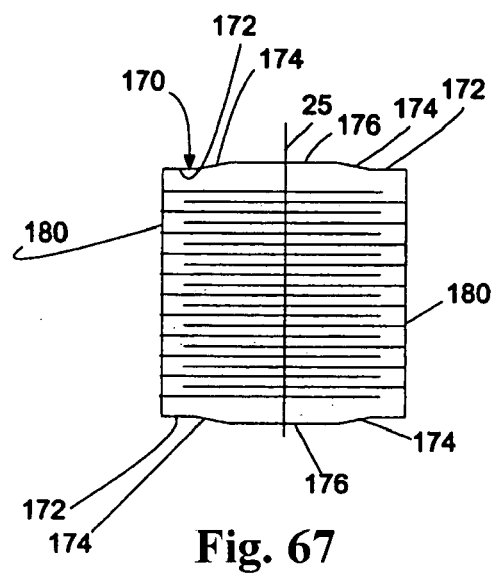
FIG. 67 is a plan side view of a piezoelectric element having specially configured ends.
Figure 68:
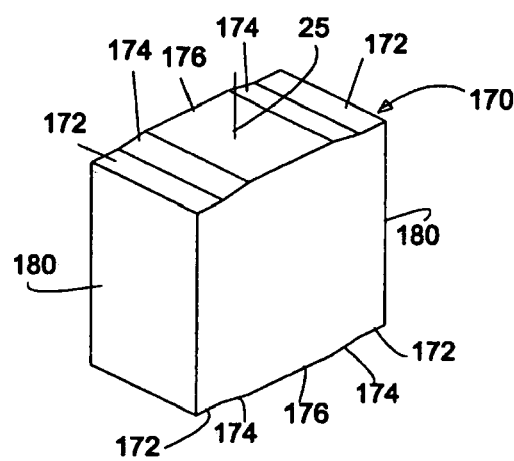
FIG. 68 is a perspective view of the piezoelectric element of FIG. 67.
Figure 69:
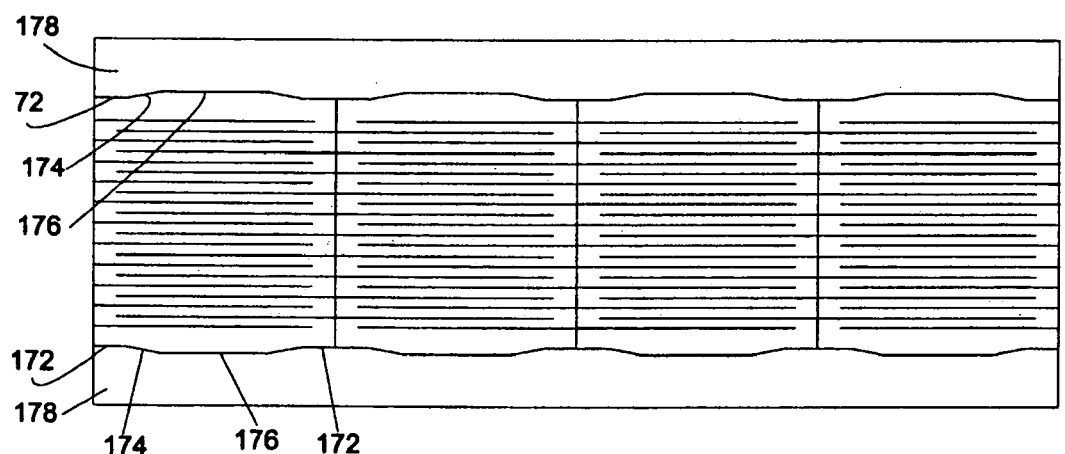
FIG. 69 is a side sectional view of a die used to form the piezoelectric elements of FIGS. 67–68.

FIGS. 67–69 show a piezoelectric element 22 with a specially shaped end 170 that is configured for press-fitting into recess 28. The end 170 can eliminate the need for additional metal layers and result not only in cost savings, but also in fewer mechanical contact surfaces and therefore in better performance. The new piezoelectric shape can also generate a more defined contact area.

The shaped end 170 has at least on one flat 172 adjoining an edge of the piezoelectric, and preferably two flats 172 on opposing edges of the shaped end 170. The interior end of the flat 172 joins an incline or taper 174 that helps widen the hole 28 that the piezoelectric element 22 gets pressed into. The taper 174 joins a flat, central contact area 176.

The shaped end 170 is advantageously placed on two opposing ends of the piezoelectric element 22, the ends that will abut the walls defining the opening 28 and cause the preload on the piezoelectric element. The flats 172 on opposing ends 170 are spaced a distance apart selected to allow the piezoelectric element 22 to be inserted into an undeformed opening 28. That helps position the piezoelectric. The inclines 174 make it easier to press the piezoelectric into the opening 28. The inclined surface 174 is of sufficient length and inclination to allow insertion without unacceptably damaging the piezoelectric element 22. The specific length and inclination angle will vary with the particular application. The central contact area 176 defines the final dimension of the opening 28 and sets the preload, it also provides a localized contact area to reduce the area in driving engagement with the resonator 24 in which the opening 28 is formed. That helps locate the contact area and axis of engagement and excitation, and it helps improves the engagement. Advantageously, the shape of the end 170 is symmetric about central axis 25 so the piezoelectric can be press-fit from two directions, but that need not be so.

The piezoelectric element 22 could be ground after the sintering process that produces the piezoelectric elements, in order to shape the taper(s) 174 and flat(s) 172. Alternatively, the taper could be produced during the pressing process by which the piezoelectric elements are formed. The pressing process typically occurs after the layer stacking process in the piezoelectric production sequence. In this way no additional process step is necessary. This method also has an advantage over grinding in that no electrode surfaces are in danger of being ground, resulting in lower piezoelectric efficiency.

Referring to FIG. 69, the following process is believed suitable to produce this piezoelectric element, although someone skilled in the art can devise other methods given the present disclosure. The layer-stacking machine starts with the bottom die and places the first piezoelectric layer on top. All other layers follow just as in the normal lay-up process. Finally the top die is placed onto the stack and the whole stack is then pressed. During the pressing process, the piezoelectric elements 22 are forced to accept the shape of the die.

The die 178 has a shape configured to produce the depicted surface contour. The die 178 thus has flats 172, inclined surfaces 174, and central flats 176 located so as to form those surfaces on the pressed and sintered piezoelectric elements produced by the die. The contours of the die 178 are modified as needed to account for shrinkage and deformation that might occur during formation of the piezoelectric elements.

The combined surface contour is repeated for as many piezoelectric elements 22 as are placed in the die. It is important that the relative position of the electrodes 180 matches the position of the die. The stacking machine can ensure proper alignment. The stacked elements are pressed and produce the group of piezoelectric elements depicted in FIGS. 67–69.

Following the pressing process, the piezoelectric elements will be cut and processed as usual. During the cutting, it may be beneficial to leave the die attached to the stack for stability and alignment. The result is a piezoelectric element with said advantages.

If the piezoelectric is shaped as shown in FIGS. 67–68, an additional advantage arises. Typically the electrodes 180 are printed onto the sides of the piezoelectric element 22. If machines typically used to make multilayer capacitors are used, the electrodes 180 partially cover the edges of the adjacent sides, and here that includes a portion of the electrode over the recessed flat surface 172. Because this surface 172 is sized to fit in the opening 28 without deformation the slight thickness of the added electrode layer does not affect installation. But if that electrode layer 180 were on a normal, square-ended wall of the piezoelectric element being press-fit against the walls defining opening 28, then the edges of the piezoelectric would be larger than the center which lacks the electrode layer, and that would render a press-fit more difficult. The piezoelectric shape of FIGS. 67–68 thus eliminates the need for removing the excess electrode material.

It is also possible to shape the die producing the piezoelectric elements such that the deformation that is caused by the polarization of the piezoelectric is accounted for. When polarized, the flat contact area 176 bulges slightly outward, convex to the piezoelectric element 22. To offset this polarizing bulge, the die 178 is advantageously formed with a slightly convex surface at the contact surface 176 so that the resulting piezoelectric element 22 has a slightly concave surface in it at the contact surface 176. The amount of curvature is selected so that after the piezoelectric element 22 is polarized, the contact surface 176 is flat. The amount of curvature will vary with the specific design of the piezoelectric element involved.

Figure 75:
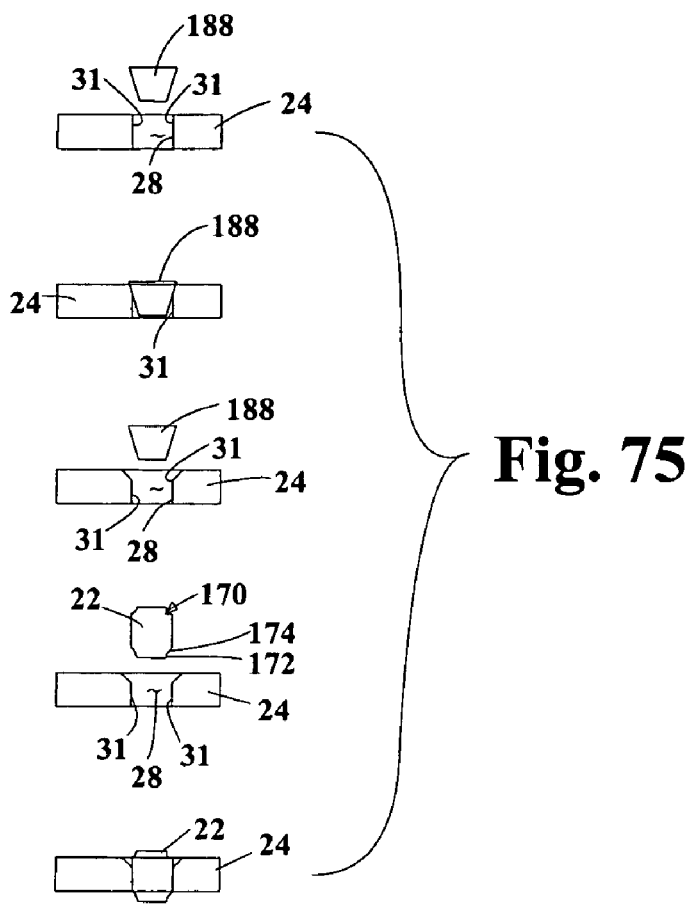
FIG. 75 shows a sequence for press-fitting a piezoelectric into an opening in a resonator.

FIG. 75 shows a potential press-fit insertion sequence. Optionally, by first inserting a tapered plug 182 into the opening 28, the insertion edges of the opening 28 are preferably slightly plastically deformed, which widens portions of the mating edge of the opening. For the illustrated embodiment the end walls 31 engage the piezoelectric element 22 and place it in compression. To avoid overstretching and breaking the sidewalls 29 during formation of the taper, the insertion edges on the end walls 31 can be shaped individually in two separate steps, or the entire frame can be constrained against axial deformation.

When the plug 182 is removed, the piezoelectric element 22 with shaped ends 170 is aligned with the opening 28. The flats 172 preferably are able to enter the opening 28, with or without the widened edge produced by plug 182. The inclined edge formed on the end walls 31 defining opening 28 mate with the inclined surface 174 on the piezoelectric element 22 to provide a sliding insertion to position the piezoelectric element in the opening 28. The tapered end walls benefit, but are not necessary for the press-fit to occur. They do, however, have the added benefit of inducing asymmetry in the resonator if so desired. If the sidewalls 29 were to engage the piezoelectric element 22 and apply a compressive force, then an inclined surface could be formed on the sidewalls 29 or on the corresponding edges of the piezoelectric element 22.

The above discussion described the piezoelectric element 22 as comprising a plurality of piezoelectric layers. This need not be the case as a single piezoelectric crystal or ceramic block could be formed having the specially configured ends 170.

Figure 76:
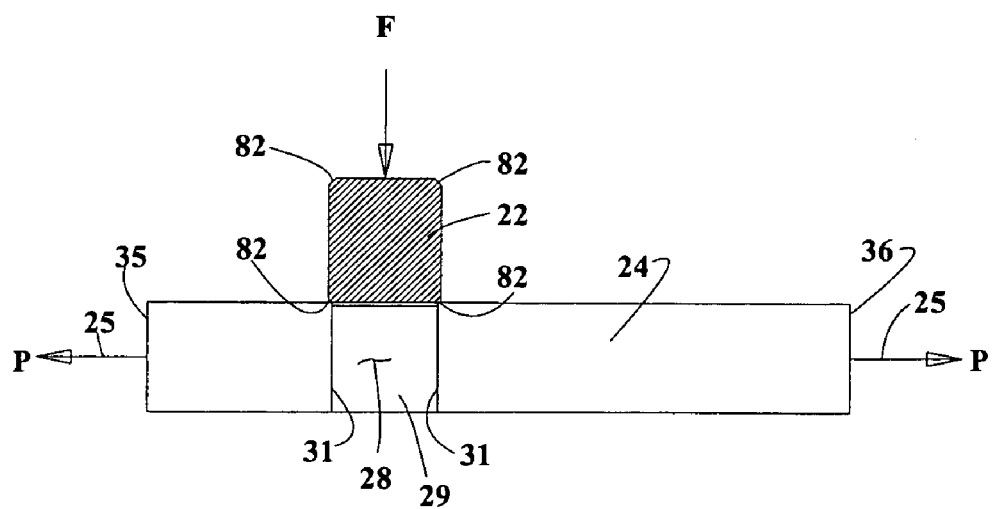
FIG. 76 shows a pull-fit process for a piezoelectric motor assembly of this invention.

FIG. 76 shows another advantageous method to press-fit the piezoelectric element 22 into the opening 28 of resonator 24. To put this in perspective, a short discussion is given of the objectives, the problem, and then the solution.

Repeatability in the performance of the vibratory motors 26 requires a consistent preload be applied to the piezoelectric elements 22. In order to accommodate variations in the dimension of the piezoelectric element 22, while achieving the same preload, the sidewalls 29 can be placed in plastic deformation. The slope of the stress-strain-curve is very small in the plastic region, which leads to very small changes in preload when the length of the piezoelectric element 22 changes. This allows combinations of shortest piezoelectric element 22 with the largest opening 28, and the longest piezoelectric element 22 with the smallest opening 28, to result in essentially the same preload on the piezoelectric element.

But when the piezoelectric element 22 is press-fit into the opening 28, it is subjected to frictional forces that lead to high shear forces on the piezoelectric element. Because the piezoelectric material is brittle, the shear forces can act to delaminate adjacent layers of the piezoelectric material. To prevent shear forces from acting on the piezoelectric the protective plates 34, 84 can be added to take the shear forces. This not only alleviates the stress on the piezoelectric element 22, but also helps the press-fit as the plates 34, 84 act to guide the piezoelectric into the opening 28.

To reduce the cost of the vibratory motor 26 and to also improve mechanical coupling between the piezoelectric element 22 and the resonator 24, it is desirable to press-fit the piezoelectric element 22 without any protective layers of steel such as plates 34, 84. The following process allows this by reducing the forces acting on the piezoelectric during the press-fit operation to a constant and low level and by making the press-fit process more controllable and therefore easier to automate.

The objective is to have most of the elongation of the sidewalls 29 done not by the piezoelectric being forced into the opening 28, but to have the elongation done by another machine. This machine pulls the resonator 24 with force P as shown in FIG. 76 to stretch the sidewalls 29. The piezoelectric with tapered edges 82 sits on top of the opening 28 in the resonator 24 and is pressed into the opening 28 with a force, F, that is preferably constant, and that is not strong enough to push the piezo into the hole by itself. The force F is also not strong enough to cause damage to the piezoelectric element 22, and is especially not strong enough to cause shear forces that delaminate the piezoelectric material.

At some point during the elongation of the sidewalls 29 by increasing force, P, the piezoelectric 22 starts to slide into the hole under force, F. By setting the force, F, to a specified value, shear forces between the piezoelectric element 22 and the resonator 24 are limited to the resulting normal force multiplied by the coefficient of friction. This resulting normal force equals the desired preload force minus the force, P.

Once the piezoelectric element 22 starts sliding into the opening 28, it is necessary to stop the elongation of the sidewalls 29 by the machine because otherwise the resultant preload on the piezoelectric will be reduced.

The pulling machine applying the force P can be controlled by one of two principles, load control or displacement control. Load control refers to controlling the applied load and measuring the resultant displacement. Displacement control is just the opposite: controlling the displacement and measuring the resultant load. To prevent overstretching the sidewalls 29, it is preferable to use displacement control for this application.

The sidewalls 29 could be curved toward, or away from the longitudinal axis 25 extending through opening 28. If the sidewalls 29 are curved away from the longitudinal axis 25 extending through the opening 28, then by applying opposing forces to opposing sidewalls 29, the end walls 31 can be forced apart, allowing the piezoelectric element 22 to be inserted into the opening 28. Upon removal of the force pressing the curved sidewalls 29 toward each other, the piezoelectric element 22 is placed in compression. Advantageously, in pressing the curved sidewalls 29 together in order to enlarge the space between end walls 31, the sidewalls 29 are stressed beyond their elastic limit so as to achieve the advantages discussed herein.

Similarly, if the sidewalls 29 are curved toward each other, then by applying a force to the sidewalls that urges them apart, the end walls 31 are moved away from each other, allowing the piezoelectric element 22 to be inserted into the opening 28. Upon removal of the force pressing the curved sidewalls 29 away from each other, the piezoelectric element 22 is placed in compression. Advantageously, in pressing the curved sidewalls 29 apart in order to enlarge the space between end walls 31, the sidewalls 29 are stressed beyond their elastic limit so as to achieve the advantages discussed herein.

Instead of tapering the piezoelectric element 22 by applying inclined surfaces 82 (or 174 (FIGS. 67–69) it is also possible to taper the edges of the opening 28. It is also possible to have both parts tapered. If neither the piezoelectric element 22 nor the opening 28 are tapered, the piezoelectric element 22 starts to slide in at the point where the piezoelectric element and the opening are the same size. This presents alignment problems and requires very precise control to avoid overstretching of the sidewalls 29. Therefore, it is desirable to have at least one mating part tapered.

The press-fit method described here is also adaptable to all other press-fits. The vibratory motor 26 with the piezoelectric element 22 and the resonator 24 or frame, is used as an example.

Stepper Motor Approximations

Figure 70:
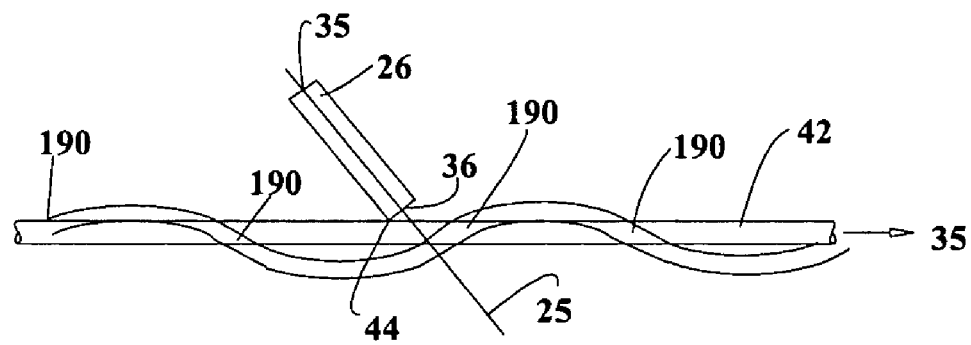
FIG. 70 is a schematic view of a vibrating driving element and a vibrating driven element of a further embodiment of this invention.

Referring to FIG. 70, the vibratory element 26 can be operated at a selected excitation frequency that does not coincide with any frequency being used for regular operation of the motor assembly 22 and that therefore does not transport the driven element 42 in a specified direction, but rather excites a mode of vibration in the driven element 42 itself. This is illustrated in FIG. 70, where the induced mode of a rod-shaped driven element 42 has nodes 190. Similar nodes are observed if the driven element is a rotational object such as in FIG. 4.

In this situation, there is a tendency for the rod 42 to shift its position so that the contacting portion 44 becomes centered at the node 190. Depending on what node is closest to the contacting portion 44, this results in a forward or backward motion of the rod 42. Thus, by seeking out a specific position along the driven element 42, the motor assembly 22 can provide the incremental movement and locating aspects of a stepper motor. The step sizes are determined naturally by the particular mode of vibration that is being excited in the driven element 42, and will vary with the mode that is being excited.

Centering the driven element 42 at known nodes 190 can be exploited to move the driven element 42 into a predefined position. This eliminates positioning errors that may have accumulated during regular operation of the vibration motor 26 and can be used to increase the accuracy and repeatability of the motor without the need of position feedback. This mode of operation requires that the actual position of the driven element 42 be within a certain distance to a desired node 190, so that the resonant vibration causes movement toward the desired node.

The suspension of the driven element 42 affects the frequencies and node locations of the natural vibration modes of the driven element 42. For the purpose of stepping the driven element 42, the influence of the suspension must therefore be considered in choosing appropriate excitation frequencies to achieve this locating activity achieved by the nodes 190. Conversely, the design of the suspension may be influenced by the need for particular excitation frequency or frequencies and designed to achieve those frequencies. There is thus provided a method and apparatus for using the vibration nodes of the driven object to transport the driven object to a known position for calibration.

Position Sensing

Figure 71:
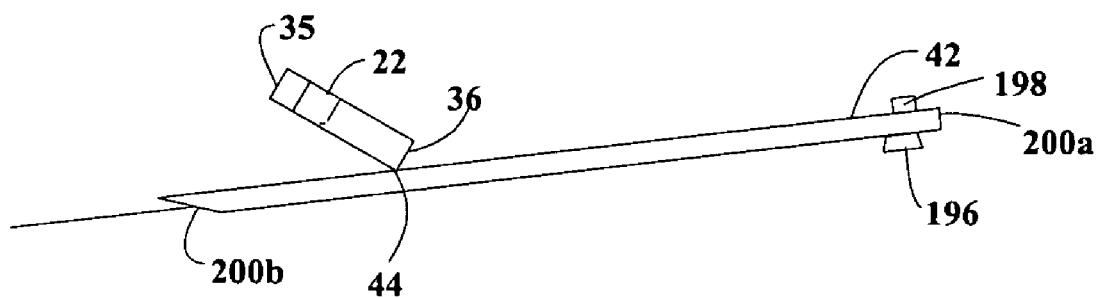
FIGS. 71–72 are schematic views of several positioning sensing configurations.

There are situations where it is desirable to exactly know the position of the driven element 42 relative to the vibration element 26. Referring to FIG. 71, an illustrative implementation is described that uses the characteristic travel duration of a vibration or acoustic pulse from the piezoelectric element 22 to monitor the position of the driven element. The position of the driven element 42 relative to the vibration element 26 can be determined by measuring the time it takes for a mechanical vibratory pulse to travel from the vibration element 26 into and through the driven element 42, and/or vice versa. The vibratory pulse can be generated in the vibration element 26 by the piezoelectric element 22 or in the driven element 42 by some other generating mechanisms 198, such as a solenoid, a spring driven impact mechanism, or other mechanical or electronic mechanisms.

A receiver 196, e.g., a piezoceramic microphone, that is mounted adjacent a distal end of the driven element 42 at a known location on the driven element can be used to sense the pulse generated by the piezoelectric element 22, the pulse being sufficient to cause an impact vibration at the selected contacting portion 44. Alternatively, the piezoelectric element 22 can be used to sense the vibratory pulse generated by the generator 198 by exploiting the piezoelectric material's inherent ability to convert a mechanical movement (e.g., of selected contacting portion 44) back into an electrical signal.

It is also possible for the piezoelectric element 22 to sense a vibratory pulse that it has generated earlier. This requires that the pulse travel through the vibratory element 26 and the driven element 42, be reflected at a location on driven element 42, such as the distal end of the driven element 42, and return to the piezoelectric element 22 where it can be sensed. In a similar fashion, by way of reflection, it is possible for a sensor 196 to sense a pulse generated by a generator 198.

The vibratory pulse can be chosen such that its power spectrum does not contain significant vibratory energy at frequencies that could cause the driven element 42 to move. Alternatively, the vibratory pulse can be incorporated into the operational input signal to the piezoelectric element 22, for example in form of a brief pause. Because the geometries and material properties of the vibratory element 26 and of the driven element 42 are known, and because the position of the contacting portion 44 on the vibratory element 26 is known, the monitored time difference between pulse generation and sensing is representative of or characteristic of the distance between the piezoelectric element 22 and the receiver 196 or a distal end of the driven element 42.

In some of the various position-sensing embodiments, it is desirable that the piezoelectric element 22 is temporarily deactivated prior to the position sensing so that undesirable vibrations are allowed to dampen out. Then the specified signals can be emitted and detected, with the operation of the vibrator element 26 resuming thereafter. It is an advantage of some of these embodiments that, if the piezoelectric element 22 is used as a sensor as well as actuator, only a single piezoelectric element is needed to move the driven element 42 as well as provide position feedback.

The pulse generated in either the piezoelectric element 22 or in a generator 198 is reflected at any surface where the mechanical impedance changes abruptly. These surfaces include the opposing ends of the vibrating element 26 and the opposing ends 200 of the driven element 42. Some of these reflections are undesirable and must either be masked or be otherwise distinguishable from the position-determining pulse. Ways to achieve this include, but are not restricted to, degrading undesired reflected signals by inclining, damping or roughening certain reflecting surfaces such as the distal end 200b of the driven element 42. Given the present disclosure, other ways of altering the ends 200 could be devised to allow signals reflected from the ends to be distinguished for use in the position sensing method and system.

Figure 72:
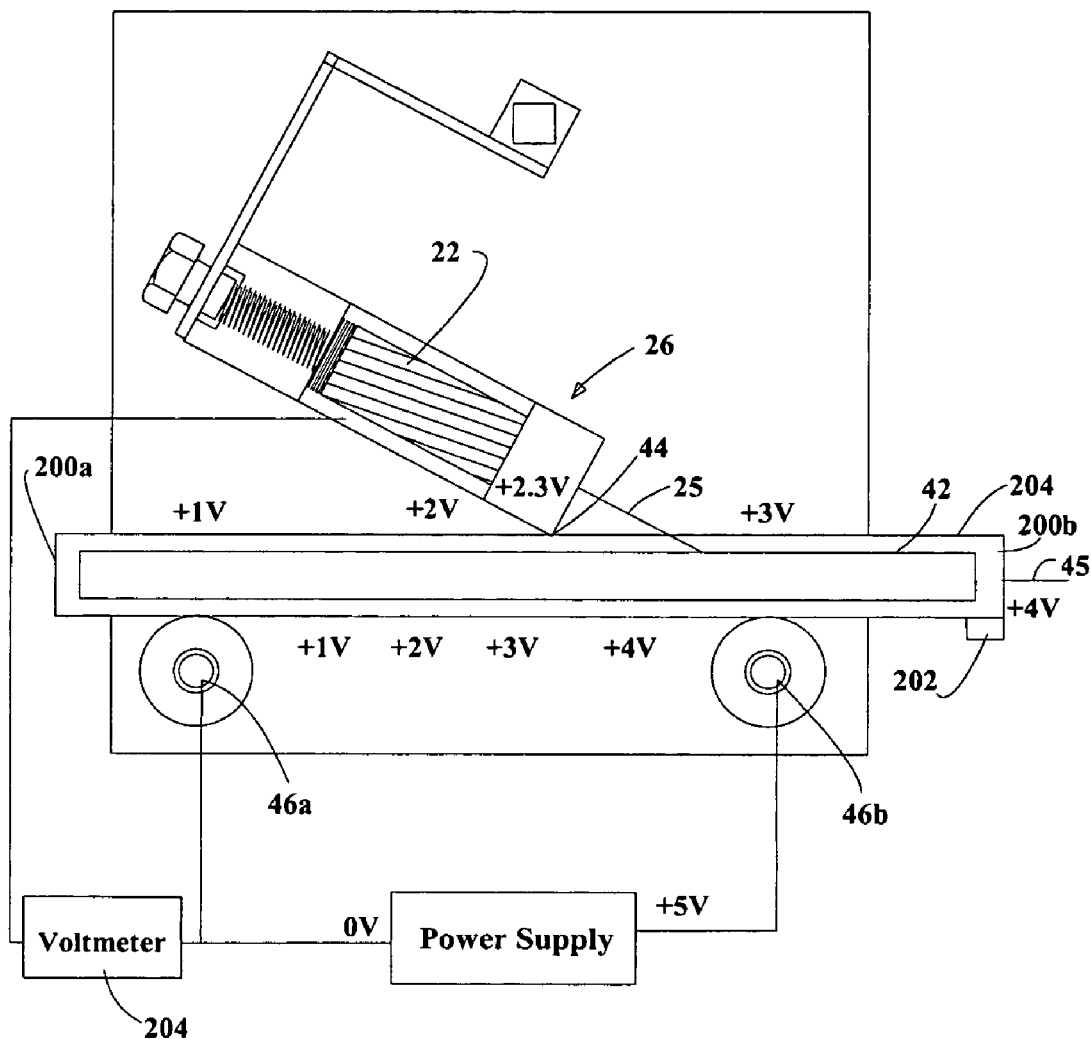

FIG. 72 shows a different position-sensing embodiment that uses a resistive position measurement method that uses characteristic resistance of a resistive driven object to monitor the position of the driven object in a way that is analogous to how an integrated potentiometer operates. The position of the selected contact portion along the length of driven element 42 varies a resistance that is detected and used to define a relative position of the elements.

For illustration, the driven element 42 comprises a cylindrical rod. The driven element 42 is either made of an electrically resistive material, or it is made of an electrically insulating material that has been entirely or partially coated with an electrically resistive material 204. A carbonated plastic material is believed suitable for either use. Since the electrical resistance between the selected contacting portion 44 of vibratory element 26 and either of the opposing ends of the rod 42 depends on the position of the contacting portion 44 relative to the rod 42, the position can be determined by measuring the electrical conductivity, or the electrical resistance, between one of the opposing ends of the rod 42 and the vibration element 26.

The voltage that is necessary for measuring the electric resistance can be small and it can be applied between the vibrating element 26 and a distal end of the driven element 42. Preferably though, one end of the driven object 42 is connected to a positive supply voltage and the other end to a negative supply voltage. By measuring the voltage at the vibration element 26, e.g., by a voltmeter 204, accurate position information can be obtained.

Instead of applying the necessary voltage directly to ends 200a, 200b of the driven object 42, this voltage can also be applied to the wheels or bearings 46 supporting the driven element 42 provided that the wheels or bearings 46 are made from an electrically conductive material and that they are electrically insulated from each other and from the vibrating element 26. In such an embodiment, the electrical contact resistance between the bearings 46 and the driven element 26 may have to be accounted for.

A suitably coated electrically nonconductive driven object 42 for use in the described embodiment can be cut from a sufficiently thick sheet of plastic that has previously been dipped into conductive paint and let dry. This forms a conductive layer on the exterior surface of the plate. The plate is then cut into strips creating two opposing edges that have no conductive layer. Thus, except for the strips or rods formed from the sheet edges, the cutting process advantageously exposes the nonconductive plastic on two elongated sides of the driven object (the strips or rods), which results in the conductive paint forming an elongated resistor 202 that wraps around the longitudinal axis of the driven object. This embodiment can be modified by further removing the conductive layer from one of the ends 200a, 200b of the driven element. The position can be determined from a measurement of the resistance between the vibration element 26 and one contact point, e.g., bearing 46a or 46b.

Electrically conductive driven objects 42 can also be used in position sensing embodiments if appropriate portions of them are first coated with an insulating layer and then with an electrically resistive layer. For example, an insulating layer may be applied to that side of a metallic rod-like driven object 42 that faces the bearings. On top of this layer, an electrically resistive layer 202 is applied so that it contacts the underlying metal only at the ends of rod 42. The position dependent resistance lies now between a bearing and the end of the rod 42.

OTHER VARIATIONS & ADVANTAGES

In comparison to prior art piezoelectric motors, the present motor 26 requires only one piezoelectric element 22 and only one electrical excitation to generate motion. Due to the use of resonant vibration modes to generate elliptical motion 100 with a single excitation frequency, the piezoelectric element 22 can be smaller than those of other bi-directional piezoelectric motors can, and the overall motor 26 can also be smaller.

The present invention works very well to provide linear motion of driven elements 42. The traditional solution is to use a motor with a gearbox driving a rack and pinion arrangement. The present motor assembly 20 provides a simpler arrangement, and less costly arrangement than prior art motors. Because the selected contacting portion 44 engages the driven element 42 by friction, the motor 20 is not damaged if the driven element is externally pushed so as to back-drive the motor. In contrast, such motion would strip the gears of conventional electric motors.

The present invention is especially suited for low cost applications. The simple design can avoid the need for precision manufacturing requirements and the attendant cost. It allows low cost manufacturing methods and inexpensive piezoelectric elements. In return, the design provides less power and efficiency than some other piezoelectric motors. But the available power and low cost make the embodiments of this invention especially suitable for many traditional markets, such as toys, office equipment, and home automation. Some illustrative examples of the uses for the vibratory motor 26 are given below. But one significant advantage of this motor is its size and simplicity, which can result in low cost.

Vibratory motor assemblies 20 are believed possible that are as small as 0.4×0.4×0.8 inches (1×1×2 cm) in size, moving driven elements 42 at 0.5–10 inches per second (1.3–25 cm/sec), with a force of 0.1–3 N. Rotational drive units are believed possible with sizes as small as 0.6×0.8× 0.8 inches (1.5×2×2 cm) with torques and revolutions per minute (RPMs) depending on the diameter of the rotationally driven object 42. The voltage of the vibratory motor assemblies can be varied depending on the circuit design and the power needed, but can range from 3V, 6V, 12V, 24V 48V, 110V or 220V. Other custom voltages can be used. There is thus a wide range of operating voltages available for the vibratory motors 26.

The size of the vibratory element 26 can be very small, with elements as small as 2×3×10 mm$^3$ believed possible. The cost of the vibratory motors 20 is believed to be half that of competing electric motors. These motors 26 can produce linear motion, rotary motion, both linear and rotational motion, and blocking force when un-powered. They start and stop without delay in as little as 0.6 milliseconds, have no backlash because there are no gears, and can provide fast motion yet also provide slow motion without using gears. They are inaudible because they are driven in the ultrasonic range. The motors require no lubricants and use no toxic substances. They are very accurate and can move in the micrometer range if needed. By controlling the times during which they are powered, they can achieve various speeds and distances. They generate no magnetic fields, have no brush discharge, and no inductive voltage peaks.

The advantages of the vibratory motors 26 make them very suitable for use in CD-ROMs as tray actuators, in scanners to move the light bar or rotary elements, in printers and copiers to transport and guide paper. In home automation applications, the vibratory motors 26 could actuate air conditioning elements, automatic blinds, lighting controls and switches, dust protection doors on dust sensitive appliances, automatic locks, , or elements in motion detectors. The vibratory motors 26 could also be used to position, pan, tilt or zoom remotely operated cameras, e.g., security cameras.

The ability to directly engage and drive glass offers advantages for using the vibratory motor 26 to control the position and focus of accent lighting in homes, retail stores, theaters, galleries, museums, hotels and restaurants. In automotive applications, the vibratory motors 26 can be used to position mirrors, headlights and air conditioning vents, and to actuate automatic locks. The stepper-like operation of the motor assembly 20 allows the storing and retrieving of mechanical settings, such as mirror position, for each of several drivers under the direction of a computer.

The combination of a computer that stores position information in connection with a positionable motor 20 finds many possibilities in sensors that automatically adjust their position. These include optical sensors, lens cleaning mechanisms for such sensors, protective covers that open and close by the use of vibratory motors 26, automatic alignment mechanisms, proximity lasers, and adjustments of a variety of products that require movement of small parts by simple motors.

The vibratory motor 26 is especially useful for toys due to advantageously low cost, small size and low noise. Dolls could have limbs moved and eye lids actuated by the motors 26. Remotely controlled vehicles could have steering controlled by the motors 26. Animated toy books could be provided. Railway models could have moving forks, cranes, signals, railway gates and other actuated components. Various other applications of the motor 26 can be made. Further, the vibratory motor 26 can be made resistant to liquids, such as water, with appropriate modifications and coatings, and can provide multiple motions. The low force output reduces the possibility of injury. Also, it is possible to mix the electrical operating signal that is supplied to the piezoelectric element 22 with an electrical signal that contains a non-operational yet audible frequency spectrum. In such an embodiment, a piezoelectric motor 20 can also serve as a simple device for generating sound and music.

There is thus advantageously provided a motor assembly 20 that costs less to produce than traditional motors of comparable power and speed. The size and weight of the motor assembly 20 is less, and the invention allows for exceptional miniaturization of the motor. The motor can achieve stepper-like motion of the driven elements 42, and positioning of the driven elements is possible without using positioning sensors on the driven part. The motor assembly 20 allows the use of fast, or slow driving speeds, and does not need a gearbox. Because the motor does not use gears, there is no backlash as associated with gear trains. The motor assembly 20 allows the driven element 42 to be translated, or rotated, or both. The positioning of the driven element 42 has positioning accuracy of 1 µm. The operating frequency can be selected to be inaudible to humans so that motor operation is silent. Due to the absence of magnetic fields or spark discharges, the motor assembly 20 and its vibratory element 26 are suitable for use in environments that are sensitive to electromagnetic interference or sparks. Quick reaction times of the motor assembly 20 permit control with binary state controllers, which are easier to implement and less expensive than PID controllers.

The invention further advantageously provides a vibratory element 26 having a piezoelectric driving element 22 and a resonator 24 that advantageously holds the driving element 22 in compression. This vibratory element combined with a resilient suspension system such as spring 10 can advantageously be provided to users who apply the components to a variety of driven elements at the discretion of the user. These parts are advantageously designed and configured to cooperate to generate an elliptical path 100 at a selected driving portion 44 for one or more predetermined applications or for one or more generic applications. This combination can be provided as a unit, and could be provided with or without the spring 50. A user could thus use these components to drive a variety of driven elements 42.

Alternatively, a user could be provided with a complete motor assembly 20 containing not only the vibratory element 26 and resilient mount such as spring 50, but also driven elements 42 supported in a predetermined relation to the vibratory element 26. In this alternative situation, the motor assembly 20 is preferably encased in a housing along with a suspended driven object 42, as for example a rod for a linear motor. In this alternative situation, the motor assembly 20 and driven element 42 are ready for installation and use as the user sees fit. The assembly can be used with a driven element used in other motors, or it could be used as a part of a product configured for use with the components. Providing the driving elements and suspension elements allows the user to acquire a low cost driving mechanism having great flexibility in its application.

The driven object 42 preferably has a smooth and hard surface located to engage the selected driving portion 44. The driven element 42 can have a variety of shapes, for example it can be a disc, a rod, a wheel, a gear, a beam, a ball, etc, as long as a fairly constant contact force can be maintained between the selected contact portion 44 and the driven element 42. This gives designers a wide range of possible implementation methods for the motor assembly 20.

The motor assembly 20 is advantageously encased in a housing to protect it from dirt and other extraneous contact and potential damage. The housing can be manufactured out of plastic through an injection molding process, or made of sheet metal. It is preferably designed such that it can be assembled through snap joints. This assembly avoids the use of more expensive methods including threaded fasteners and is good for a fully automated assembly.

This provides the possibility for the end user to have an inexpensive and small motor unit, which is easy to implement into a design. In order to increase the flexibility of use, the base 10 or the housing can have clamping holes or other clamping mechanisms to make it easier to attach to the end user's product. If the volume of a specific designed base 52 or housing is sufficient, the base 52 and/or housing unit could be specially configured to meet the mounting needs of the user.

There is thus provided a mechanism and method for generating an ellipse 100 that has a first semi-axis and a second semi-axis, with the length of the first semi-axis being useful to generate a difference in friction force between the selected contact portion 44 and an engaging surface of a driven element 42, during the motion components in the direction or directions of travel along the elliptical path 100. This elliptical motion is advantageously provided by a single excitation frequency provided to a piezoelectric element 22 that results in at least two vibrational modes generating the elliptical path 100. This elliptical motion 100 is achieved by exciting at least two vibrational modes at least one of which, and preferably both of which, are not pure longitudinal or pure bending modes, and superimposing those modes to generate the elliptical motion at the selected contacting portion. This elliptical motion 100 is advantageously achieved without having to place the selected contacting portion 44 into contact with any driven element 42.

The practical result of having modes other than purely longitudinal and purely bending, is that the major axis defining the elliptical path 100 of the selected contacting portion 44 is angled relative to the longitudinal axis 25 of the vibratory element 26. The major and minor axes of the elliptical path 100 are not aligned with the longitudinal axis 25 of the resonator as is common with prior art vibratory devices. The angle of the major axis of the elliptical path 100 relative to longitudinal axis 25 is advantageously not near 0 degrees or multiples of 90 degrees. For ease of description, the angle will be described relative to the orientation of parts in FIG. 1 in the first quadrant, but one skilled in the art will appreciate that the parts can be rotated through other quadrants or that the orientation of parts can be changed—without altering the relative angles discussed here.

Because the greatest motion and fastest rate of travel is achieved when the longitudinal axis of the elliptical path 100 is aligned with the travel path of the driven element 42, the vibratory element 26 is preferably angled relative to the driven element 42 in order to align those axes. If the major axis of the elliptical path 100 aligns with the longitudinal axis of the driven element 42, then this above-discussed angle can be considered to be the angle $\alpha$, discussed above. The perfect alignment of the major axis of the elliptical path 100 with the longitudinal axis of the driven element 42 is often compromised for practical reasons.

Because the elliptical motion 100 is angled relative to the longitudinal axis 25 of the resonator 24, elliptical motions with large aspect ratios can be used. Ratios of the major to minor axes of the elliptical path 100 are advantageously over 5, more advantageously over 10, and preferably over 20 to 1. But when the semi-axis becomes too small, the selected contacting portion may not adequately disengage from the driven element when the ellipse is aligned with the driven element and thus ratios of 30:1 or more are difficult to achieve, especially at low cost. Further, as the ratios increase, the performance approaches that of an impact drive vibrator element. Thus, ratios of over 150:1, and even 30:1 are difficult to achieve and use. While most useful sized elliptical paths 100 are believed to have aspect ratios of about 3:1 to 150:1, preferably the ratios are from about 4:1 to 30:1, and ideally from about 5:1 to 15:1. If aspect ratios are used up to and over 150:1, then the resulting applications find use primarily in impact drive types of devices.

The amplitudes needed to achieve elliptical path 100 at the selected contacting portion 44 are preferably obtained by large magnification of small input signals. That requires selecting or creating resonance modes of vibration sufficiently close to the selected input signal to achieve a usable amplitude. Advantageously, for each volt input to the piezoelectric element 22, the selected contacting portion 44 can achieve 0.3–0.5 microns of motion along the major axis of the elliptical path 100. Preferably, for each volt input, the motion along the major axis of the elliptical path 100 is 1 micrometer or greater. These motions are the result of resonant vibration mode amplifications that increase the motion by factors of at least 100, and typically by factors of 1000 or more.

It is possible, but less desirable, to use a small resonance magnification and instead provide a larger input signal in order to achieve the needed amplitude to generate an acceptable elliptical path 100 at the selected contacting portion 44. If one of the vibration modes that results in the usable elliptical path 100 is off-resonance, then the electric input signal to the piezoelectric element 22 can be increased sufficiently to result in a usable elliptical motion, one sufficient to moves the driven element 42. Thus, it is believed suitable in some applications to have one volt input to the piezoelectric element 22 result in motion along the major axis of the elliptical path of 20–50 nanometers, but with movements of 100 nanometers or more being desirable.

Thus, the selected contacting portion 44 moves in a first elliptical path having a major axis and minor axis when the vibration source, such as piezoelectric element 22 is excited by a first electrical signal that causes at least two vibration modes that are superimposed to create the first elliptical path 100. Preferably, at least one of the vibration modes is other than a pure longitudinal mode and other than a pure bending mode. When at least one of the two vibration modes is off-resonance, the first electrical signal is amplified sufficiently to cause the at least one off-resonance vibration mode to produce a motion of the selected contacting portion 44 having sufficient amplitude that the resulting elliptical path 100 can move the driven element 42 during use. As used here, the reference to an off-resonance vibration mode refers to a vibration mode that is sufficiently away from the resonance mode that the resulting motion does not generate a usable elliptical motion, motion insufficient to drive the driven element 42.

The desired elliptical motion 100 is advantageously achieved without requiring the selected contacting portion 44 to engage the driven element 42. Depending on the angle of engagement, reflected by angle $\alpha$, the engagement can cause impact or bending that may affect the elliptical path 100 or the resulting motion of the driven element 42, and appropriate compensation can be made for those effects.

As mentioned above, the generation of the elliptical path 100 at the selected contacting portion is most easily determined in a localized coordinate system that does not align with the longitudinal axis 25 of the vibratory element 26. A coordinate transformation to align the motion so that one axis of the elliptical path 100 aligns with the vibratory element 26 or preferably with the driven element 42 allows the practical use of the elliptical path 100 to be evaluated.

If multiple motions of a driven element 42 are desired to be produced from a single vibratory element 26, then the selected elliptical path 100 is likely to be a compromise among several potential elliptical paths at various frequencies, and if desired, at several selected contacting portions 44. If multiple motions are desired to be produced by a single piezoelectric element 22, it is preferable that the frequency used to achieve the different elliptical motions be sufficiently different to clearly separate the frequencies and their resulting motions. The frequencies for the separate motions are preferably separated by at least the same margin as the frequency range over which the substantially uniform elliptical motion 100 is achieved. Thus, for example, if a first elliptical motion 100 is achieved over a frequency range of 2.5 kHz on either side of a first frequency, for a total range of 5 kHz, then the second frequency is advantageously at least 5 kHz from the first frequency, and preferably more.

Ideally, the major axis of the elliptical path 100 is aligned with the axis along which the driven part 42 moves. As shown in FIG. 1, that alignment angle corresponds to the angle $\alpha$ between the longitudinal axis 25 of the vibratory element 26 and the axis 45 of a rod-like driven element 42. This alignment may be achievable if the driven element 42 is moved in only one direction. But when the same vibratory element 26 is used to move the driven element 42 in opposing directions, relative alignment is difficult or impossible to achieve, especially in both directions. Further, the alignment considerations for bi-directional motion as discussed below is advantageously used even when only a single direction of motion of the driven element 42 is used.

Figure 81:
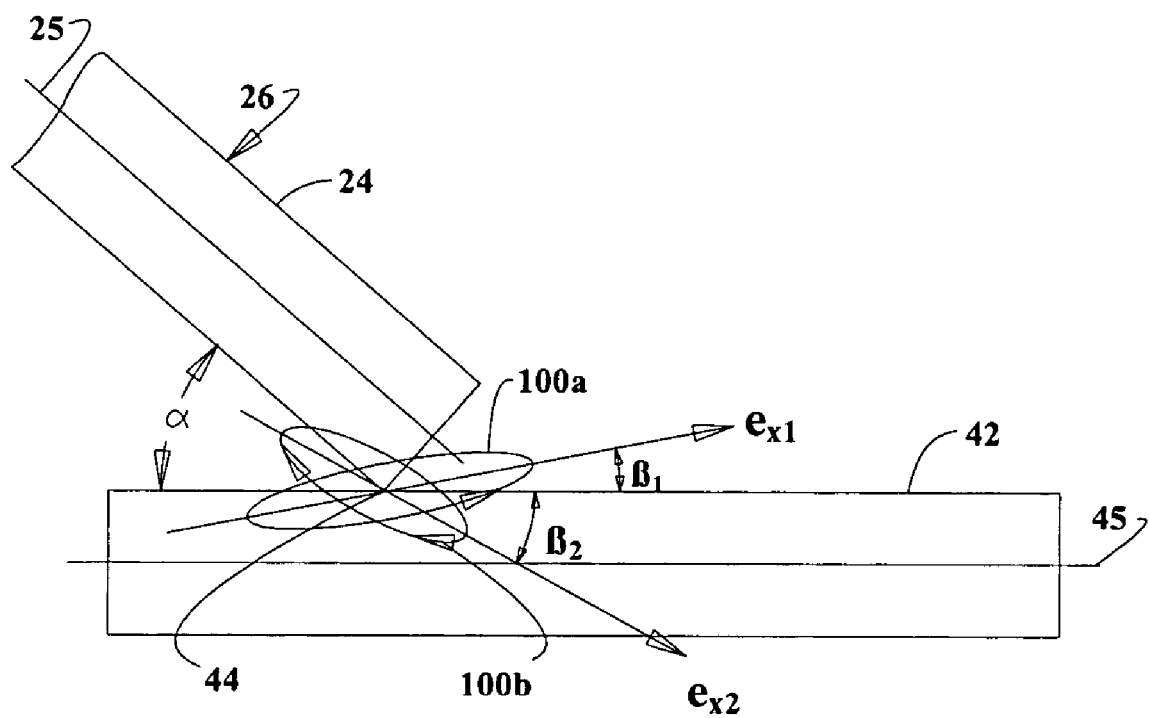
FIG. 81 shows the motion of a selected contacting portion of this invention.

FIG. 81 will be used to illustrate the considerations in this alignment. FIG. 81 illustrates a first elliptical path 100a having a major axis $e_{x1}$, for moving the driven element 42 in a first direction, and a second elliptical path 100b having a major axis $e_{x2}$ for moving the driven element in a second, opposing direction. The major axis $e_{x1}$, is inclined at an angle $\beta_1$ relative to axis 45 of the driven element 42 and the major axis $e_{x2}$ is inclined at an angle $\beta_2$ relative to that axis 45. The axis 45 can be viewed as parallel to a tangent to the driven element 42 in the direction of motion of the driven element 42 at the selected contacting portion 44. The motion along the first direction, the motion resulting from ellipse 100*a* is believed to typically be the easiest to achieve and will typically have the major axis $e_{x1}$ of ellipse 100*a* most closely aligned with the axis 45 of the driven element 42, while the major axis $e_{x2}$ is not as closely aligned with that axis 45. Thus, $\beta_1$ is typically smaller than $\beta_2$ when $\beta_1$ is selected first. But that need not always be the case as the ultimate selection of elliptical paths 100*a*, 100*b* is a result of compromising several factors as discussed herein.

While it is ideal for $\beta_1$ and $\beta_2$ to be 0, so that the major or minor axes of the elliptical paths 100 to align as closely as possible with the desired motion of the driven element 42, that is difficult to achieve for multi-direction motion. For bi-directional motion where the same motion is desired but in different directions, it is believed that $\beta_1$ and $\beta_2$ will range from 5 to 40 degrees with respect to a tangent to the driven element 42, along the direction of motion of the driven element 42, at the selected contacting portion 44. It is believed possible, but less desirable to have the angles go from 40 to 45 degrees. It is very desirable to have the angles $\beta_1$ and $\beta_2$ perfectly align the major axis of the elliptical paths 100*a*, 100*b* with the direction of motion of the driven element, and preferably align them within 0 to 5 degrees. As used herein, because the orientation of parts can increment the angles through various multiples of 90 degrees relative to a horizontal axis, the angles given should be construed as relative angles rather than as absolute numbers. Thus, for example, the reference to aligning the major axes and the driven path within 0 to 5 degrees includes angles on opposing sides of the horizontal X-axis as shown in the drawings. That thus includes an absolute angle of 360–365 degrees relative to a common axis of measurement.

As shown in FIG. 81 the angle is relative to the axis 45 of the translating rod 42. But the driven element 42 could comprise a rotating disk (e.g., FIG. 4). Usable but sometimes undesirable performance is believed to be achieved if $\beta_1$ and $\beta_2$ range from about 5 to 85 degrees from the tangent to the driven element at the location of the selected contacting portion 44. Preferred performance levels are believed to be achieved if $\beta_1$ and $\beta_2$ range from about 5–35 degrees and 55–85 degrees, and the best performance is believed to be achieved when $\beta_1$ and $\beta_2$ range from about 15 to 25 degrees and 65 degrees to 75 degrees.

As stated or implied above, because of symmetry considerations relative to the 0 and 90 degree axes, the above range can vary in 90 degree increments in absolute value relative to a common axis of origin. The above discussions and angle ranges are believed to apply to multi-direction motion.

In order to achieve the desired angles $\beta_1$ and $\beta_2$, it is believed that the angle $\alpha$ should be maintained within the previously discussed ranges. The particular combination of $\beta_1$ and $\beta_2$ that is used is typically chosen so that the major axis of elliptical paths 100 aligns as close as possible with the axis of the driven element 42. The closer the alignment, the more efficient the transfer of motion from the vibratory element 26 to the driven element 42 along the selected axis of motion 45.

But from the various angles discussed, it can be observed that the selected vibration mode(s) of the resonator 24 that result in usable vibratory motions along elliptical paths 100 orientated at angles $\beta_1$ and $\beta_2$, are neither purely longitudinal nor purely bending modes. Thus, in producing the elliptical motion 100 at the selected contacting portion 44, the angles $\beta_1$ and/or $\beta_2$ are such that the major and minor axes of the elliptical paths 100*a*, 100*b* do not align with the longitudinal axis of resonator 24 of the vibratory element 26. Further, the angles $\beta_1$ and/or $\beta_2$ are such that the major and minor axes of the elliptical paths 100*a*, 100*b* do not align with a pure bending mode of that vibratory element 26, e.g., along axes 38, 40 in FIG. 1. The angle $\alpha$ between the driving element such as vibrating element 26 and the driven element 42 is varied in order to allow the advantageous alignment of the major and minor axes with the direction of motion desired for the driven element 42.

This also means that the vibrational modes of the vibratory element 26 that generate elliptical paths 100*a*, 100*b* at the selected contacting portion 44, have at least one vibration mode that is not a purely longitudinal vibration mode along axis 25, and not a pure bending mode (e.g., along the axes 38, 40 for the configuration depicted in FIG. 1). Thus, for example, the two vibration modes being selected to generate elliptical path 100*a* preferably do not include a pure longitudinal or pure bending mode of the resonator 24 in order to produce the first elliptical motion 100*a* of the selected contacting portion 44, and the same is true with the vibration modes to generate the second elliptical path 100*b*. If a pure longitudinal or pure bending mode is used to generate the first elliptical path 100*a*, then the vibration modes used for the second elliptical path 100*b* do not necessarily include a pure longitudinal or pure bending mode of the resonator 24 in order to produce the elliptical path 100*b*. Further, if a vibration mode is used that includes a pure longitudinal vibration mode along axis 25, then desirably the axis 25 is inclined to the driven element 42 at an angle $\alpha$ that is other than 0 and 90 degrees or multiples thereof, and that is preferably between about 5–85 degrees and multiples thereof.

As the angles $\beta_1$ and $\beta_2$ become greater relative to the driven element 42, the contact results in greater impact between the selected contacting portion 44 and the driven element 42. When the aspect ratio of one or both elliptical paths 100*a*, 100*b* becomes large, so that one axis is much larger than the other axis, the contact approaches that of an impact drive. It is believed possible to have one of the elliptical paths 100*a*, 100*b* have a high aspect ratio, sufficiently high that the resulting motion can effectively be considered an impact drive, and have the other elliptical path with a lower aspect ratio to produce a non-impact drive. Advantageously, aspect ratios of the elliptical paths 100 that produce a pure impact type drive, are avoided.

Further, it is believed possible that the teachings of this disclosure can be used to configure a vibratory element 26 having very high aspect ratio elliptical motions 100*a*, 100*b* in opposing directions. When the aspect ratio of the major to minor elliptical axes become great enough, the particular direction of motion around the elliptical path is not determinative of the direction in which the driven element moves. Instead, the angle of inclination $\beta$ of the major axis relative to the driven element becomes the determinative factor in deciding the direction of motion. Thus, it is believed possible to use two high aspect ratio elliptical paths 100*a*, 100*b*, at the same (or different) selected contacting portions 44, to create an impact drive moving the driven element 42 in the same direction. Indeed, the principles of this disclosure could be used to have a single piezoelectric element 24 generate two longitudinal resonance modes at two different frequencies, each of which is used in an impact drive.

Whether high aspect elliptical motion is used to approximate pure impact drive, or whether a pure linear motion is achieved to implement an impact drive, the motion of the driven element 42 can be achieved at two separate frequencies. But the use of two frequencies can result in different rates of travel of the driven element. The differences in the rate of travel by using different frequencies can be enhanced if a high aspect elliptical motion is used in which the direction of travel of the ellipse (e.g., clockwise v counterclockwise) changes, or in which the angle β, changes. Further, the teachings herein can be used even if more than a single piezoelectric element 22 is used to cause the multiple frequencies for the impact-type motion or to cause actual impact motion using mainly longitudinal resonance of the vibratory element 26.

It is desirable to have the angles $\beta_1$ and $\beta_2$ be reasonably constant over as wide a range of excitation frequencies to vibratory driving element 22, as possible. For example, if any excitation frequency signal to piezoelectric element 22 over a 2 kHz range results in elliptical motion 100 at the selected contacting portion where the angle $\beta_1$ does not vary by more than 5 degrees, then it becomes easier to design the vibratory system, and it becomes easier to allow the use of components with larger tolerances in performance parameters. It is desirable to have the angles $\beta_1$ or $\beta_2$ vary less than 10 degrees, and preferably less than 5 degrees, and ideally less than 3 degrees, over as large range of excitation frequencies as possible. This allows the angle α of inclination between the predominant axis 25 of the vibrating element 26 and the motion axis 45 of the driven element 42 to be set with reasonable tolerances, and to use components with tolerances obtainable at affordable prices, and produce acceptable motion. This especially allows the use of low cost motors in a wide variety of commercial applications, as discussed herein.

It is thus desirable to have the selected contacting portion 44 move in approximately the same elliptical path 100 when the frequency of the driving signal input to the piezoelectric element 22 varies by as little as 200 Hz on either side of the selected frequency. Advantageously, approximately the same elliptical path 100 is achieved when the frequency of the driving signal varies as much as 2.5 kHz, or more, from the selected frequency. It is thus desirable that the excitation frequency to the source of vibration 22 can vary by as much as 2.5 kHz on either side of the selected frequency, and preferably greater, while still producing suitable amplitudes for elliptical paths 100 at the inclination angles $\beta_1$ and $\beta_2$. In relative terms, it is desirable to have a range of 5–10% of the selected excitation frequency achieve suitable elliptical paths 100, with the inclination angles $\beta_1$ and $\beta_2$ varying less than 25 degrees, and preferably less than 10 degrees, and ideally by about 5 degrees or less, over that frequency range. The ability to do so will vary with the particular design criteria and performance requirements.

One way to help maintain the inclination angles , $\beta_1$ and $\beta_2$ reasonably constant over a reasonably wide range of excitation frequencies is to vary the various design parameters of the motor as discussed herein. The above discussed angles of 25 degrees, preferably 10 degrees and ideally about 5 degrees or less are each considered to be reasonably constant, with angles of about 5 degrees or less being the most preferred and most reasonably constant. Maintaining these inclination angles reasonably constant is most easily achieved by having the effect of the relative phase change on the angles $\beta_1$ and $\beta_2$ compensate for the effect of the amplitude change on the angle. To achieve this it is useful to select a set of vibration modes that have suitable directions of motion and frequency response curves for phase and amplitude. Further, using a coordinate transformation to view and analyze the elliptical motion 100 in a localized orientation also makes the design easier.

As used herein, the predominant axis is used to indicate an angle of inclination between the vibratory element 26 and the elliptical path 100 of the selected contacting portion 44. The predominant axis will vary with the geometry and shape of the vibratory element 26, and the location and orientation of the selected contacting portion 44 on the vibratory element 26. For elongated vibratory elements 26 with the selected contacting portion 44 located at a distal end, as in FIG. 1, the predominant axis is likely to be the longitudinal axis 25, or an axis orthogonal thereto, or a rotation about such axes. For non-straight vibratory elements 26 as shown in FIG. 77, with the selected contacting portion 44 located on a distal end, the predominant axis is the axis 25 through the distal end, or an axis orthogonal thereto, or a rotation about such axes. For selected contacting portions 44n located along the length or on intermediate portions of vibratory elements 26 as shown in FIG. 6, the predominant axis is again the longitudinal axis through the distal end 36a, or an axis orthogonal thereto, or a rotation about such axes. The particular predominant axis will vary in part with the motion of the selected contacting portion 44 and an adjacent axis of the vibratory element 26 that can be readily used for orientating the vibratory element to achieve alignment of the elliptical path 100 at the selected contacting portion 44 with the driven element 42.

To test the quality of a motor 20 after it has been assembled, it is advantageous and cost-effective to measure a few electromechanical characteristics of the motor using its piezoelectric element 22. The characteristics include, but are not limited to, the current that is drawn by the piezoelectric element 22 for a predetermined input signal, and the electrical signal that is generated by the piezoelectric element when it is turned off after having appropriately excited vibrations in the vibration element 26. It is also possible to track these characteristics during the lifetime of a motor 20, and in doing so to monitor motor efficiency without the need of special equipment such as a laser vibrometer.

The above disclosure focuses on using a single electrical signal to excite a single piezoelectric element 22 to produce an elliptical motion 100 at the selected contacting portion 44 that is inclined to the predominant driving axis (e.g., longitudinal axis 25) of the resonator 24. That elliptical motion 100 is an unrestrained motion of the selected contacting portion 44 and occurs whether or not the contacting portion 44 engages the driven element 42. But that inclined elliptical motion 100 can be produced by using more than a single piezoelectric element 22 on the resonator 24. This invention thus has broader applicability to vibratory elements 26 that use plural piezoelectric elements 22 to achieve the elliptical motion 100 inclined to predominant driving axis (e.g., the longitudinal axis 25) of the resonator 24. Thus, for example, as shown in FIG. 81, first and second piezoelectric elements 22a, 22b could be on different portions or sides of resonator 26 (or contacting differently located walls defining one or more openings 28 in the resonator 26 as in FIG. 2), in order to produce an inclined elliptical motion 100a at the selected contacting portion 44. A third piezoelectric element 22c could be on yet another portion of the resonator in order to produce a different elliptical motion 100b at the selected contacting portion 44. This use of multiple piezoelectric elements 22a–22c requires more complex electronics and thus has disadvantages, and it may limit the applicability of some aspects of the present disclosure. But it illustrates that some aspects of this disclosure have applicability beyond use with the single piezoelectric element 22 as described herein.

The above description is given by way of example, and not limitation. Given the above disclosure, one skilled in the art could devise variations that are within the scope and spirit of the invention. Further, the various features of this invention can be used alone, or in varying combinations with each other and are not intended to be limited to the specific combination described herein. Thus, the invention is not to be limited by the illustrated embodiments but is to be defined by the following claims when read in the broadest reasonable manner to preserve the validity of the claims.

What is claimed:

1. A piezoelectric drive for moving a driven element, comprising:
   a piezoelectric element separate from and drivingly connected to a resonator, the resonator being formed of a single piece of material and having opposing ends, the resonator having a contacting portion in interactive connection with a driven element to move the driven element during use of the drive; and
   a spring connected to the resonator between the ends and spaced apart from the ends a distance, the spring resiliently holding the resonator with respect to the driven element,
   wherein the mass distribution of the resonator between the piezoelectric element and the contacting portion is different than the mass distribution between the piezoelectric element and the other end of the resonator.

2. The piezoelectric drive of claim 1, wherein the driven element has a cylindrical surface and the resonator has a contacting portion in interactive connection with the cylindrical surface to rotate the driven element.

3. The piezoelectric drive of claim 2, wherein the piezoelectric element comprises a plurality of piezoelectric plates that are disposed parallel to each other and electrically interconnected to vibrate in the same direction.

4. The piezoelectric drive of claim 2, wherein the first and second directions are opposite.

5. The piezoelectric drive of claim 2, wherein the spring fastens to the piezoelectric element.

6. The piezoelectric drive of claim 1, wherein the spring fastens to the resonator.

7. The piezoelectric drive of claim 2, wherein the spring fastens to both the resonator and the piezoelectric element.

8. The piezoelectric drive of claim 2, wherein there are two springs each connected to the same piezoelectric element.

9. The piezoelectric drive of claim 8, wherein the piezoelectric element has a longitudinal axis and at least a portion of the spring is parallel to that longitudinal axis.

10. The piezoelectric drive of claim 2, wherein at least a portion of the spring is parallel to but offset from a longitudinal axis of the resonator.

11. The piezoelectric drive of claim 2, wherein the spring has an end attached to the resonator and the spring portion abutting that end is not parallel to a longitudinal axis of the resonator.

12. The piezoelectric drive of claim 10, wherein the spring is L-shaped.

13. The piezoelectric drive of claim 2, wherein the spring has a first end mounted to a base and an opposing end fastened to the resonator, with a first leg of the spring parallel to the resonator and a second leg perpendicular to the first leg.

14. The piezoelectric drive of claim 2, wherein the spring is a flat strip of metal.

15. The piezoelectric drive of claim 2, wherein the selected contacting portion is at one end of the resonator and the mass of the resonator between the piezoelectric element and the contacting portion is greater than the mass of the resonator between the piezoelectric element and the other end of the resonator.

16. The piezoelectric drive of claim 1, wherein the selected contacting portion is at one end of the resonator and the mass of the resonator between the piezoelectric element and the contacting portion is less than the mass of the resonator between the piezoelectric element and the other end of the resonator.

17. The piezoelectric drive of claim 1, wherein the drive has three resonators arranged so the contacting portion of each resonator drivingly engages the driven element.

18. The piezoelectric drive of claim 2, wherein the drive has three resonators arranged so the contacting portion of each resonator drivingly engages the driven element and the resonators are aligned tangentially to that driven element.

19. The piezoelectric drive of claim 18, wherein the three resonators are equally spaced about the driven element, as are the contacting portions associated with each resonator.

20. The piezoelectric drive of claim 18, wherein the three resonators are coplanar.

21. A piezoelectric drive for moving a driven element, not including the driven element, comprising:
   a piezoelectric element driving a resonator, the resonator having a contacting portion for interactive connection with the driven element during use of the drive, the contacting portion being located on an edge of a distal end of the resonator, the resonator having an asymmetric placement of the piezoelectric element relative to the resonator with the mass distribution between the piezoelectric element and the contacting portion being different than the mass distribution of the remainder of the resonator.

22. A method for driving a driven element, said method comprising the steps of:
   placing a piezoelectric element of a resonator into a first and/or second oscillation to oscillate a resonator, the resonator having a contacting portion located to interactively engage the driven element during use,
   elastically holding the resonator relative to the driven element using a spring fastened to at least one of the resonator and piezoelectric element, the spring located and configured to resiliently maintain contact between the resonator and the driven element;
   exciting oscillation of the contacting portion of the resonator in two dimensions by applying to the piezoelectric element a first single frequency with a single phase sufficiently close to a resonant frequency to cause the movement; and
   exciting oscillation of the contacting portion of the resonator in two dimensions by applying to the piezoelectric element a second single frequency with a single phase sufficiently close to a different resonant frequency to cause a different movement of the driven element.

23. A piezoelectric drive for moving a driven element, comprising:
   a piezoelectric element separate from and drivingly connected to a resonator, the resonator being formed of a single piece of material and having opposing ends, the resonator having a contacting portion in interactive connection with a driven element to move the driven element during use of the drive, wherein the driven element has a cylindrical surface and the resonator has a contacting portion in interactive connection with the cylindrical surface to rotate the driven element; and a spring connected to the resonator between the ends and spaced apart from the ends a distance, the spring resiliently holding the resonator with respect to the driven element, wherein the spring fastens to both the resonator and the piezoelectric element.

24. A piezoelectric drive for moving a driven element, comprising:
a piezoelectric element separate from and drivingly connected to a resonator, the resonator being formed of a single piece of material and having opposing ends, the resonator having a contacting portion in interactive connection with a driven element to move the driven element during use of the drive; and
a spring connected to the resonator between the ends and spaced apart from the ends a distance, the spring resiliently holding the resonator with respect to the driven element,
wherein the driven element has a cylindrical surface and the resonator has a contacting portion in interactive connection with the cylindrical surface to rotate the driven element and wherein the selected contacting portion is at one end of the resonator and the mass of the resonator between the piezoelectric element and the contacting portion is greater than the mass of the resonator between the piezoelectric element and the other end of the resonator.

25. A piezoelectric drive for moving a driven element, comprising:
a piezoelectric element separate from and drivingly connected to a resonator, the resonator being formed of a single piece of material and having opposing ends, the resonator having a contacting portion in interactive connection with a driven element to move the driven element during use of the drive; and
a spring connected to the resonator between the ends and spaced apart from the ends a distance, the spring resiliently holding the resonator with respect to the driven element,
wherein the selected contacting portion is at one end of the resonator and the mass of the resonator between the piezoelectric element and the contacting portion is less than the mass of the resonator between the piezoelectric element and the other end of the resonator.

26. The piezoelectric drive of claim 1, wherein the contacting portion is on an edge of a distal end of the resonator.

27. The piezoelectric drive of claim 21, wherein the contacting portion is on an edge of a distal end of the resonator.

28. The piezoelectric drive of claim 22, wherein the contacting portion is on an edge of a distal end of the resonator.

29. The piezoelectric drive of claim 1, wherein the contacting portion is located adjacent to the distal end.

30. The piezoelectric drive of claim 21, wherein the contacting portion is on an edge of a distal end of the resonator.

31. The piezoelectric drive of claim 22, wherein the contacting portion is on an edge of a distal end of the resonator.

* * * * *